(12) United States Patent  
Sunamura et al.

(10) Patent No.: US 9,000,540 B2  
(45) Date of Patent: Apr. 7, 2015

(54) SEMICONDUCTOR DEVICE AND A METHOD FOR MANUFACTURING A SEMICONDUCTOR DEVICE

(71) Applicant: Renesas Electronics Corporation, Kanagawa (JP)

(72) Inventors: Hiroshi Sunamura, Kanagawa (JP); Naoya Inoue, Kanagawa (JP); Kishou Kaneko, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/738,217

(22) Filed: Jan. 10, 2013

(65) Prior Publication Data

US 2013/0200472 A1      Aug. 8, 2013

(30) Foreign Application Priority Data

Feb. 2, 2012   (JP) ................................ 2012-021069

(51) Int. Cl.
*H01L 29/18*     (2006.01)
*H01L 29/10*     (2006.01)
(Continued)

(52) U.S. Cl.
CPC .............. *H01L 29/78* (2013.01); *H01L 29/401* (2013.01); *H01L 29/78642* (2013.01); *H01L 29/7869* (2013.01); *H01L 27/1225* (2013.01); *H01L 27/124* (2013.01); *H01L 27/0688* (2013.01); *H01L 23/49822* (2013.01); *H01L 27/10858* (2013.01); *H01L 27/1104* (2013.01);

*H01L 27/11551* (2013.01); *H01L 21/823885* (2013.01); *H01L 2924/0002* (2013.01)

(58) Field of Classification Search
CPC ... H01L 29/78; H01L 29/401; H01L 29/7725; H01L 29/775; H01L 29/778; H01L 23/522; H01L 23/53295; H01L 27/088; H01L 27/0688
USPC ........ 257/43, E29.1, E21.409, 368, 421, 411, 257/E21.665, E29.323; 438/585, 3, 591, 438/306, 104
See application file for complete search history.

(56) References Cited

U.S. PATENT DOCUMENTS

2004/0084676 A1 *  5/2004  Takaura et al. ................. 257/67
2008/0237665 A1 * 10/2008  Shishido ....................... 257/290
(Continued)

FOREIGN PATENT DOCUMENTS

JP          2010-141230         6/2010

*Primary Examiner* — Chuong A Luu
*Assistant Examiner* — Moazzam Hossain
(74) *Attorney, Agent, or Firm* — Young & Thompson

(57) ABSTRACT

The performances of semiconductor elements disposed in a multilayer wiring layer are improved. A semiconductor device includes: a first wire disposed in a first wiring layer; a second wire disposed in a second wiring layer stacked over the first wiring layer; a gate electrode arranged between the first wire and the second wire in the direction of stacking of the first wiring layer and the second wiring layer, and not coupled with the first wire and the second wire; a gate insulation film disposed over the side surface of the gate electrode; and a semiconductor layer disposed over the side surface of the gate electrode via the gate insulation film, and coupled with the first wire and the second wire.

18 Claims, 54 Drawing Sheets

(51) Int. Cl.
*H01L 21/02* (2006.01)
*H01L 29/78* (2006.01)
*H01L 29/40* (2006.01)
*H01L 29/786* (2006.01)
*H01L 27/12* (2006.01)
*H01L 27/06* (2006.01)
*H01L 23/498* (2006.01)
*H01L 27/108* (2006.01)
*H01L 27/11* (2006.01)
*H01L 27/115* (2006.01)
*H01L 21/8238* (2006.01)

(56) References Cited

U.S. PATENT DOCUMENTS

| | | | |
|---|---|---|---|
| 2009/0289302 A1* | 11/2009 | Morifuji | 257/347 |
| 2010/0144089 A1* | 6/2010 | Kaji et al. | 438/104 |
| 2010/0148171 A1 | 6/2010 | Hayashi et al. | |
| 2012/0025279 A1* | 2/2012 | Wang et al. | 257/280 |

* cited by examiner

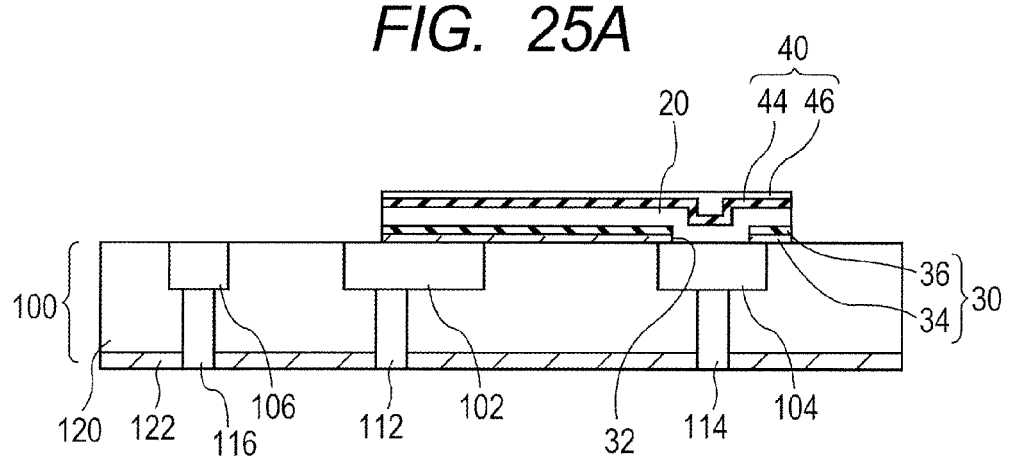
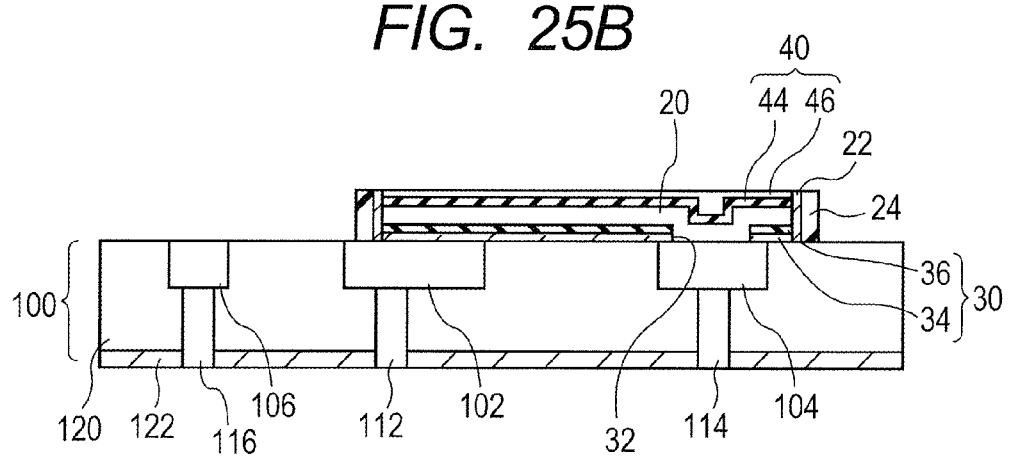

SEMICONDUCTOR DEVICE AND A METHOD FOR MANUFACTURING A SEMICONDUCTOR DEVICE

CROSS-REFERENCE TO RELATED APPLICATIONS

The disclosure of Japanese Patent Application No. 2012-021069 filed on Feb. 2, 2012 including the specification, drawings and abstract is incorporated herein by reference in its entirety.

BACKGROUND

The present invention relates to a semiconductor device, and a method for manufacturing a semiconductor device.

Patent Document 1 describes the following: in wiring layers, a semiconductor film is formed; using the semiconductor film and wires of the wiring layers, a transistor is formed. In the transistor, the wire arranged under the semiconductor film is used as a gate electrode, and a diffusion preventive film between the wiring layers is used as a gate insulation film.
[Patent Document 1]
Japanese Unexamined Patent Publication No. 2010-141230

SUMMARY

In the semiconductor element described in Patent Document 1, the two wires disposed in the same wiring layer serve as source/drain electrodes. Further, the gate electrode is formed of the wire disposed under the source/drain electrodes, and arranged between the source/drain electrodes in plan view. Accordingly, the channel length of the semiconductor element is defined by the space between the two wires forming the source/drain electrodes. In this case, the miniaturization limit of the channel length is restricted by the resolution limit of the lithography for use in wire formation. Therefore, the channel length of a semiconductor element disposed in the multilayer wiring layer is required to be shortened for improving the performances of the semiconductor element.

In accordance with the present invention, there is provided a semiconductor device which includes: a first wire disposed in a first wiring layer; a second wire disposed in a second wiring layer stacked over the first wiring layer; a gate electrode arranged between the first wire and the second wire in the direction of stacking of the first wiring layer and the second wiring layer, and not coupled with the first wire and the second wire; a gate insulation film disposed over the side surface of the gate electrode; and a semiconductor layer disposed over the side surface of the gate electrode via the gate insulation film, and coupled with the first wire and the second wire.

In accordance with the present invention, the first wire disposed in the first wiring layer, and the second wire disposed in the second wiring layer stacked over the first wiring layer form the source/drain electrodes. Whereas, the gate electrode is arranged between the first wire and the second wire in the direction of stacking of the first wiring layer and the second wiring layer. Accordingly, the channel length of the semiconductor element is determined by the film thickness of the gate electrode. In this case, the channel length of the semiconductor element is not restricted by the lithography resolution limit of the wire. Therefore, the channel length of the semiconductor element disposed in the multilayer wiring layer can be shortened, thereby to improve the performances of the semiconductor element.

In accordance with the present invention, there is provided a method for manufacturing a semiconductor device. The method includes the steps of: forming a first wiring layer having a first wire over a semiconductor substrate; forming a gate electrode not coupled with the first wire over the first wiring layer; forming a gate insulation film over the side surface of the gate electrode; forming a semiconductor layer coupled with the first wire via the gate insulation film, over the side surface of the gate electrode; and forming a second wiring layer having a second wire not coupled with the gate electrode, and coupled with the semiconductor layer, over the first wiring layer.

In accordance with the present invention, it is possible to improve the performances of a semiconductor element disposed in a multilayer wiring layer.

BRIEF DESCRIPTION OF THE DRAWINGS

FIGS. 25A and 25B are each a cross-sectional view showing a manufacturing method of the semiconductor device shown in FIG. 22;

DETAILED DESCRIPTION

Figure 1:
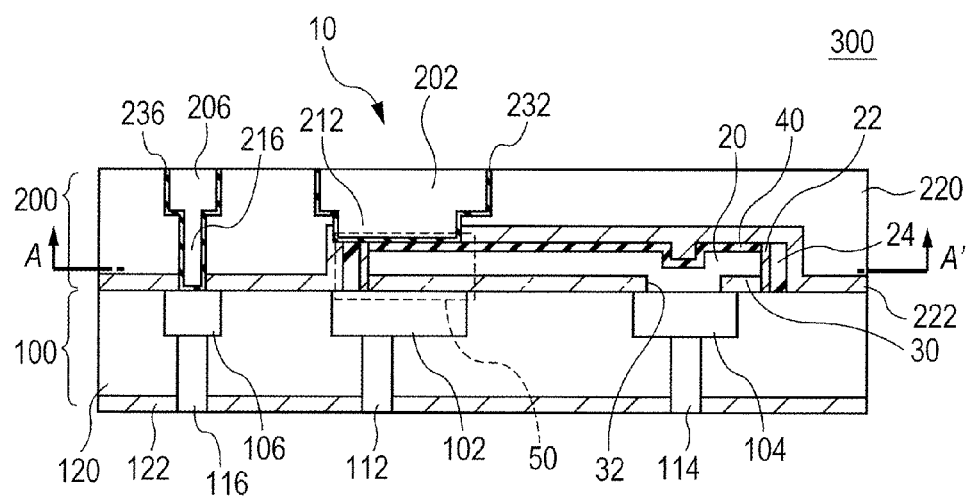
FIG. 1 is a cross-sectional view showing a semiconductor device in accordance with a first embodiment.

Below, embodiments of the present invention will be described by reference to the accompanying drawings. Incidentally, throughout the drawings, the same constitutional elements are given the same reference numerals and signs, and a description thereon will be appropriately omitted.

Figure 2:
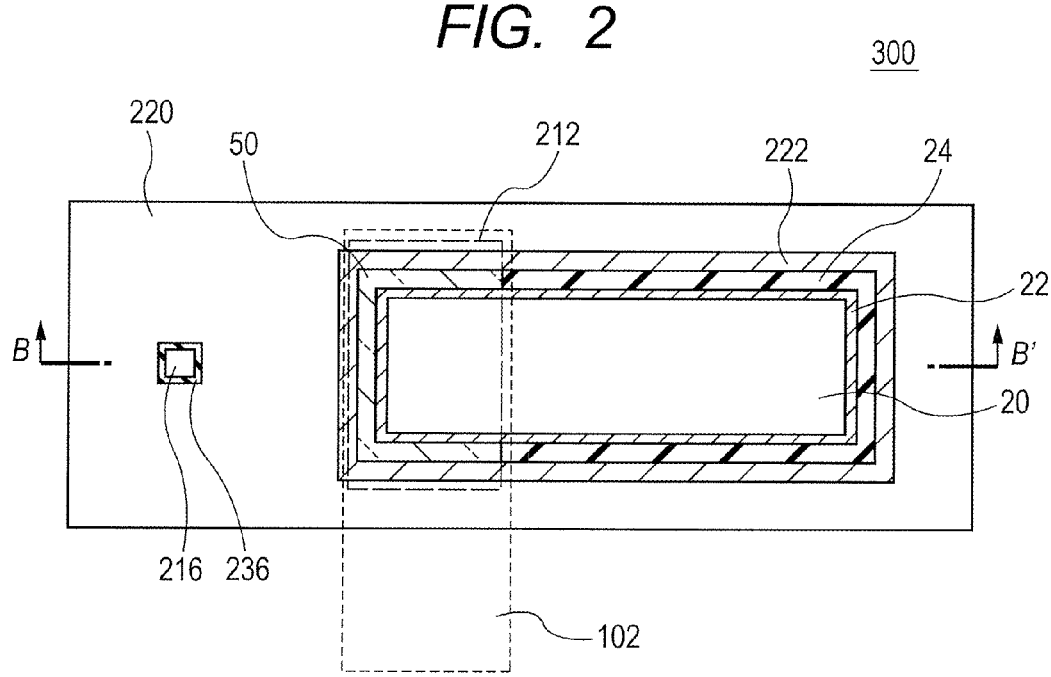
FIG. 2 is a plan view showing the semiconductor device shown in FIG. 1.

FIG. 1 is a cross-sectional view showing a semiconductor device 300 in accordance with a first embodiment. Whereas, FIG. 2 is a plan view showing the semiconductor device 300 shown in FIG. 1, and corresponds to the A-A' plane of FIG. 1. Incidentally, FIG. 1 corresponds to the B-B' cross section of FIG. 2. The semiconductor device 300 in accordance with the present embodiment includes a wire 102, a wire 202, a gate electrode 20, a gate insulation film 22, and a semiconductor layer 24.

The wire 102 is disposed in a wiring layer 100. The wire 202 is disposed in a wiring layer 200 stacked over the wiring layer 100. The gate electrode 20 is arranged between the wire 102 and the wire 202 in the direction of stacking of the wiring layer 100 and the wiring layer 200. Further, the gate electrode 20 is not coupled with the wire 102 and the wire 202. The gate insulation film 22 is disposed over the side surface of the gate electrode 20. The semiconductor layer 24 is disposed over the side surface of the gate electrode 20 via the gate insulation film 22. Whereas, the semiconductor layer 24 couples the wire 102 and the wire 202. Below, the configuration of the semiconductor device 300 will be described in details.

As shown in FIG. 1, the wiring layer 100 includes a diffusion preventive film 122 disposed between the wiring layers, and an interlayer insulation film 120 disposed over the diffusion preventive film 122. The interlayer insulation film 120 is formed of, for example, a silicon oxide film or a low dielectric constant insulation layer with a lower dielectric constant than that of the silicon oxide film (e.g., a relative dielectric constant of 2.7 or less), or a combination thereof. The low dielectric constant layer is a carbon-containing film such as SiOC, SiOCH, or SiLK (registered trade name), a HSQ (hydrogen silsesquioxane) film, a MHSQ (methylated hydrogen silsesquioxane) film, a MSQ (methyl silsesquioxane) film, or a porous film thereof. The diffusion preventive film 122 is comprised of, for example, SiN or SiCN. The film thickness of the diffusion preventive film 122 is, for example, 10 to 50 nm.

As shown in FIG. 1, in the wiring layer 100, there are disposed the wire 102, a wire 104, a wire 106, a via 112, a via 114, and a via 116. The via 112 is disposed under the wire 102, and is coupled with the wire 102. The via 114 is disposed under the wire 104, and is coupled with the wire 104. The via 116 is disposed under the wire 106, and is coupled with the wire 106.

The wire 102, the wire 104, and the wire 106 are embedded in the interlayer insulation film 120. Further, the wire 102, the wire 104, and the wire 106 are formed in the same step. For this reason, the wire 102, the wire 104, and the wire 106 are formed of, for example, the same material. The wire 102, the wire 104, and the wire 106 are formed of a metal material including, for example, copper as a main component (95% or more). Incidentally, the wire 102 and the via 112, the wire 104 and the via 114, and the wire 106 and the via 116 may be respectively formed by a single damascene method, or may be formed by a dual damascene method. Further, the wire 102, the wire 104, and the wire 106 may be, for example, Al wires. In this case, the wire 102, the wire 104, and the wire 106 each have, for example, a structure obtained by selectively removing a metal film by dry etching.

As shown in FIG. 1, the wiring layer 200 includes the gate electrode 20, the gate insulation film 22, the semiconductor layer 24, an insulation film 30, and an insulation film 40. The insulation film 30 is disposed over the interlayer insulation film 120. Further, the insulation film 30 is disposed in such a manner as to cover a part of the wire 102, and a part of the wire 104. The insulation film 30 has an opening 32 over the wire 104. Accordingly, the wire 104 is exposed above the insulation film 30. The insulation film 30 can be formed of the same material as that for a diffusion preventive film 222 described later, and can be formed of, for example, SiN or SiCN. The film thickness of the insulation film 30 is, for example, 10 to 50 nm.

The gate electrode 20 is disposed over the insulation film 30. Namely, the insulation film 30 is arranged between the wire 102 and the gate electrode 20. Accordingly, the gate electrode 20 is not coupled with the wire 102. Further, the gate electrode 20 is coupled with the wire 104 via the opening 32 disposed in the insulation film 30. As a result, a gate voltage is applied to the gate electrode 20 via the wire 104. The gate electrode 20 is comprised of, for example, Ti, Ta, W, Al, TiN, TaN, or WN, a compound including Co or W, or a material obtained by introducing at least one of C and O to any of them. The gate electrode 20 may be a single layer comprised of any of the materials, or may be a lamination of two or more layers. The film thickness of the gate electrode 20 is, for example, 5 to 200 nm.

The insulation film 40 is disposed over the gate electrode 20. The insulation film 40 functions as a hard mask for patterning the gate electrode 20 by etching. The insulation film 40 is comprised of, for example, SiN or $SiO_2$. Further, the film thickness of the insulation film 40 is, for example, 10 to 150 nm. By setting the film thickness of the insulation film 40 at 10 to 150 nm, it is possible to inhibit the following: when an opening for embedding the wire 202 and the via 212 therein is formed in the interlayer insulation film 220 (see FIG. 12B), the insulation film 40 is removed, so that the gate electrode 20 is exposed. The film thickness of the insulation film 30 and the film thickness of the insulation film 40 may be in the relation that either one is larger than the other, or may be equal to each other. When the film thickness of either one thereof is larger than the other, the wire of the wire 102 and the wire 202 on the side in contact with the insulation film having a larger film thickness can be allowed to serve as a drain electrode. Incidentally, in the present embodiment, for example, the film thickness of the insulation film 30 is larger than the film thickness of the insulation film 40.

As shown in FIG. 2, the planar shape of the gate electrode 20 is, for example, a rectangle. Incidentally, the planar shape of the gate electrode 20 is not limited thereto, and may be a polygon other than a rectangle, or the like. The planar shapes of the insulation film 30 and the insulation film 40 are the same as that of the gate electrode 20 (not shown).

As shown in FIG. 1, the gate insulation film 22 is formed over the side surfaces of the gate electrode 20, the insulation film 30, and the insulation film 40. The gate insulation film 22 is in a frame shape in plan view. Further, the gate insulation film 22 is disposed along the four sides of the gate electrode 20 in a rectangular shape in plan view. The gate insulation film 22 is comprised of, for example, a silicon oxide film or a silicon nitride film, an oxide film of at least one of Hf, Zr, Al, Ti, and Ta, a metal silicate product of any of these, or a film obtained by adding at least one of nitrogen and carbon to any of these. The film thickness of the gate insulation film 22 in the plane direction horizontal to the substrate (see FIG. 3) plane is, for example, 0.5 to 30 nm.

The semiconductor layer 24 is disposed via the gate insulation film 22 over the side surfaces of the gate electrode 20, the insulation film 30, and the insulation film 40. The semiconductor layer 24 is in a frame shape in plan view. Further, the semiconductor layer 24 is disposed along the four sides of the gate electrode 20 in a rectangular shape in plan view. Furthermore, the semiconductor layer 24 is coupled with the wire 102. The semiconductor layer 24 is formed of, for example, an oxide semiconductor. As the oxide semiconductors, there can be used, for example, InGaZnO, InZnO, ZnO, ZnAlO, ZnCuO, NiO, SnO, $SnO_2$, CuO, $Cu_2O$, $Ta_2O_5$, or $TiO_2$, or those obtained by adding impurities such as nitrogen thereto. The film thickness of the semiconductor layer 24 in the plane direction horizontal to the substrate 60 (see FIG. 3) plane is, for example, 10 to 100 nm. Whereas, the thickness of the semiconductor layer 24 in the direction of stacking of the wiring layer 100 and the wiring layer 200 is, for example, 30 to 300 nm.

As shown in FIG. 1, the wiring layer 200 includes a diffusion preventive film 222 disposed over the wiring layer 100, and an interlayer insulation film 220 disposed over the diffusion preventive film 222. The diffusion preventive film 222 is disposed in such a manner as to cover the gate electrode 20, the gate insulation film 22, the semiconductor layer 24, the insulation film 30, and the insulation film 40. The interlayer insulation film 220 is formed of, for example, the same material as that for the interlayer insulation film 120. The diffusion preventive film 222 is formed of, for example, the same material as that for the diffusion preventive film 122, and has the same film thickness as that of the diffusion preventive film 122.

As shown in FIG. 1, in the wiring layer 200, there are disposed the wire 202, the wire 206, the via 212, and a via 216. The via 212 is disposed under the wire 202, and is coupled with the wire 202. Further, the via 212 is coupled with the semiconductor layer 24. Accordingly, the semiconductor layer 24 is coupled with the wire 202. Whereas, the via 216 is disposed under the wire 206, and is coupled with the wire 206.

The part of the via 212 shown in FIG. 2 shows the bottom surface of the via 212. Whereas, the part of the wire 102 shown in FIG. 2 shows the top surface of the wire 102. As shown in FIG. 2, the top surface of the wire 102 and the bottom surface of the via 212 overlap each other in plan view. Whereas, a part of the semiconductor layer 24 is arranged in the region of overlap between the top surface of the wire 102 and the bottom surface of the via 212. In the present embodiment, the region of overlap between the top surface of the wire 102 and the bottom surface of the via 212 includes one side of the gate electrode 20, Namely, one side of the gate electrode 20 in a rectangular shape in plan view, and a part of each of two sides adjacent to the one side are included in the region of overlap between the top surface of the wire 102 and the bottom surface of the via 212. In this case, one side of the semiconductor layer 24 disposed over the side surface of the gate electrode 20, and a part of each of two sides adjacent to the one side are also included in the region of overlap between the top surface of the wire 102 and the bottom surface of the via 212.

As shown in FIG. 1, the wire 202 and the wire 206 are embedded in, for example, the interlayer insulation film 220. Further, the wire 202 and the wire 206 are formed in the same step. For this reason, the wire 202 and the wire 206 are formed of, for example, the same material. The wire 202 and the wire 206 are formed of, for example, the same material as that for the wire 102. In the example shown in FIG. 1, the wire 202 and the via 212, and the wire 206 and the via 216 may be respectively formed by a single damascene method, or may be formed by a dual damascene method. Further, the wire 202 and the wire 206 may be, for example, Al wires. In this case, the wire 202 and the wire 206 has, for example, a structure obtained by selectively removing a metal film by dry etching.

As shown in FIG. 1, at the sidewall of a trench or a hole for embedding the wire 202 and the via 212 therein, there is formed a barrier metal film 232. Whereas, at the sidewall of a trench or a hole for embedding the wire 206 and the via 216 therein, there is formed a barrier metal film 236. The barrier metal film 232 and the barrier metal film 236 are each comprised of, for example, Ti, Ta, Ru, or W, or a nitride or an oxide thereof. Incidentally, the barrier metal film 232 and the barrier metal film 236 may be a single layer comprised of any of the materials, or may be a lamination of two or more layers. As an example of the lamination structure, there is, for example, a lamination structure of TiN (upper layer)/Ti (lower layer) or Ta (upper layer)/TaN (lower layer).

Whereas, also in the wiring layer 100, at the sidewall of a trench or a hole for embedding each wire and via therein, there may be formed a barrier metal film. The barrier metal film is equal in material and structure to, for example, the barrier metal film 232.

In present embodiment, the wire 102, the wire 202, the gate electrode 20, the gate insulation film 22, and the semiconductor layer 24 form the transistor 10. In a portion of the semiconductor layer 24 arranged in the region of overlap between the bottom surface of the via 212 and the top surface of the wire 102, there is formed a channel region 50. Whereas, the wire 202 coupled with the semiconductor layer 24 through the via 212, and the wire 102 coupled with the semiconductor layer 24 function as source/drain electrodes. The insulation film 30 and the insulation film 40 have a function as a sidewall for defining the distance between the gate electrode 20 and the source/drain electrode. In the present embodiment, the drain electrode is formed of, for example, the wire 102. Whereas, the film thickness of the insulation film 30 disposed between the wire 102 and the gate electrode 20 can be set larger than the film thickness of the insulation film 40 disposed between the via 212 and the gate electrode 20. Thus, in the case where the wire 102 is used as the drain electrode, the film thickness of the insulation film 30 disposed between the gate electrode 20 and the drain electrode is increased. This enables the improvement of the drain withstand voltage of the transistor 10. In the present embodiment, the drain electrode may be formed of the wire 202. Further, the film thickness of the insulation film 40 disposed between the via 212 and the gate electrode 20 can be set larger than the film thickness of the insulation film 30 disposed between the wire 102 and the gate electrode 20. Thus, in the case where the wire 202 is used as the drain electrode, the film thickness of the insulation film 40 disposed between the gate electrode 20 and the drain electrode is increased. This enables the improvement of the drain withstand voltage of the transistor 10.

Incidentally, the channel length of the channel region 50 in the present embodiment is defined by the thickness of the semiconductor layer 24 in the direction of stacking of the wiring layer 100 and the wiring layer 200. Whereas, the channel width of the channel region 50 is defined by the length of the semiconductor layer 24 arranged in the region of overlap between the top surface of the wire 102 and the bottom surface of the via 212 in the plane direction horizontal to the substrate 60 (see FIG. 3) plane.

Figure 3:
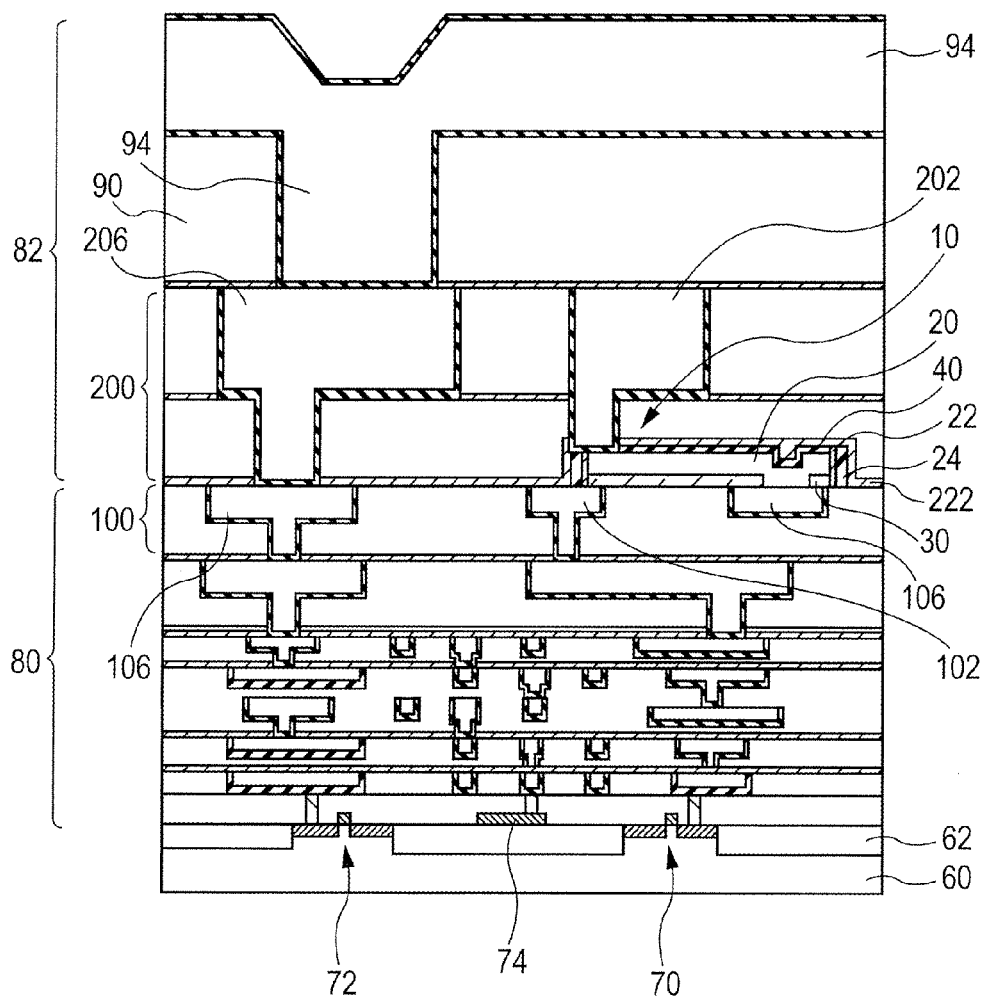
FIG. 3 is a cross-sectional view showing a multilayer wiring structure of the semiconductor device in accordance with the first embodiment.
Figure 4:
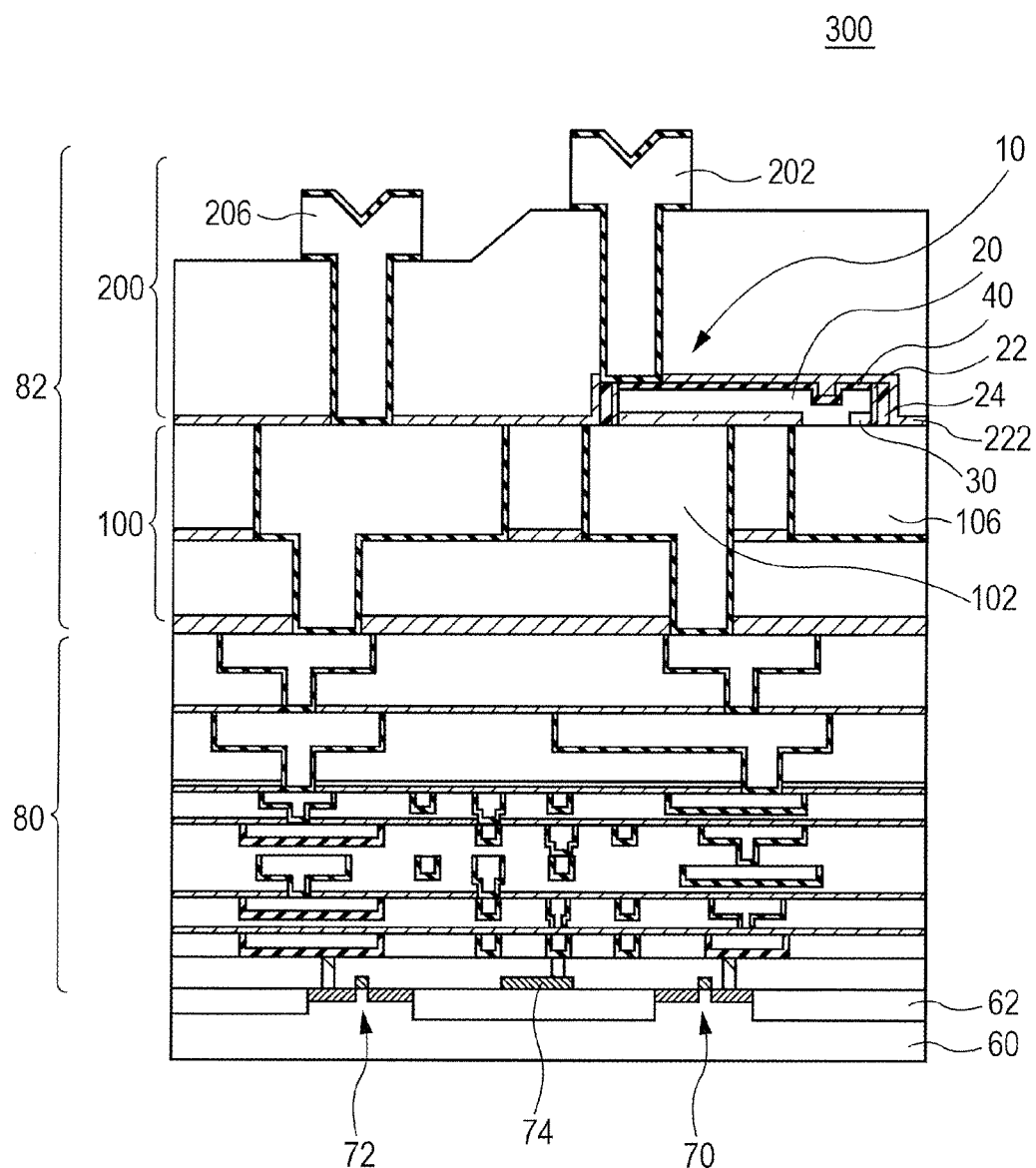
FIG. 4 is a cross-sectional view showing the multilayer wiring structure of the semiconductor device in accordance with the first embodiment.

FIG. 3 is a cross-sectional view showing the multilayer wiring structure of the semiconductor device 300 in accordance with the present embodiment. FIG. 4 shows a cross-sectional view showing a multilayer wiring structure of a semiconductor device 300 in accordance with the present embodiment, and shows a different example from FIG. 3. As shown in FIG. 3, the semiconductor device 300 includes a substrate 60, and a multilayer wiring layer disposed over the substrate 60. The wiring layer 100 and the wiring layer 200 shown in FIG. 1 form a part of the multilayer wiring layer. The multilayer wiring layer includes a local wiring layer 80 which is a wiring layer for forming a circuit, and a global wiring layer 82 disposed over the local wiring layer 80, and for routing a power source wire and a grounding wire. As shown in FIG. 3, the wiring layer 200 is disposed, for example, at the lowermost layer of the global wiring layer 82. Whereas, the wiring layer 100 is disposed, for example, at the uppermost layer of the local wiring layer 80.

As shown in FIG. 3, in the substrate 60, there are disposed an element isolation film 62, a transistor 70, and a transistor 72. Further, over the element isolation film 62, there are disposed passive elements 74 (e.g., resistance element). The passive elements 74 are formed in the same step as that for the gate electrodes of the transistor 70 and the transistor 72.

Over the wiring layer 200, a wire 94 is formed via an interlayer insulation film 90. The wire 94 is an Al wire, and is coupled with a wire (e.g., wire 206) disposed in the wiring layer 200 through the via 92. Barrier metal films are formed at the bottom surface and the top surface of the wire 94. The barrier metal film is a metal film including Ti as a main component, a film of nitride of the metal, or a lamination film of the metal film and the nitride film. Incidentally, at the same layer as the wire 94, there are formed electrode pads (not shown).

Incidentally, each wiring layer forming the local wiring layer 80 is thinner than each wiring layer forming the global wiring layer 82. Then, each wire of the local wiring layer 80 is also thinner than each wire of the global wiring layer 82. Further, the global wiring layer 82 is larger in wire width and distance between the wires than the local wiring layer 80.

FIG. 4 is a view showing a modified example of FIG. 3. In this drawing, the wiring layer 100 and the wiring layer 200 are both formed in the global wiring layer 82. Then, the wire 202 and the wire 206 are each formed of an Al wire. A power source pad, a grounding pad, and an I/O pad are formed in the same layer as the wire 202 and the wire 206.

Figure 5A:
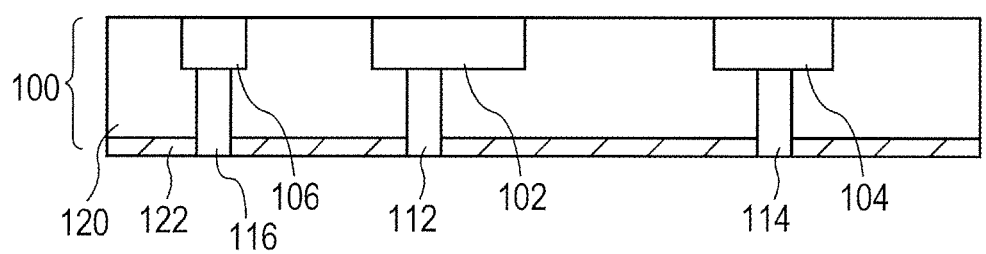
FIGS. 5A and 5B are each a cross-sectional view showing a manufacturing method of the semiconductor device shown in FIG. 1.
Figure 5B:
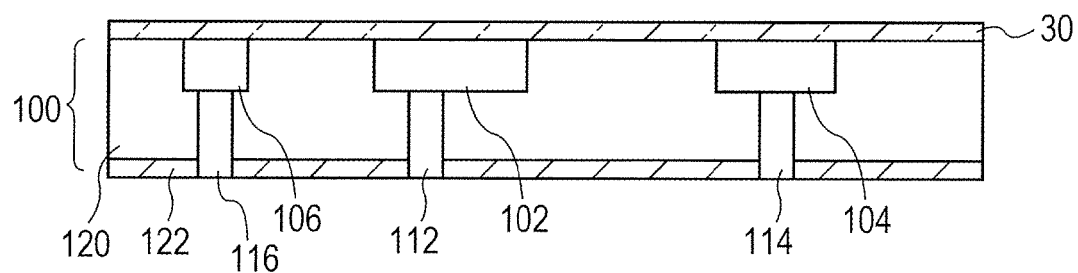

Then, a description will be given to a method for manufacturing the semiconductor device 300 in accordance with the present embodiment. FIGS. 5A and 5B to 12A and 12B are each a cross-sectional view showing a method for manufacturing the semiconductor device 300 shown in FIG. 1. First, as shown in FIG. 5A, the wiring layer 100 is formed. The wiring layer 100 forms a part of the multilayer wiring layer disposed over the substrate 60. The wiring layer 100 is formed in the following manner. First, over the wiring layer arranged at a layer underlying the wiring layer 100, there are stacked the diffusion preventive film 122 and the interlayer insulation film 120. Then, in the diffusion preventive film 122 and the interlayer insulation film 120, there are formed the wire 102 and the via 112, the wire 104 and the via 114, and the wire 106 and the via 116. The wire 102 and the via 112, the wire 104 and the via 114, and the wire 106 and the via 116 are formed using, for example, a dual damascene method or a single damascene method. Alternatively, the wire 102, the wire 104, and the wire 106 may be formed by, for example, patterning the metal film disposed over the interlayer insulation film 120 by dry etching or the like. Then, as shown in FIG. 5B, the insulation film 30 is formed over the wiring layer 100.

Figure 6A:
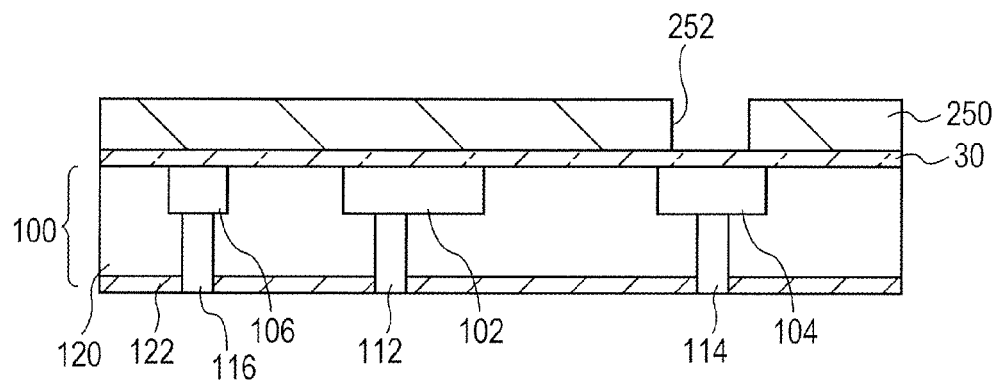
FIGS. 6A and 6B are each a cross-sectional view showing a manufacturing method of the semiconductor device shown in FIG. 1.
Figure 6B:
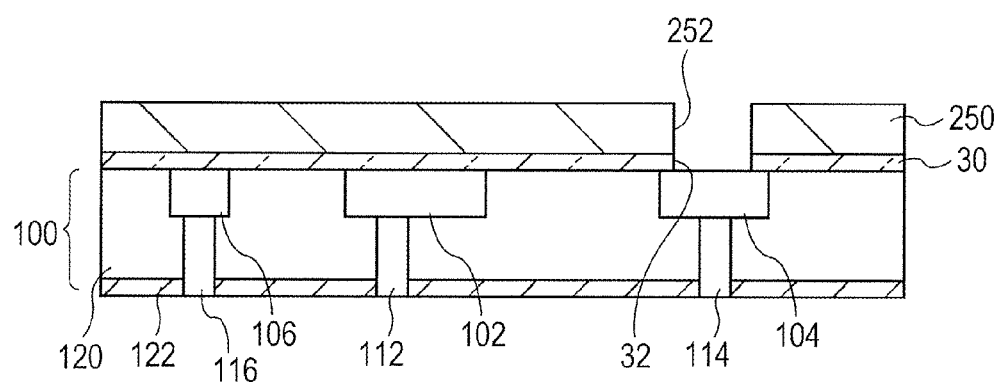

Then, as shown in FIG. 6A, over the insulation film 30, there is formed a resist film 250. Then, the resist film 250 is exposed to light, and is developed, so that an opening 252 arranged over the wire 104 in plan view is formed in the resist film 250. Incidentally, the opening 252 is disposed in such a manner as to be arranged inside the wire 104 in plan view. Then, as shown in FIG. 6B, by dry etching using the resist film 250 as a mask, or the like, a portion of the insulation film 30 arranged under the opening 252 is selectively removed. As a result, the opening 32 is formed in the insulation film 30. At this step, the wire 104 is exposed above the insulation film 30 via the opening 32.

Figure 7A:
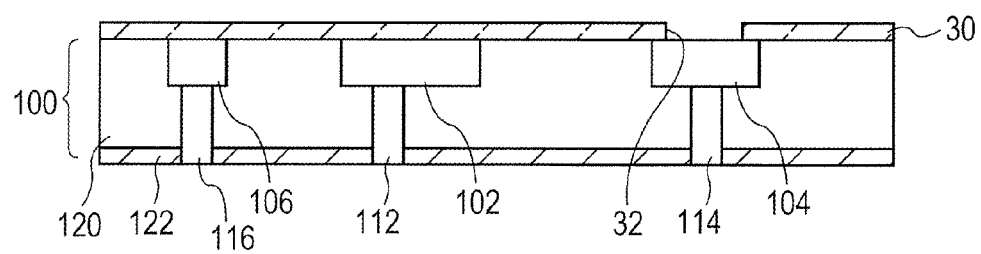
FIGS. 7A and 7B are each a cross-sectional view showing a manufacturing method of the semiconductor device shown in FIG. 1.
Figure 7B:
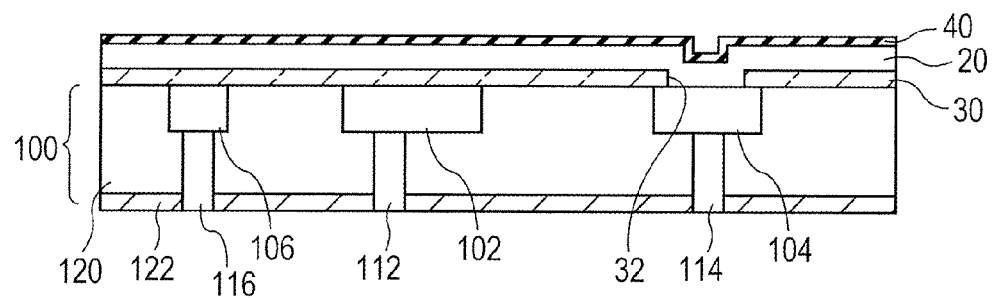

Then, as shown in FIG. 7A, the resist film 250 is removed. The removal of the resist film 250 is performed by a method such as ashing. Then, as shown in FIG. 7B, the gate electrode 20 is formed over the insulation film 30 and in the opening 32. Then, the insulation film 40 is formed over the gate electrode 20.

Figure 8A:
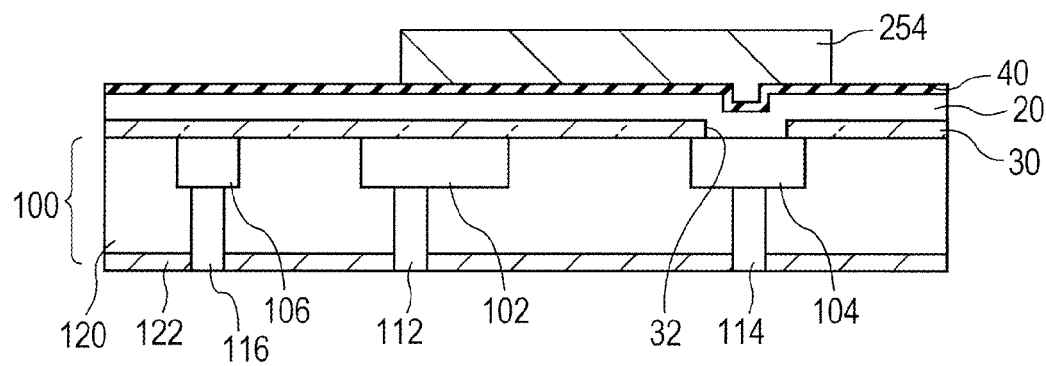
FIGS. 8A and 8B are each a cross-sectional view showing a manufacturing method of the semiconductor device shown in FIG. 1.
Figure 8B:
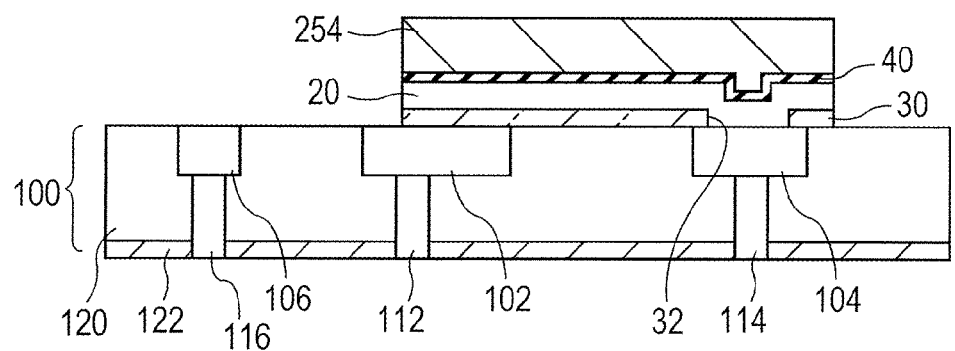

Then, as shown in FIG. 8A, a resist film 254 is formed. The resist film 254 is formed by exposing to light and developing the resist film disposed over the insulation film 40. Then, as shown in FIG. 8B, the insulation film 30, the gate electrode 20, and the insulation film 40 are selectively removed by dry etching using the resist film 254 as a mask, or the like. The etching is performed so that the insulation film 30, the gate electrode 20, and the insulation film 40 cover a part of the wire 102 and a part of the wire 104. As a result, the insulation film 30, the gate electrode 20, and the insulation film 40 are processed into a prescribed shape. Incidentally, in the etching treatment step, the insulation film 40 functions as a hard mask.

Figure 9A:
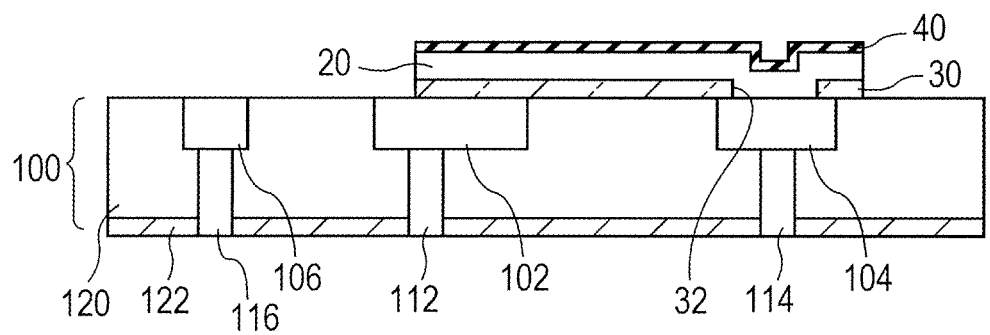
FIGS. 9A and 9B are each a cross-sectional view showing a manufacturing method of the semiconductor device shown in FIG. 1.
Figure 9B:
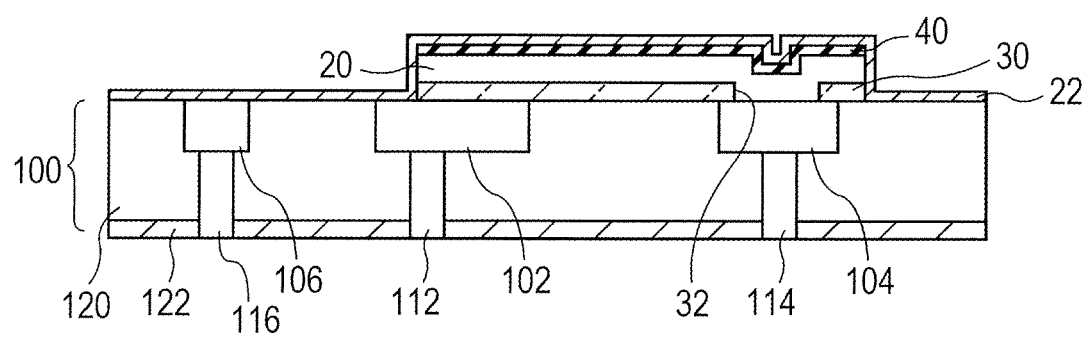

Then, as shown in FIG. 9A, the resist film 254 is removed. The resist film 254 is removed by a method such as ashing. Then, as shown in FIG. 9B, the gate insulation film 22 is formed over the wiring layer 100. At this step, the gate insulation film 22 is formed in such a manner as to cover the insulation film 30, the gate electrode 20, and the insulation film 40.

Figure 10A:
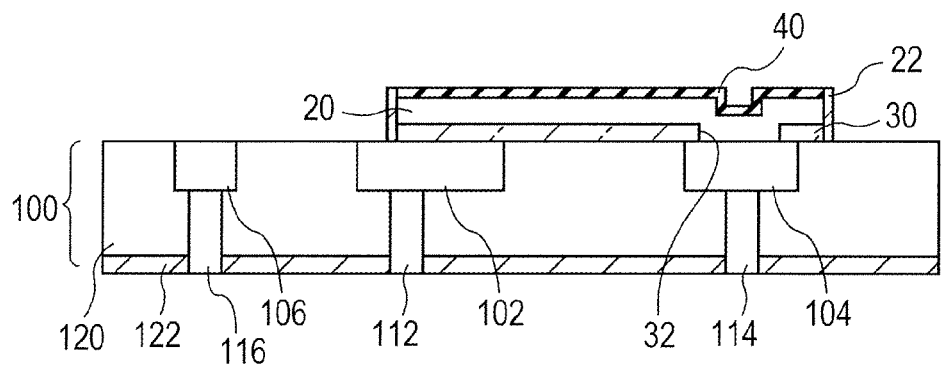
FIGS. 10A and 10B are each a cross-sectional view showing a manufacturing method of the semiconductor device shown in FIG. 1.
Figure 10B:
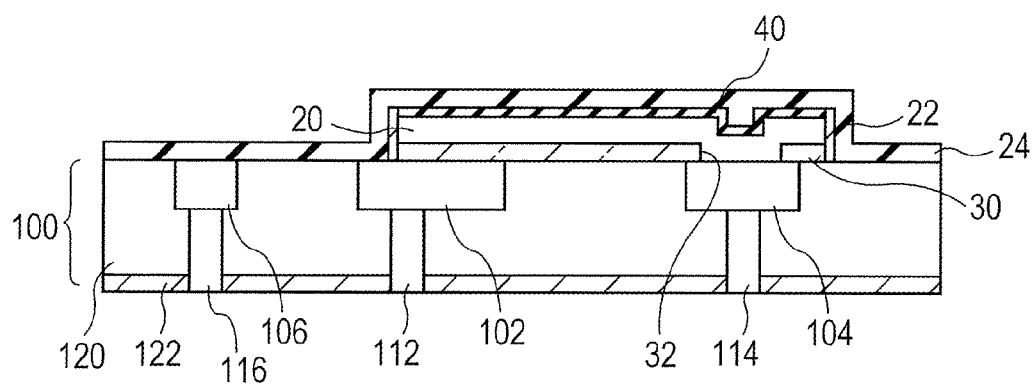

Then, as shown in FIG. 10A, the entire surface of the gate insulation film 22 is etched back. As a result, the gate insulation film 22 can be processed into a prescribed shape, namely, a shape disposed over the side surfaces of the insulation film 30, the gate electrode 20, and the insulation film 40. Then, as shown in FIG. 10B, the semiconductor layer 24 is formed over the wiring layer 100. At this step, the semiconductor layer 24 is formed in such a manner as to cover the insulation film 30, the gate electrode 20, the insulation film 40, and the gate insulation film 22.

Figure 11A:
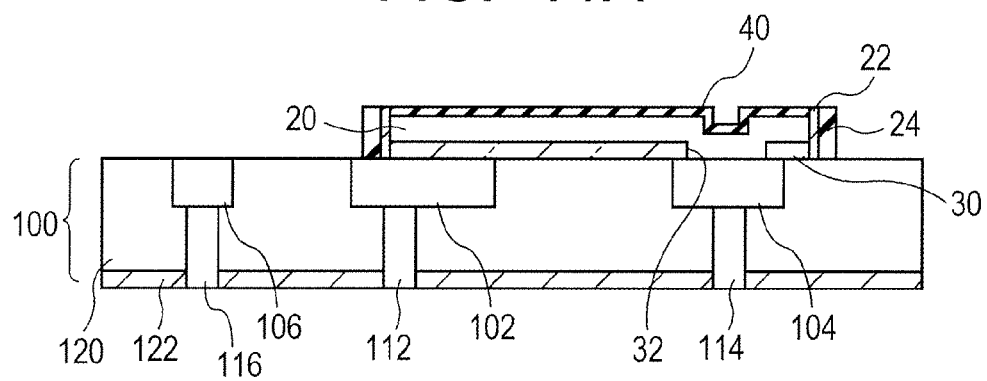
FIGS. 11A and 11B are each a cross-sectional view showing a manufacturing method of the semiconductor device shown in FIG. 1.
Figure 11B:
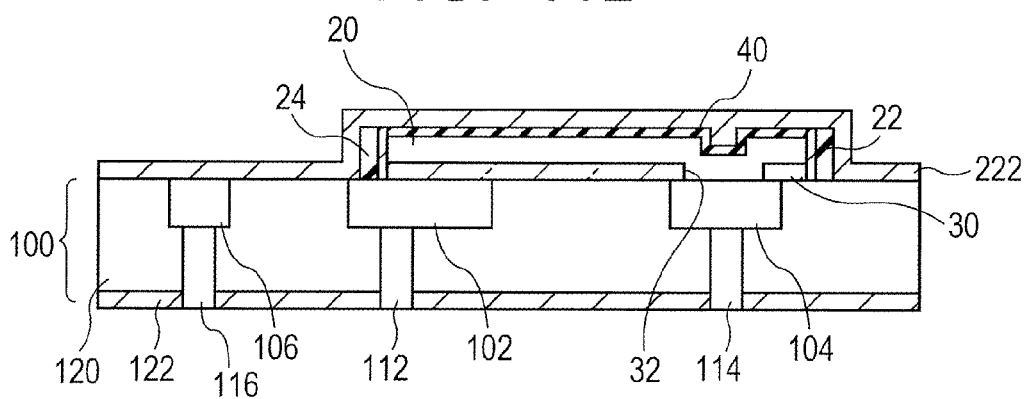

Then, as shown in FIG. 11A, the entire surface of the semiconductor layer 24 is etched back. As a result, the semiconductor layer 24 can be processed into a prescribed shape, namely, a shape disposed over the side surfaces of the insulation film 30, the gate electrode 20, and the insulation film 40 via the gate insulation film 22. Then, as shown in FIG. 11B, the diffusion preventive film 222 is formed over the wiring layer 100. The diffusion preventive film 222 is formed in such a manner as to cover the insulation film 30, the gate electrode 20, the insulation film 40, the gate insulation film 22, and the semiconductor layer 24.

Figure 12A:
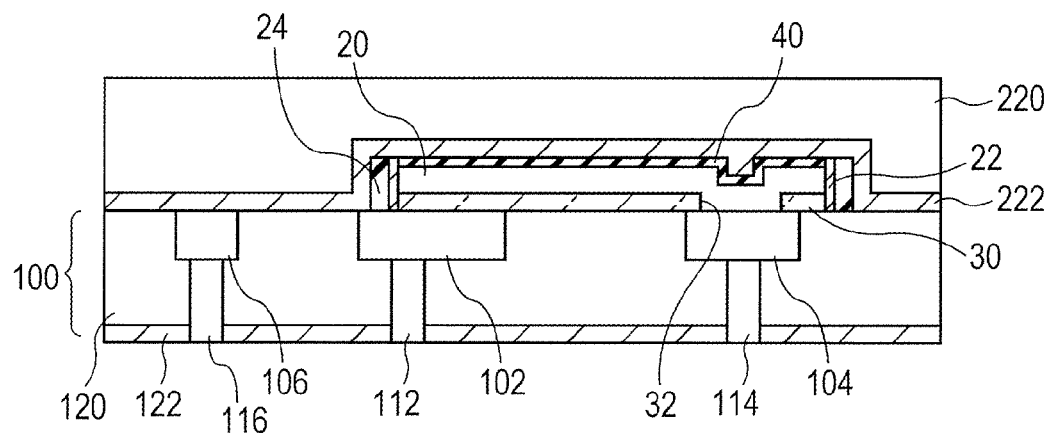
FIGS. 12A and 12B are each a cross-sectional view showing a manufacturing method of the semiconductor device shown in FIG. 1.
Figure 12B:
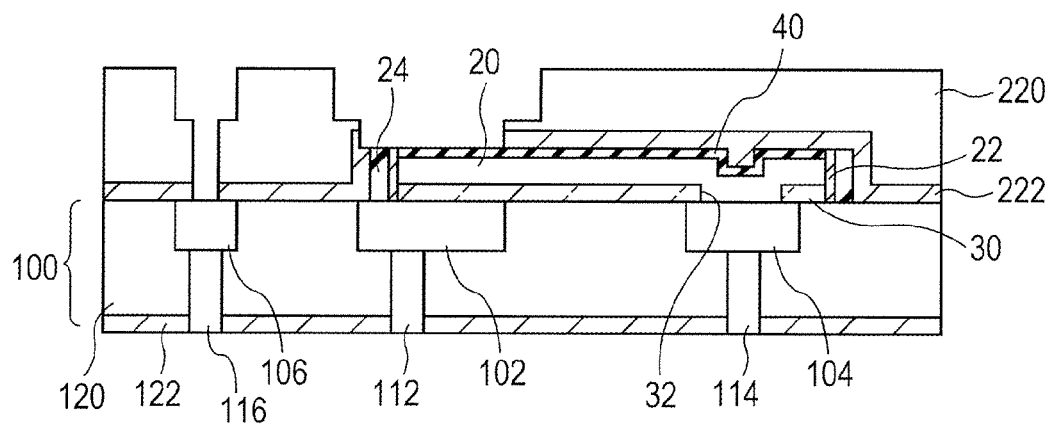

Then, as shown in FIG. 12A, the interlayer insulation film 220 is formed over the diffusion preventive film 222. Then, as shown in FIG. 12B, in the interlayer insulation film 220 and the diffusion preventive film 222, there are formed openings for embedding the wire 202 and the via 212, and the wire 206 and the via 216 therein, respectively. Then, over the sidewalls of the openings, there are formed the barrier metal film 232 and the barrier metal film 236. Then, a metal film is formed over the wiring layer 200 and in the openings. Then, the metal film over the interlayer insulation film 220 is removed by, for example, CMP. This results in the wiring layer 200 shown in FIG. 1. Then, for example, over the wiring layer 200, another wiring layer is formed, resulting in the semiconductor device 300 in accordance with the present embodiment.

Incidentally, as shown in FIG. 12B, in the present embodiment, the wire 202 and the via 212, and the wire 206 and the via 216 were formed by a dual damascene method. However, the method is not limited thereto, and the wire 202 and the via 212, and the wire 206 and the via 216 may be formed by, for example, a single damascene method. Alternatively, the wire 202 and the wire 206 may be formed by, for example, patterning the metal film disposed over the interlayer insulation film 220 by dry etching or the like.

Then, the effects of the present embodiment will be described. In the semiconductor element described in Patent Document 1, the two wires disposed in the same wiring layer serve as source/drain electrodes. Whereas, the gate electrode is formed of a wire disposed under the source/drain electrodes, and arranged between the source/drain electrodes in plan view. For this reason, the channel length of the semiconductor element is defined by the space between the two wires forming the source/drain electrodes. In this case, the channel length miniaturization limit is restricted by the resolution limit of the lithography for use in the wire formation. In the wiring layer arranged at the top of the multilayer wiring layer, such as the global wiring layer, the design dimensions such as the line width of the wire and the pitch are larger than those of other layers. In this case, the resolution limit of the lithography is restricted by such large design dimensions. Accordingly, it becomes difficult to miniaturize the channel length.

In accordance with the present embodiment, the wire 102 disposed in the wiring layer 100, and the wire 202 disposed in the wiring layer 200 stacked over the wiring layer 100 form the source/drain electrodes. Further, the gate electrode 20 is disposed between the wire 102 and the wire 202. For this reason, the channel length of the transistor 10 disposed in the wiring layer is determined by the film thickness of the gate electrode 20. In this case, the channel length of the transistor 10 is not restricted by the resolution limit of the lithography for use in the wire formation. Therefore, the channel length of the semiconductor element disposed in the multilayer wiring layer can be shortened for improving the performances of the semiconductor element.

Whereas, in accordance with the present embodiment, the channel length of the transistor 10 is not restricted by the resolution limit of the lithography for use in the wire formation. For this reason, even when a semiconductor element is disposed in the wiring layer arranged at the top of the multilayer wiring layer, such as the global wiring layer, it is possible to miniaturize the channel length. Further, shortening of the channel length enables the improvement of the performances of the transistor such as the reduction of the ON resistance. For this reason it is possible to improve the performances of the transistor while keeping constant the in-plane density of the transistor.

In Patent Document 1, the gate electrode is formed of a Cu wire. Whereas, the gate insulation film is formed of a Cu diffusion preventive film formed over the wiring layer having the gate electrode. In this case, the materials for and the film thicknesses of the gate electrode and the gate insulation film cannot be arbitrarily selected. In contrast, in accordance with the present embodiment, the gate electrode 20 is separately formed from the wire disposed in the wiring layer 200. Whereas, the gate insulation film 22 is separately disposed from the diffusion preventive film 222 disposed over the wiring layer 100. Accordingly, the materials for and the film thicknesses of the gate electrode 20 and the gate insulation film 22 can be arbitrarily selected.

As described above, by properly selecting the materials for and the film thicknesses of the gate electrode and the gate insulation film, it is possible to suppress the short channel effect even when the channel length is miniaturized. Whereas, by properly selecting the material for the gate electrode, it is possible to arbitrarily select the work function of the gate electrode. Accordingly, it is possible to control the threshold voltage of the semiconductor element. As a result, for example, it becomes possible to set the semiconductor element to be any of the normally on type or the normally off type.

In Patent Document 1, the gate insulation film is also allowed to function as a Cu diffusion barrier film. In this case, the gate insulation film is required to have a film thickness enough to implement the function as the Cu diffusion barrier film. Further, in this case, the gate insulation film is required to be formed of a material having a function as the Cu diffusion barrier film. In contrast, in accordance with the present embodiment, the film thickness of the gate insulation film 22 can be arbitrarily selected. For this reason, it becomes possible to reduce the thickness of the gate insulation film for improving the performances of the semiconductor element. Further, in accordance with the present embodiment, the material for the gate insulation film 22 can be arbitrarily selected. For this reason, for example, it becomes possible to control the trap density in the gate insulation film, or the like for improving the reliability of the semiconductor element.

Figure 13:
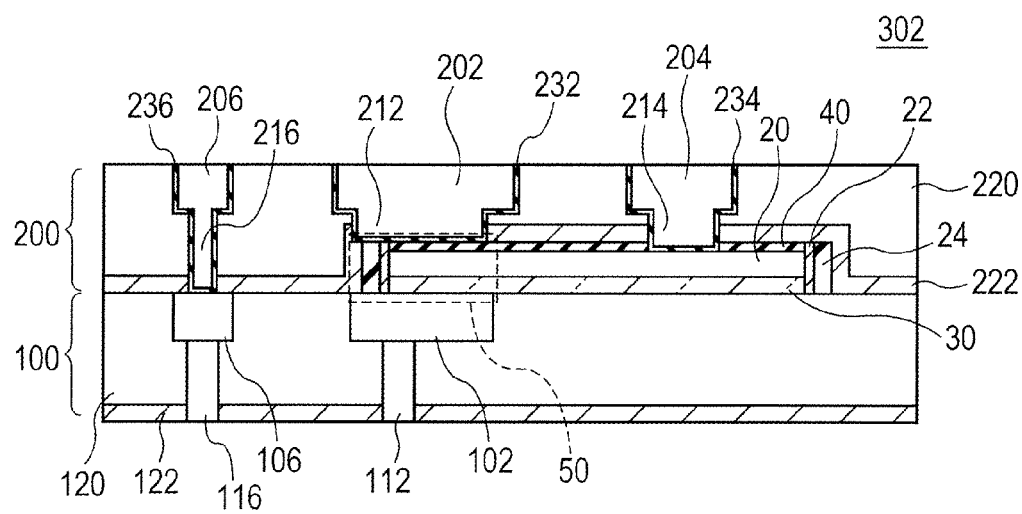
FIG. 13 is a cross-sectional view showing a semiconductor device in accordance with a second embodiment.

FIG. 13 is a cross-sectional view showing a semiconductor device 302 in accordance with a second embodiment, and corresponds to FIG. 1 in the first embodiment. In the semiconductor device 302 in accordance with the present embodiment, there are disposed the wire 204 and the via 214, and there are not disposed the wire 104 and the via 114. Except for these points, the semiconductor device 302 in accordance with the present embodiment is the same as the semiconductor device 300 in accordance with the first embodiment.

As shown in FIG. 13, the semiconductor device 302 includes the wire 204 and the via 214 disposed in the wiring layer 200. The via 214 is disposed under the wire 204, and is coupled with the wire 204. Further, the via 214 is disposed penetrating through the diffusion preventive film 222 and the insulation film 40, and is coupled with the gate electrode 20. Accordingly, in the present embodiment, a gate voltage is applied via the wire 204 to the gate electrode 20. The wire 204 is embedded in the interlayer insulation film 220. Further, the wire 204 is formed by the same step as that for the wire 202. For this reason, the wire 204 is formed of the same material as that for the wire 202. Incidentally, the wire 204 may be formed by a single damascene method, or may be formed by a dual damascene method. Alternatively, the wire 204 may have, for example, a structure obtained by selectively removing the metal film by dry etching.

At the sidewall of a trench or a hole for embedding the wire 204 and the via 214 therein, there is formed a barrier metal film 234. The barrier metal film 234 is formed of, for example, the same material as that for the barrier metal film 232.

Also in the present embodiment, it is possible to obtain the same effects as those of the first embodiment.

Figure 14:
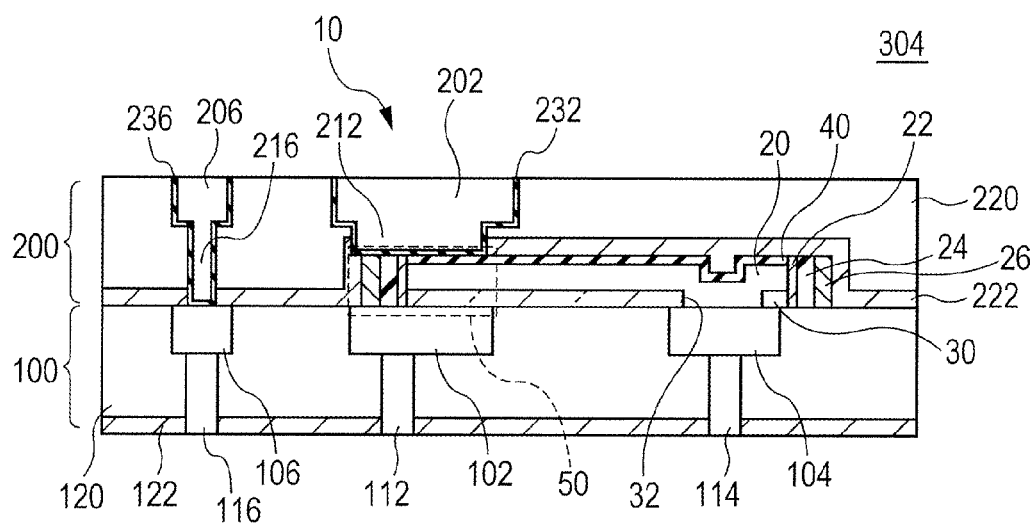
FIG. 14 is a cross-sectional view showing a semiconductor device in accordance with a third embodiment.

FIG. 14 is a cross-sectional view showing a semiconductor device 304 in accordance with a third embodiment, and corresponds to FIG. 1 in accordance with the first embodiment. The semiconductor device 304 in accordance with the present embodiment includes an insulation film 26. Except for this point, the semiconductor device 304 in accordance with the present embodiment has the same configuration as that of the semiconductor device 300 in accordance with the first embodiment.

As shown in FIG. 14, the insulation film 26 is disposed over the side surfaces of the insulation film 30, the gate electrode 20, and the insulation film 40 via the gate insulation film 22 and the semiconductor layer 24. The insulation film 26 is formed of, for example, SiN or SiO$_2$. Whereas, the film thickness of the insulation film 26 in the plane direction horizontal to the substrate 60 plane is, for example, 10 to 100 nm.

The method for manufacturing the semiconductor device 304 in accordance with the present embodiment is as follows. First, through the same steps as the manufacturing steps of the first embodiment shown in FIGS. 5A and 5B to 10A and 10B, and FIG. 11A, the structure shown in FIG. 11A is obtained. Then, the insulation film 26 is formed over the wiring layer 100. The insulation film 26 is formed in such a manner as to cover the insulation film 30, the gate electrode 20, the insulation film 40, the gate insulation film 22, and the semiconductor layer 24. Then, the entire surface of the insulation film 26 is etched back. As a result, the insulation film 26 can be processed into a prescribed shape, namely, a shape disposed over the side surfaces of the insulation film 30, the gate electrode 20, and the insulation film 40 via the gate insulation film 22 and the semiconductor layer 24. Then, through the same steps as the manufacturing steps of the first embodiment shown in FIGS. 11B and 12A and 12B, there is formed the semiconductor device 304.

Also in the present embodiment, it is possible to obtain the same effects as those of the first embodiment. Further, in accordance with the present embodiment, the insulation film 26 is disposed between the diffusion preventive film 222 and the semiconductor layer 24. For this reason, even when the thickness of the diffusion preventive film 222 is not sufficient, it becomes possible to separate the channel region 50 formed of the semiconductor layer 24 from the surroundings thereof. Further, it is possible to shorten the time during which the semiconductor film 24 is exposed in manufacturing of the present semiconductor device. Accordingly, it is possible to obtain stable characteristics.

Figure 15:
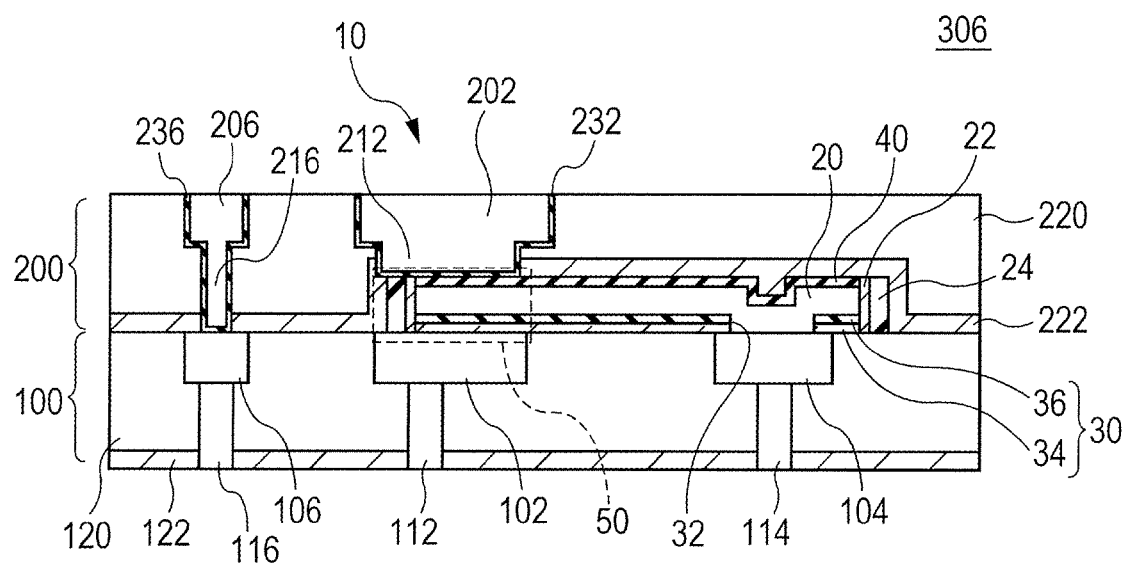
FIG. 15 is a cross-sectional view showing a semiconductor device in accordance with a fourth embodiment.

FIG. 15 is a cross-sectional view showing a semiconductor device 306 in accordance with a fourth embodiment, and corresponds to FIG. 1 in the first embodiment. In the semiconductor device 306 in accordance with the present embodiment, the insulation film 30 is formed of a lower layer insulation film 34 and an upper layer insulation film 36. Except for this point, the semiconductor device 306 in accordance with the present embodiment has the same configuration as that of the first embodiment.

As shown in FIG. 15, the insulation film 30 is formed of the lower layer insulation film 34, and the upper layer insulation film 36 disposed over the lower layer insulation film 34. The upper layer insulation film 36 is formed of a different material from that for the lower layer insulation film 34. As the material for the lower layer insulation film 34, there can be selected the one functioning as an etching stopper film for patterning the upper layer insulation film 36 by etching as described later. The lower layer insulation film 34 is formed of, for example, a silicon nitride film. The upper layer insulation film 36 is formed of, for example, a silicon oxide film. The film thickness of the lower layer insulation film 34 is, for example, 10 to 50 nm. The film thickness of the upper layer insulation film 36 is, for example, 10 to 50 nm.

Figure 16A:
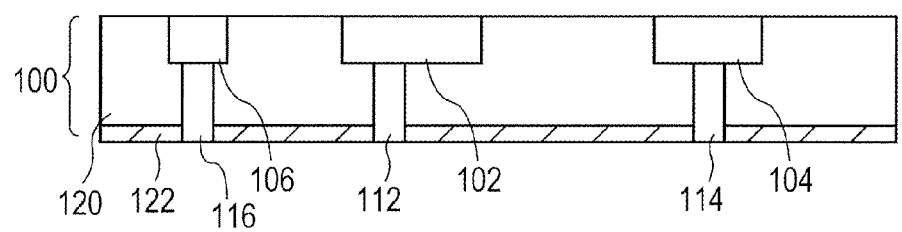
FIGS. 16A and 16B are each a cross-sectional view showing a manufacturing method of the semiconductor device shown in FIG. 15.
Figure 16B:
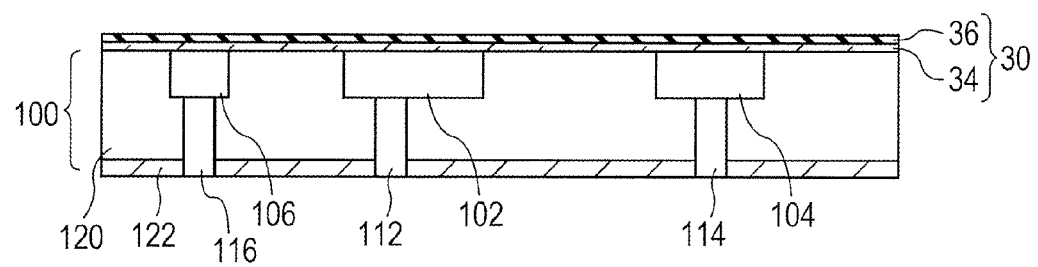

Then, a description will be given to a method for manufacturing the semiconductor device 306 in accordance with the present embodiment. FIGS. 16A and 16B to 21A and 21B are each a cross-sectional view showing a method for manufacturing the semiconductor device 306 shown in FIG. 15. First, as shown in FIG. 16A, the wiring layer 100 is formed. The wiring layer 100 forms a part of the multilayer wiring layer disposed over the substrate 60. Incidentally, the wiring layer 100 can be formed in the same manner as in the first embodiment. Then, as shown in FIG. 16B, the insulation film 30 is formed over the wiring layer 100. The insulation film 30 is formed of the lower layer insulation film 34, and the upper layer insulation film 36 stacked over the lower layer insulation film 34.

Figure 17A:
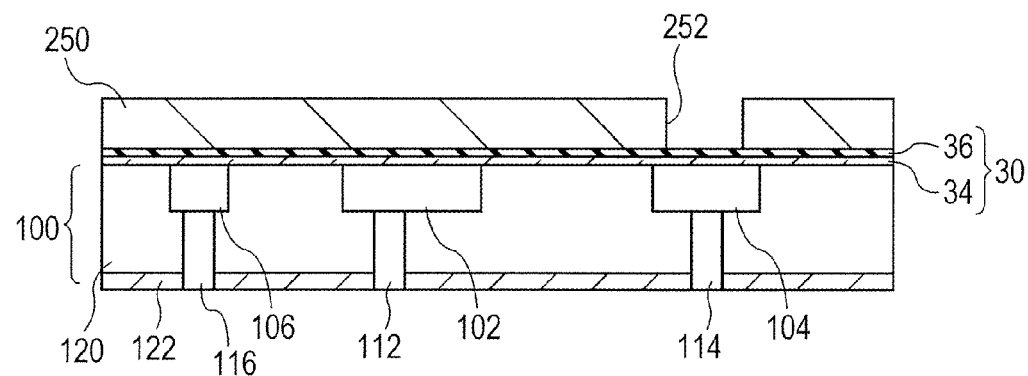
FIGS. 17A and 17B are each a cross-sectional view showing a manufacturing method of the semiconductor device shown in FIG. 15.
Figure 17B:
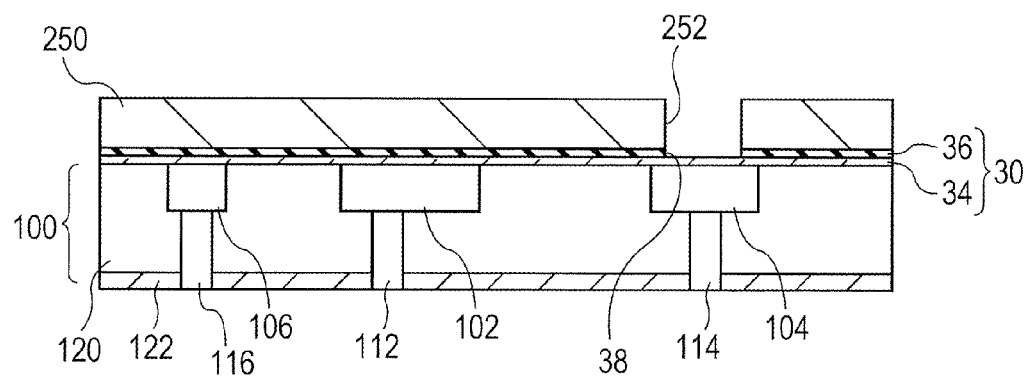

Then, as shown in FIG. 17A, the resist film 250 is formed over the insulation film 30. Then, the resist film 250 is exposed to light, and is developed, so that the opening 252 arranged over the wire 104 in plan view is formed in the resist film 250. Incidentally, the opening 252 is disposed in such a manner as to be arranged inside the wire 104 in plan view. Then, as shown in FIG. 17B, by dry etching using the resist film 250 as a mask, or the like, a portion of the upper layer insulation film 36 arranged under the opening 252 is selectively removed. As a result, an opening 38 is formed in the upper layer insulation film 36. In the etching step, the lower layer insulation film 34 functions as an etching stopper film. Therefore, the lower layer insulation film 34 is left under the opening 38.

Figure 18A:
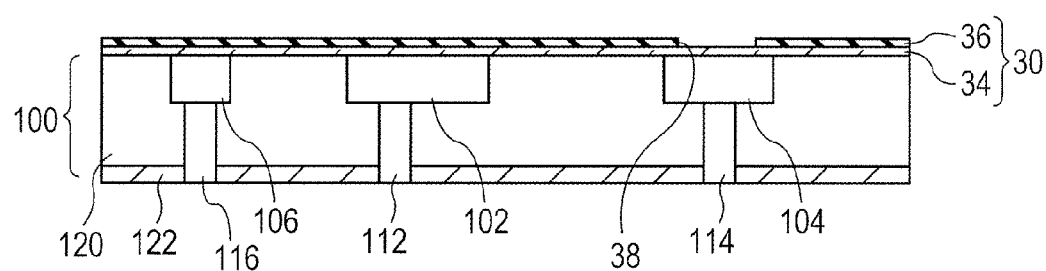
FIGS. 18A and 18B are each a cross-sectional view showing a manufacturing method of the semiconductor device shown in FIG. 15.
Figure 18B:
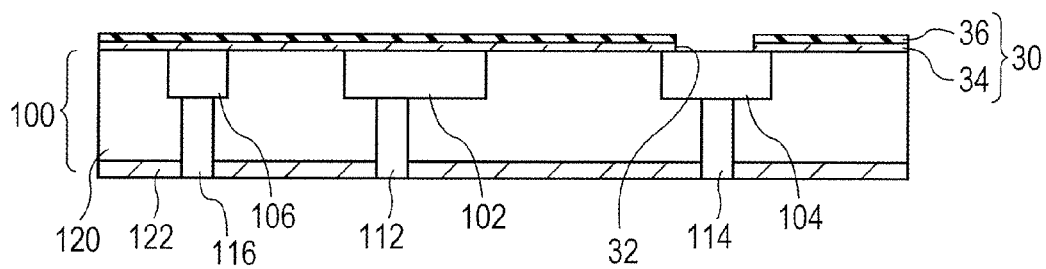

Then, as shown in FIG. 18A, the resist film 250 is removed. The resist film 250 is removed by a method such as ashing. During the ashing treatment, the wire 104 is covered with the lower layer insulation film 34, and is not exposed. Therefore, it is possible to inhibit the wire 104 from being subjected to ashing and from being deteriorated. Then, as shown in FIG. 18B, by dry etching using the upper layer insulation film 36 as a mask, or the like, the lower layer insulation film 34 arranged under the opening 38 is selectively removed. As a result, the opening 32 is formed in the insulation film 30. At this step, the wire 104 is exposed above the insulation film 30 via the opening 32.

Figure 19A:
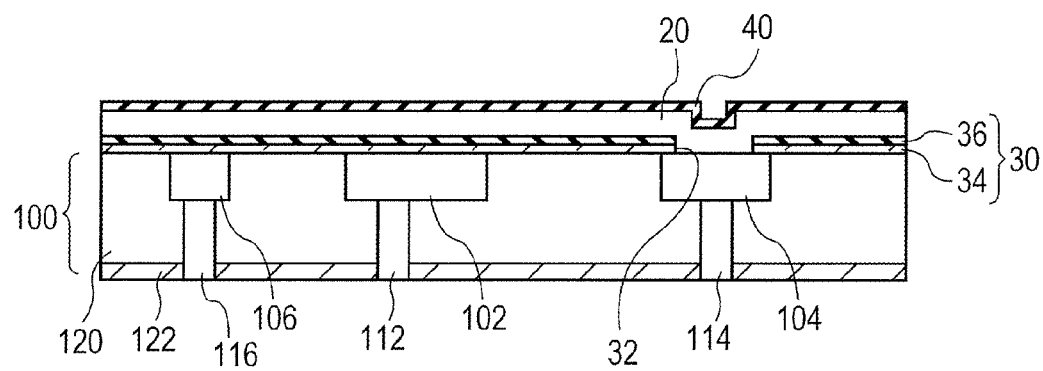
FIGS. 19A and 19B are each a cross-sectional view showing a manufacturing method of the semiconductor device shown in FIG. 15.
Figure 19B:
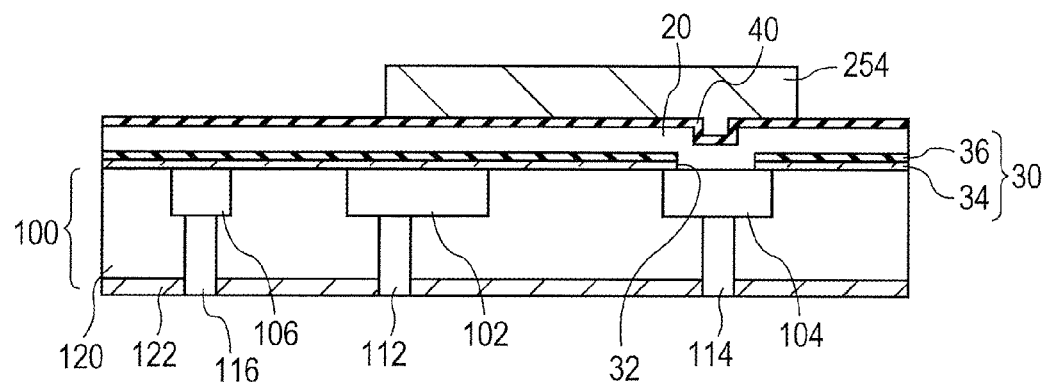

Then, as shown in FIG. 19A, the gate electrode 20 is formed over the insulation film 30 and in the opening 32. Then, the insulation film 40 is formed over the gate electrode 20. Then, as shown in FIG. 19B, the resist film 254 is formed. The resist film 254 is formed by exposing to light and developing the resist film disposed over the insulation film 40.

Figure 20A:
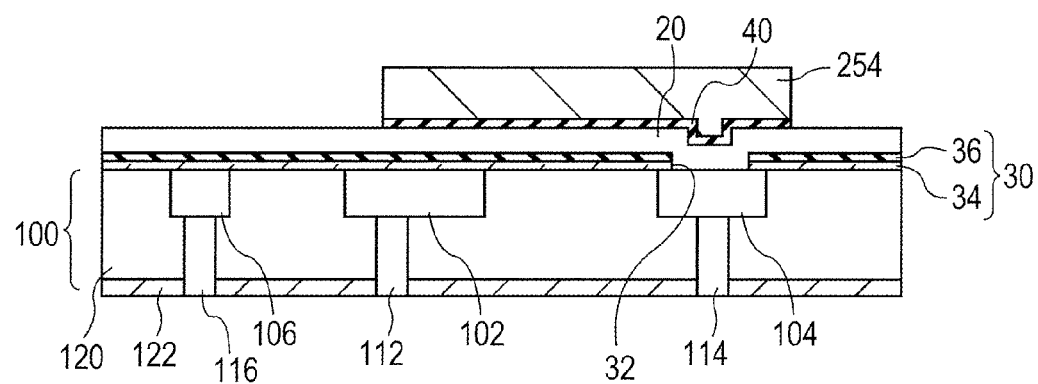
FIGS. 20A and 20B are each a cross-sectional view showing a manufacturing method of the semiconductor device shown in FIG. 15.
Figure 20B:
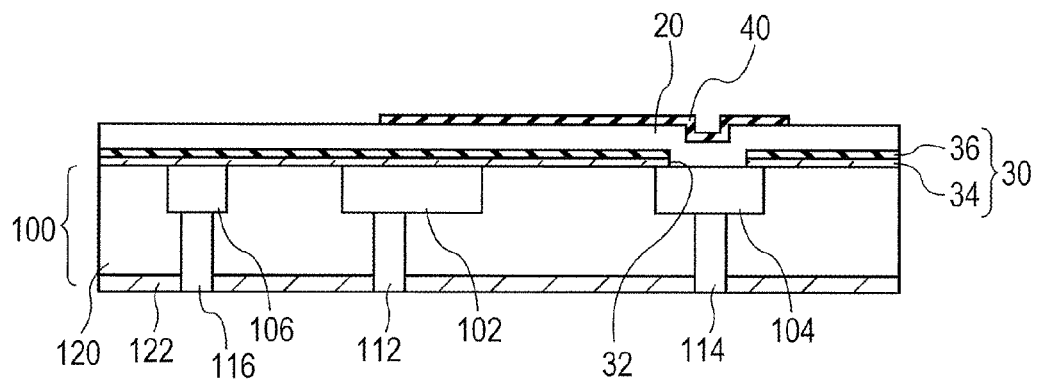

Then, as shown in FIG. 20A, by dry etching using the resist film 254 as a mask, or the like, the insulation film 40 is selectively removed. As a result, the insulation film 40 is processed into a prescribed shape. Then, as shown in FIG. 20B, the resist film 254 is removed. The resist film 254 is removed by a method such as ashing. In the ashing treatment, the wires (e.g., the wire 102 and the wire 106) disposed in the wiring layer 100 are covered with the gate electrode 20 and the like, and are not exposed. Therefore, it is possible to inhibit the wires from being subjected to ashing, and from being deteriorated.

Figure 21A:
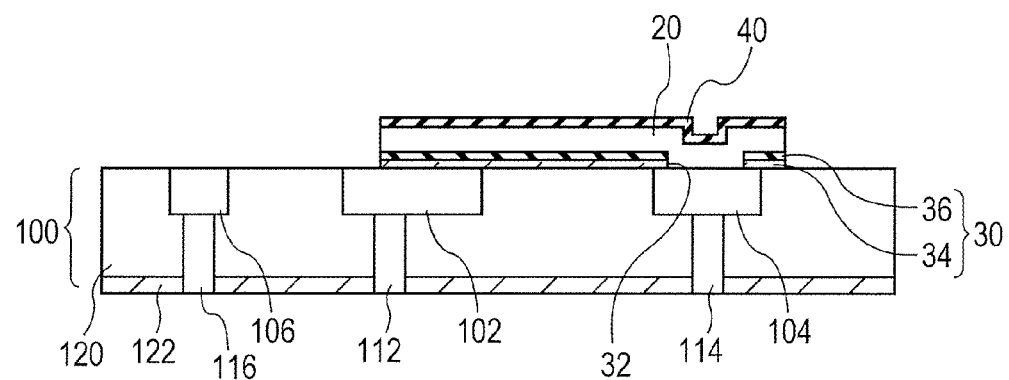
FIGS. 21A and 21B are each a cross-sectional view showing a manufacturing method of the semiconductor device shown in FIG. 15.
Figure 21B:
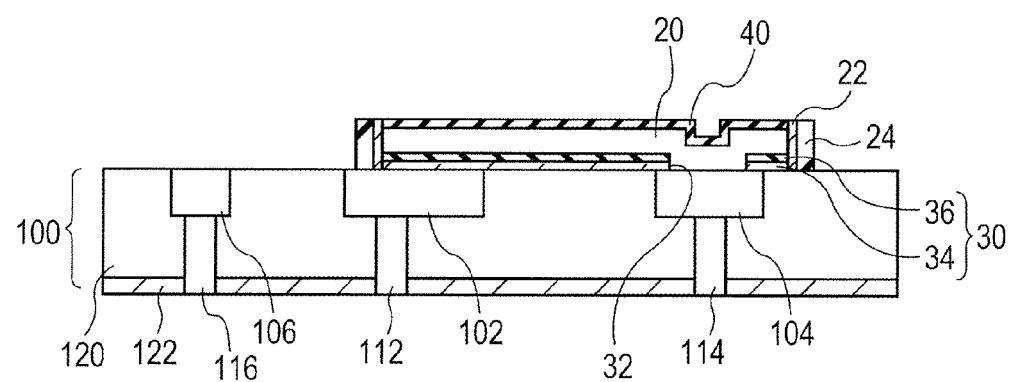

Then, as shown in FIG. 21A, by dry etching using the insulation film 40 as a mask, or the like, the insulation film 30 and the gate electrode 20 are selectively removed. As a result, the insulation film 30 and the gate electrode 20 are processed into a prescribed shape. Then, as shown in FIG. 21B, the gate insulation film 22 and the semiconductor layer 24 are formed over the side surfaces of the insulation film 30, the gate electrode 20, and the insulation film 40. Incidentally, the gate insulation film 22 and the semiconductor layer 24 can be formed in the same manner as in the first embodiment. Then, as with the first embodiment, the wiring layer 200 is formed. Then, for example, over the wiring layer 200, another wiring layer is formed, resulting in the semiconductor device 306 in accordance with the present embodiment.

Then, the effects of the present embodiment will be described. In the manufacturing step of the semiconductor device, the wire may be deteriorated due to the ashing treatment for removing the resist film. In the present embodiment, the insulation film 30 is formed of the lower layer insulation film 34, and the upper layer insulation film 36 disposed over the lower layer insulation film 34, and formed of a different material from that for the lower layer insulation film 34. As a result, as shown in FIG. 18A, in the step of removing the resist film 250 by ashing, the wire 104 can be protected by the lower layer insulation film 34. Therefore, it is possible to inhibit the deterioration of the wire in the ashing treatment for removing the resist film.

Further, in the present embodiment, as shown in FIG. 20A, using the resist film 254 as a mask, the insulation film 40 is selectively removed. Then, the resist film 254 is removed by an ashing treatment. Then, using the insulation film 40 as a mask, the insulation film 30 and the gate electrode 20 are patterned. Accordingly, in the step of removing the resist film 254, the wires disposed in the wiring layer 100 can be protected by the insulation film 30 and the gate electrode 20.

Therefore, it is possible to inhibit the deterioration of the wire in the ashing treatment for removing the resist film.

Figure 22:
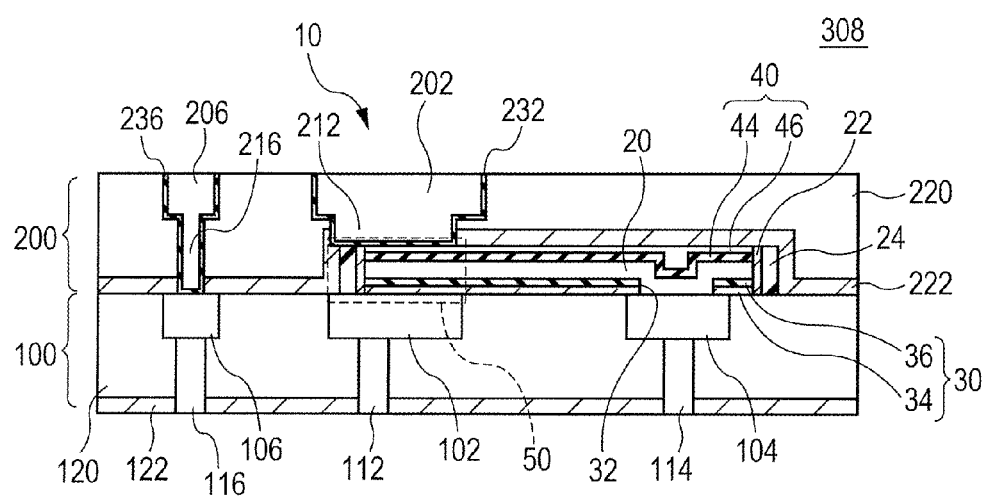
FIG. 22 is a cross-sectional view showing a semiconductor device in accordance with a fifth embodiment.

FIG. 22 is a cross-sectional view showing a semiconductor device 308 in accordance with a fifth embodiment, and corresponds to FIG. 15 in the fourth embodiment. In the semiconductor device 308 in accordance with the present embodiment, the insulation film 40 is formed of a lower layer insulation film 44 and an upper layer insulation film 46. Except for this point, the semiconductor device 308 in accordance with the present embodiment has the same configuration as that of semiconductor device 306 in accordance with the fourth embodiment.

As shown in FIG. 22, the insulation film 40 is formed of the lower layer insulation film 44, and the upper layer insulation film 46 disposed over the lower layer insulation film 44. The upper layer insulation film 46 is formed of a different material from that for the lower layer insulation film 44. The lower layer insulation film 44 is formed of, for example, SiN or SiO$_2$. The upper layer insulation film 46 is formed of, for example, SiN or SiO$_2$. The film thickness of the lower layer insulation film 44 is, for example, 5 to 50 nm. The film thickness of the upper layer insulation film 46 is, for example, 5 to 50 nm.

Figure 23A:
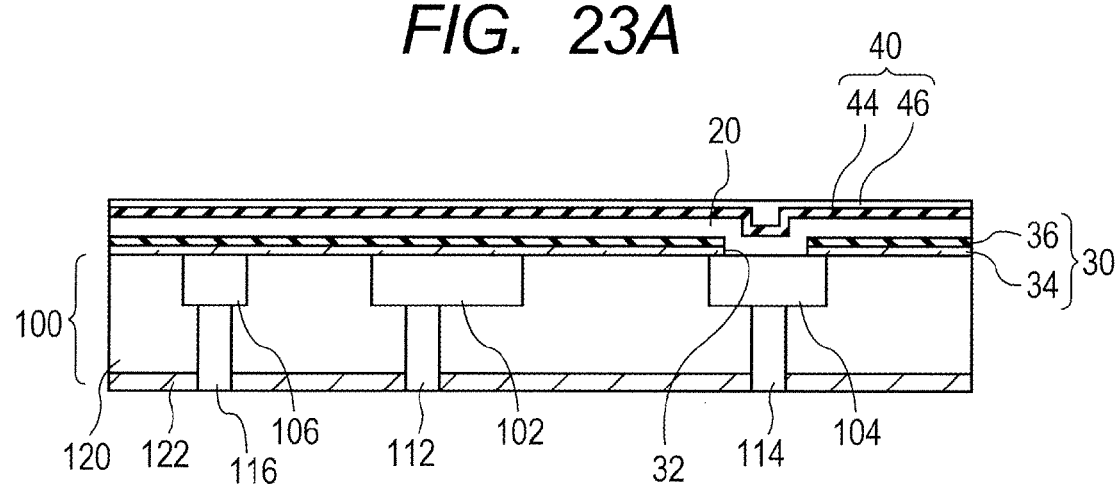
FIGS. 23A and 23B are each a cross-sectional view showing a manufacturing method of the semiconductor device shown in FIG. 22.
Figure 23B:
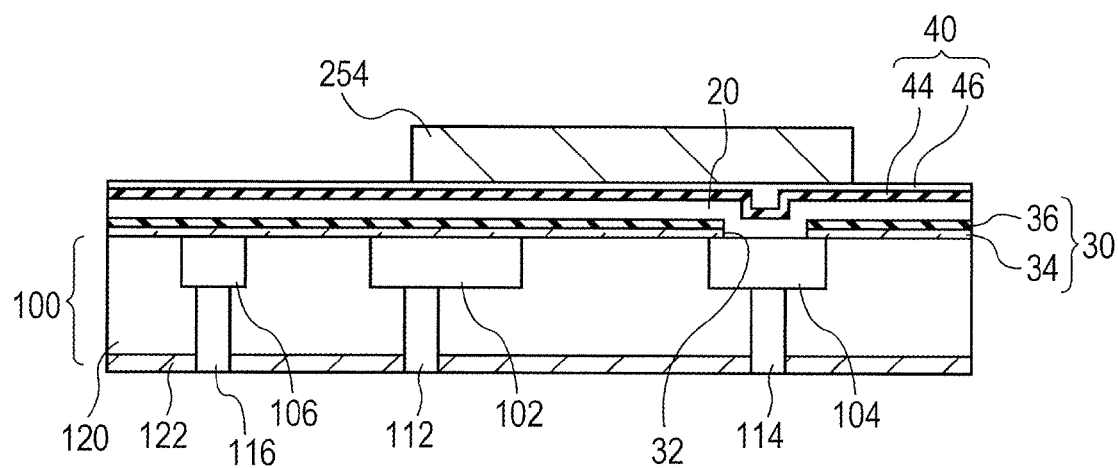

Then, a description will be given to a method for manufacturing the semiconductor device 308 in accordance with the present embodiment. FIGS. 23A and 23B to 25A and 25B, and 63A and 63B are each a cross-sectional view showing a method for manufacturing the semiconductor device 308 shown in FIG. 22. First, through the same manufacturing steps of the fourth embodiment shown in FIGS. 16A and 16B to 18A and 18B, the structure shown in FIG. 18B is obtained. Then, as shown in FIG. 23A, the gate electrode 20 is formed over the insulation film 30 and in the opening 32. Then, the insulation film 40 is formed over the gate electrode 20. The insulation film 40 is formed of the lower layer insulation film 44, and the upper layer insulation film 46 stacked over lower layer insulation film 44. Then, as shown in FIG. 23B, the resist film 254 is formed. The resist film 254 is formed by exposing to light and developing the resist film disposed over the insulation film 40.

Figure 24A:
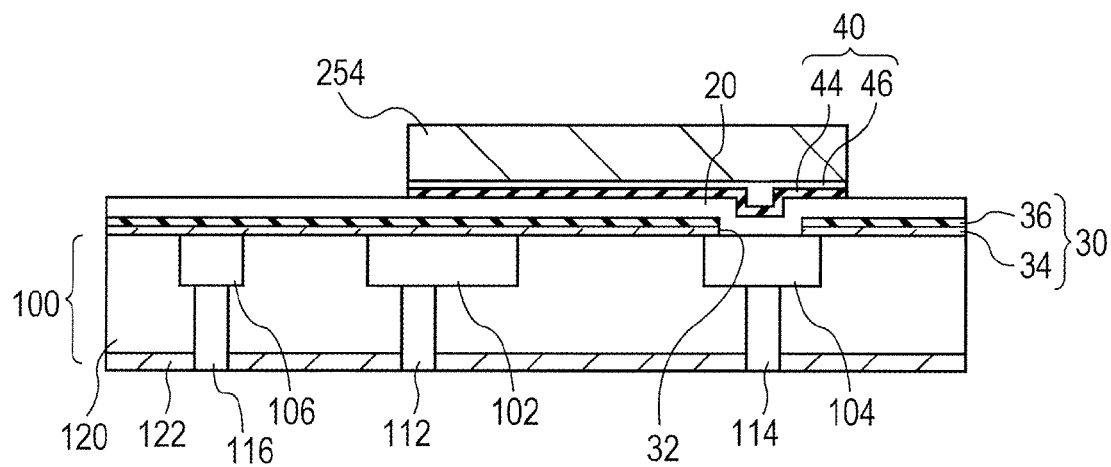
FIGS. 24A and 24B are each a cross-sectional view showing a manufacturing method of the semiconductor device shown in FIG. 22.
Figure 24B:
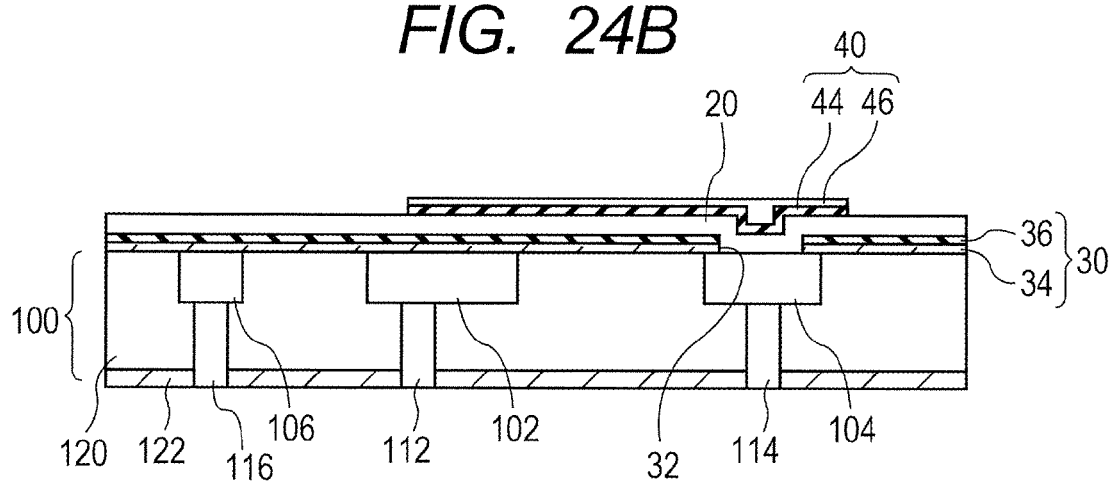

Then, as shown in FIG. 24A, by dry etching using the resist film 254 as a mask, or the like, the lower layer insulation film 44 and the upper layer insulation film 46 are selectively removed. As a result, the insulation film 40 is processed into a prescribed shape. Then, as shown in FIG. 24B, the resist film 254 is removed. The resist film 254 is removed by a method such as ashing.

Figure 63A:
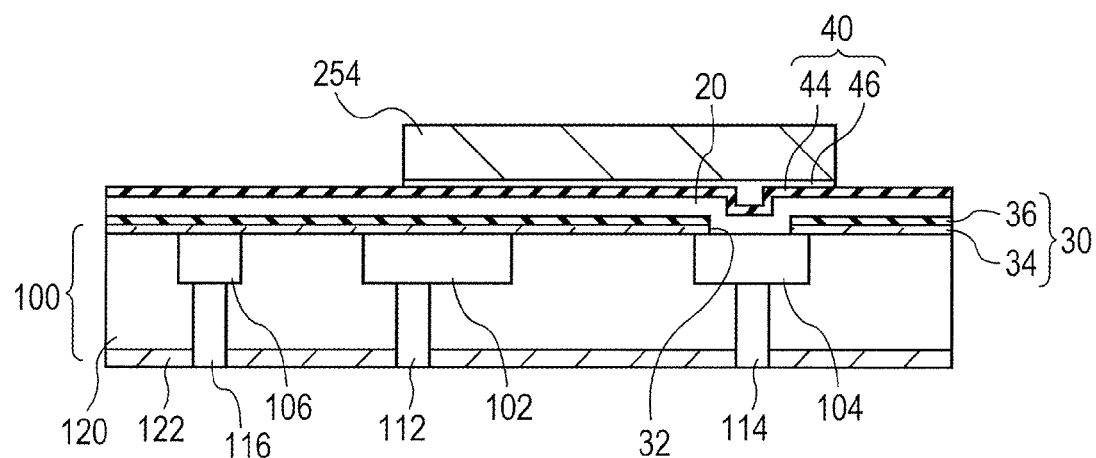
FIGS. 63A and 63B are each a cross-sectional view showing a manufacturing method of the semiconductor device shown in FIG. 22.
Figure 63B:
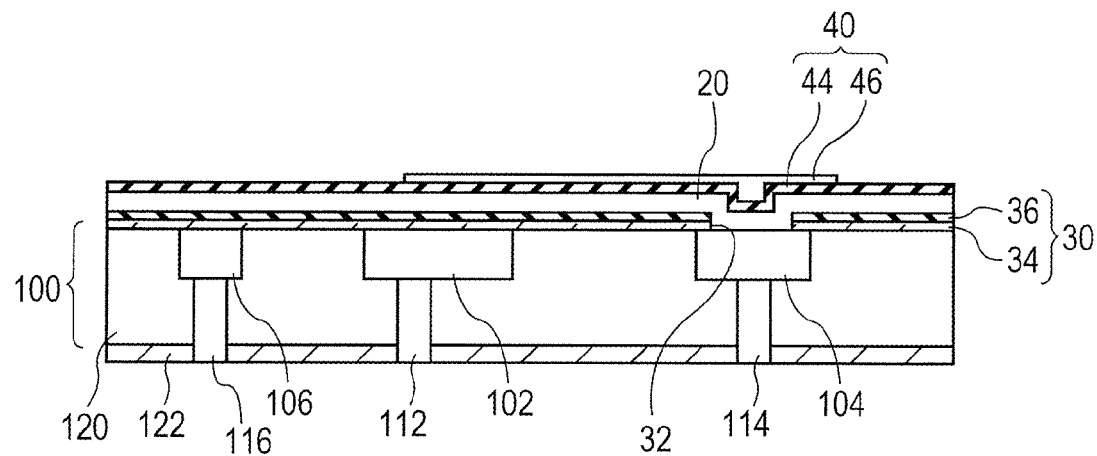

Incidentally, the insulation film 40 may be processed, for example, in the following manner. After the step shown in FIG. 23B, as shown in FIG. 63A, by dry etching using the resist film 254 as a mask, or the like, the upper layer insulation film 46 is selectively removed. As a result, the upper layer insulation film 46 is processed into a prescribed shape. Then, as shown in FIG. 63B, the resist film 254 is removed. The resist film 254 is removed by a method such as ashing. Then, by dry etching using the upper layer insulation film 44 as a mask, or the like, the lower layer insulation film 46 is selectively removed. As a result, as shown in FIG. 24B, the insulation film 40 is processed into a prescribed shape.

Then, as shown in FIG. 25A, by dry etching using the insulation film 40 as a mask, or the like, the insulation film 30 and the gate electrode 20 are selectively removed. As a result, the insulation film 30 and the gate electrode 20 are each processed into a prescribed shape. Then, as shown in FIG. 25B, the gate insulation film 22 and the semiconductor layer 24 are formed over the side surfaces of the insulation film 30, the gate electrode 20, and the insulation film 40. Incidentally, the gate insulation film 22 and the semiconductor layer 24 can be formed in the same manner as in the first embodiment. Then, as with the first embodiment, the wiring layer 200 is formed. Then, for example, another wiring layer is formed over the wiring layer 200, resulting in the semiconductor device 308 in accordance with the present embodiment.

Also in the present embodiment, it is possible to obtain the same effects as those of the fourth embodiment. Further, in accordance with the present embodiment, using the resist film 254, the upper layer insulation film 46 is etched, and the resist film 254 is removed by ashing. Then, using the patterned upper layer insulation film 46 as a mask, the lower layer insulation film 44 can be etched. As a result, even when the gate electrode 20 is formed of a material undesirable for being directly subjected to ashing, it is possible to process the insulation film 40 without exposing the gate electrode 20 to the ashing environment. This results in more choices for the materials to be used for the gate electrode 20.

Figure 26:
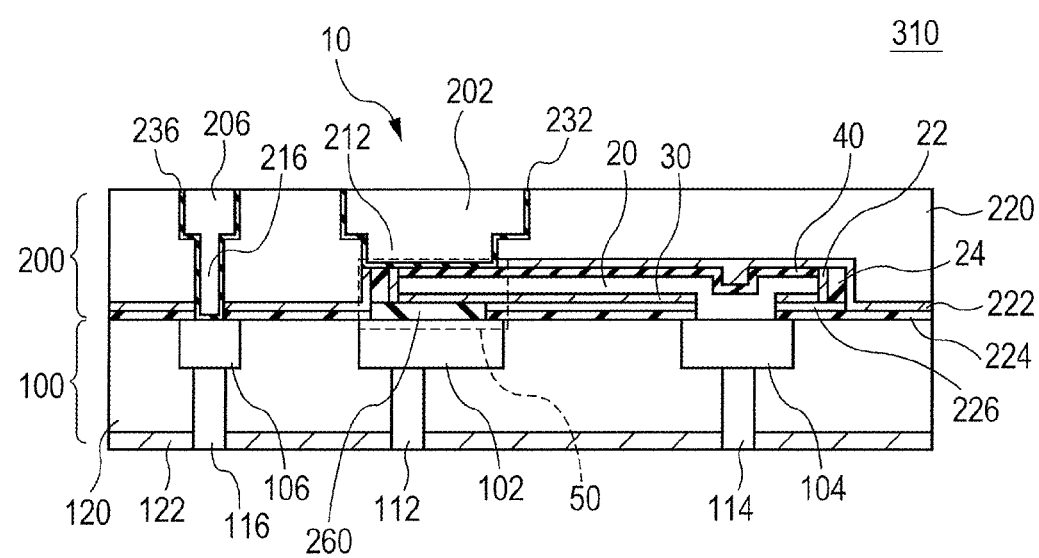
FIG. 26 is a cross-sectional view showing a manufacturing method of a semiconductor device in accordance with a sixth embodiment.

FIG. 26 is a cross-sectional view showing a semiconductor device 310 in accordance with a sixth embodiment, and corresponds to FIG. 1 in accordance with the first embodiment. The semiconductor device 310 in accordance with the present embodiment includes a conductive film 260. Further, the semiconductor device 310 includes an insulation film 224 and an insulation film 226 disposed over the wiring layer 100. Except for these points, the semiconductor device 310 has the same configuration as that of the semiconductor device 300 in accordance with the first embodiment.

As shown in FIG. 26, the semiconductor device 310 includes the conductive film 260. The conductive film 260 is disposed over the wire 102. Accordingly, the wire 102 is coupled with the semiconductor layer 24 via the conductive film 260. The conductive film 260 is disposed, for example, in such a manner as to be arranged inside the wire 102 in plan view. The conductive film 260 is formed of, for example, Ti, Ta, W, Al, TiN, TaN, or WN, a compound including Co or W, or a material obtained by introducing at least one of C and O to any of them. The conductive film 260 may be a single layer formed of any of the materials, or may be a lamination of two or more layers. The film thickness of the conductive film 260 is, for example, 10 to 50 nm.

The insulation film 224 is formed over the wiring layer 100. The insulation film 224 is formed over the entire surface of the wiring layer 100 except for the region including the via formed therein, and the region including the conductive film 260 formed therein. As the material for the insulation film 224, there can be selected the one functioning as an etching stopper film for patterning the insulation film 226 by etching as described later. The insulation film 224 is formed of, for example, a silicon nitride film. Further, the insulation film 226 is formed over the insulation film 224. The insulation film 226 is formed in the region overlapping the gate electrode 20, the gate insulation film 22, and the semiconductor layer 24 in plan view except for the region including the conductive film 260 formed therein, and the region including the opening 32 formed therein. The insulation film 226 is formed of, for example a silicon oxide film. In the present embodiment, the insulation film 30 is formed over the insulation film 226. Whereas, the diffusion preventive film 222 is formed over the insulation film 224 in such a manner as to cover the insulation film 30, the gate electrode 20, the insulation film 40, the gate insulation film 22, and the semiconductor layer 24.

Figure 27A:
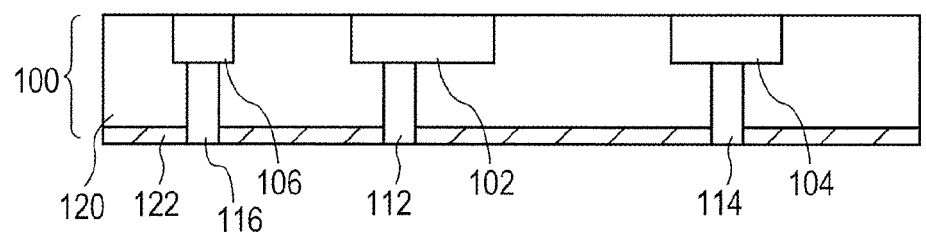
FIGS. 27A and 27B are each a cross-sectional view showing a manufacturing method of the semiconductor device shown in FIG. 26.
Figure 27B:
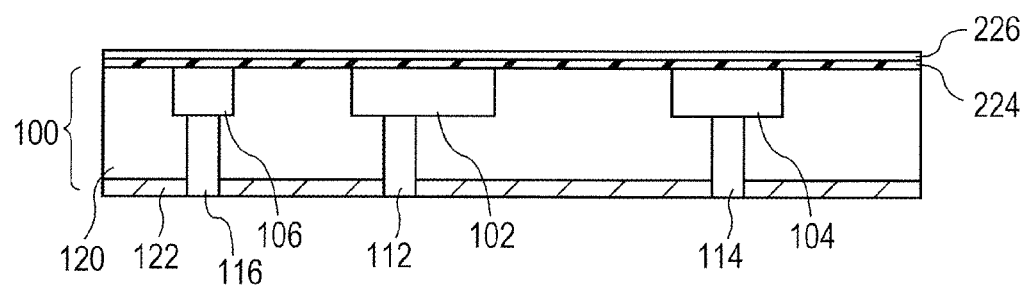

Then, a description will be given to a method for manufacturing the semiconductor device 310 in accordance with the present embodiment. FIGS. 27A and 27B to 33A and 33B are each a cross-sectional view showing a method for manufacturing the semiconductor device 310 in accordance with the present embodiment. First, as shown in FIG. 27A, the wiring layer 100 is formed. The wiring layer 100 forms a part of the multilayer wiring layer disposed over the substrate 60. Incidentally, the wiring layer 100 can be formed in the same manner as with the first embodiment. Then, as shown in FIG. 27B, an insulation film 224 is formed over the wiring layer 100. Then, the insulation film 226 is formed over the insulation film 224.

Figure 28A:
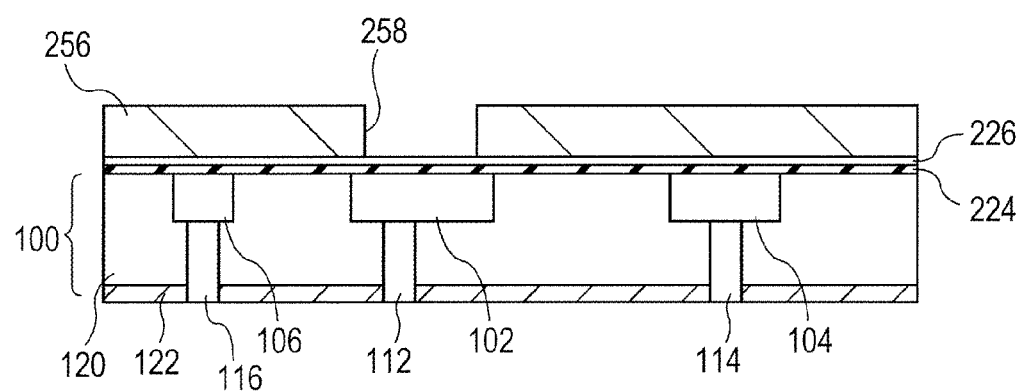
FIGS. 28A and 28B are each a cross-sectional view showing a manufacturing method of the semiconductor device shown in FIG. 26.
Figure 28B:
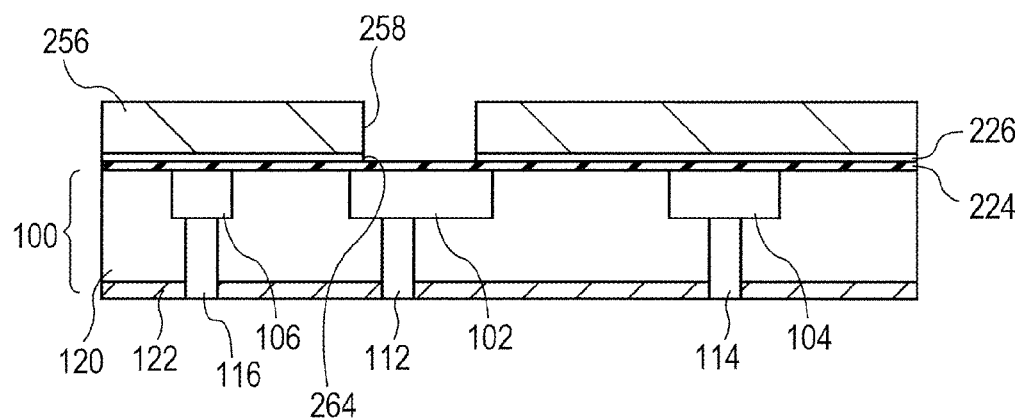

Then, as shown in FIG. 28A, the resist film 256 is formed over the insulation film 226. Then, resist film 256 is exposed to light, and is developed, so that an opening 258 arranged over the wire 102 in plan view is formed in the resist film 256. Incidentally, the opening 258 is disposed in such a manner as to be arranged inside the wire 102 in plan view. Then, as shown in FIG. 28B, by dry etching using the resist film 256 as a mask, or the like, the portion of the insulation film 226 arranged under the opening 258 is selectively removed. As a result, an opening 264 is formed in the insulation film 226. In the etching step, the insulation film 224 functions as an etching stopper film. Therefore, the insulation film 224 is left under the opening 256.

Figure 29A:
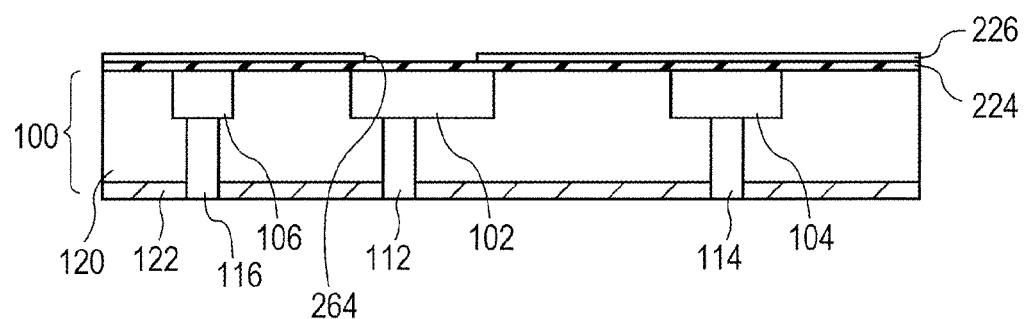
FIGS. 29A and 29B are each a cross-sectional view showing a manufacturing method of the semiconductor device shown in FIG. 26.
Figure 29B:
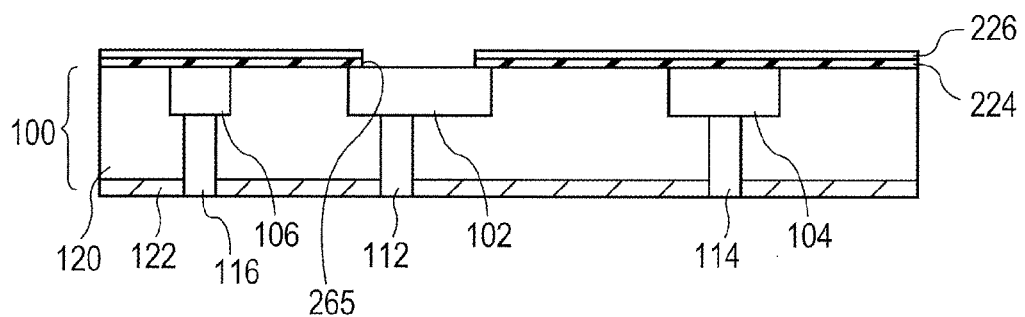

Then, as shown in FIG. 29A, the resist film 256 is removed. The resist film 256 is removed by a method such as ashing. In the ashing treatment, the wire 102 is covered with the insulation film 224, and is not exposed. Therefore, it is possible to inhibit the wire 102 from being subjected to ashing and from being deteriorated. Then, as shown in FIG. 29B, by dry etching using the insulation film 226 as a mask, or the like, the insulation film 224 arranged under the opening 264 is selectively removed. This results in the formation of the opening 265 penetrating through the insulation film 224 and the insulation film 226. At this step, the wire 102 is exposed above the insulation film 226 via the opening 265.

Figure 30A:
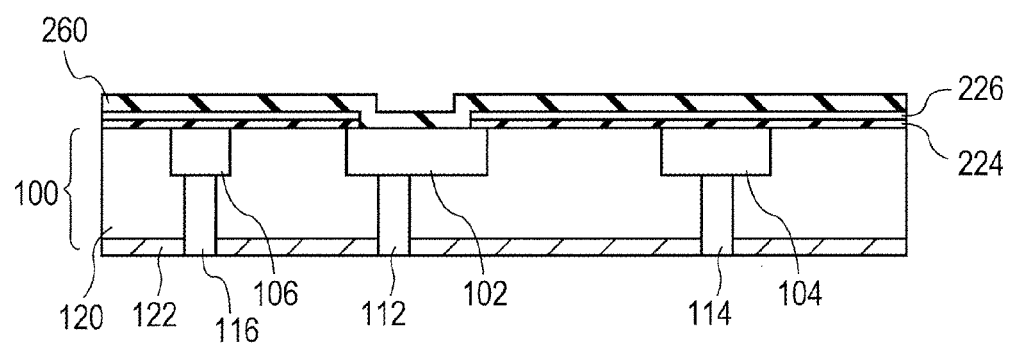
FIGS. 30A and 30B are each a cross-sectional view showing a manufacturing method of the semiconductor device shown in FIG. 26.
Figure 30B:
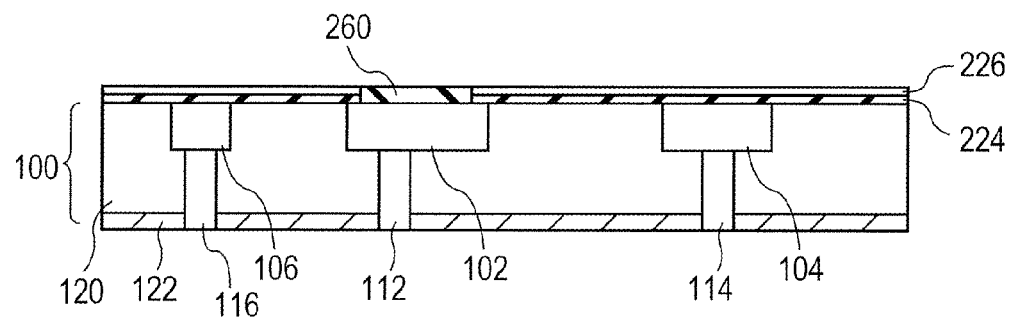

Then, as shown in FIG. 30A, the conductive film 260 is formed over the insulation film 226, and in the opening 265. Then, as shown in FIG. 30B, by, for example, CMP (Chemical Mechanical Polishing), the conductive film 260 is planarized. As a result, the conductive film 260 over the insulation film 226 is removed, and the conductive film 260 in the opening 265 is left.

Figure 31A:
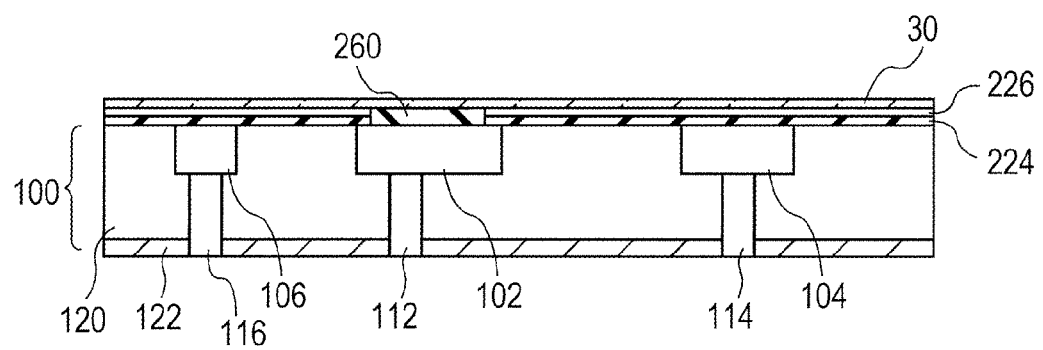
FIGS. 31A and 31B are each a cross-sectional view showing a manufacturing method of the semiconductor device shown in FIG. 26.
Figure 31B:
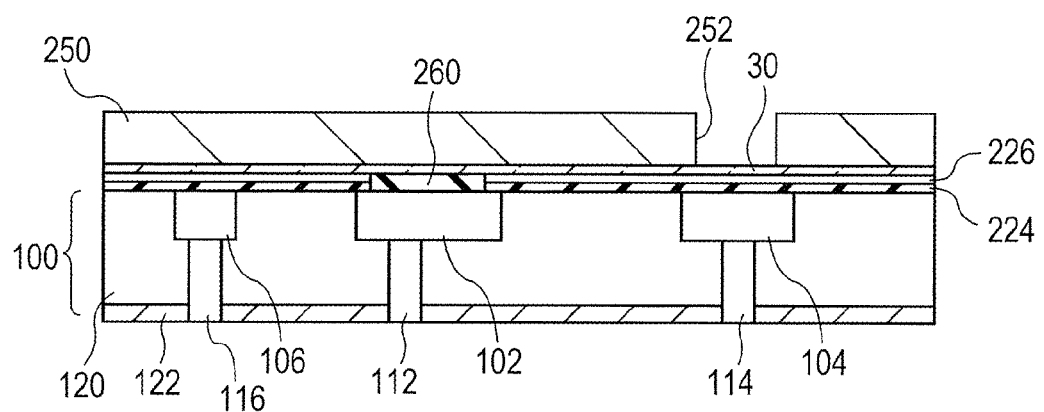

Then, as shown in FIG. 31A, the insulation film 30 is formed over the insulation film 226, and over the conductive film 260. Then, as shown in FIG. 31B, the resist film 250 is formed over the insulation film 30. Then, the resist film 250 is exposed to light, and is developed, so that the opening 252 arranged over the wire 104 in plan view is formed in the resist film 250. Incidentally, the opening 252 is disposed in such a manner as to be arranged inside the wire 104 in plan view.

Figure 32A:
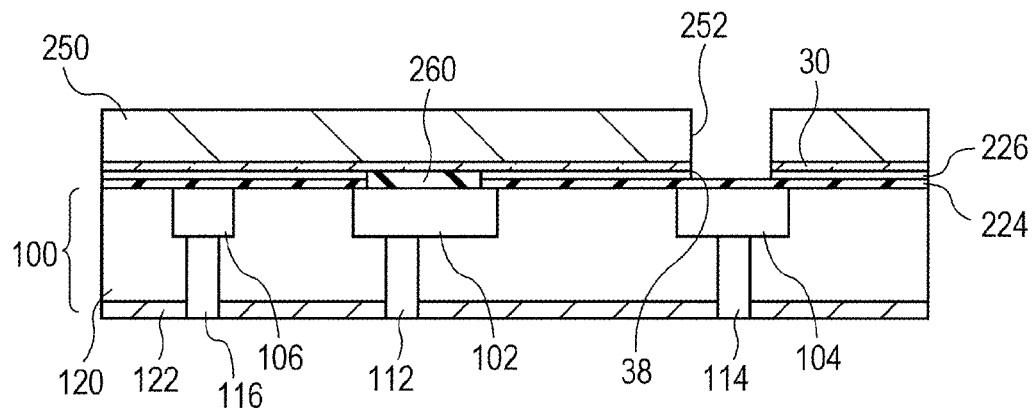
FIGS. 32A and 32B are each a cross-sectional view showing a manufacturing method of the semiconductor device shown in FIG. 26.
Figure 32B:
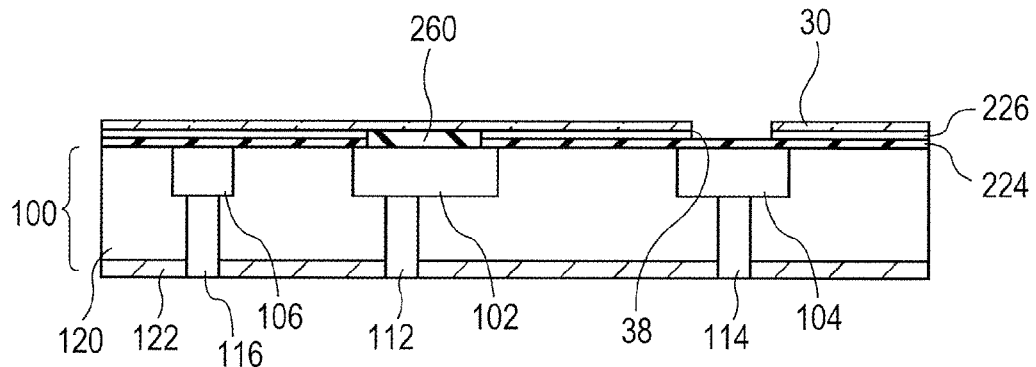

Then, as shown in FIG. 32A, by dry etching using the resist film 250 as a mask, or the like, the portion of the insulation film 30 arranged under the opening 30 is selectively removed. As a result, the opening 38 is formed in the insulation film 30. As shown in FIG. 32A, by the etching step, the insulation film 226 arranged under the opening 252 is also selectively removed. Incidentally, the insulation film 226 may be left under the opening 252 after the etching step. Then, as shown in FIG. 32B, the resist film 250 is removed. The resist film 250 is removed by a method such as ashing. In the ashing treatment, the wire 104 is covered with the insulation film 224, and is not exposed. Therefore, it is possible to inhibit the wire 104 from being subjected to ashing and from being deteriorated.

Figure 33A:
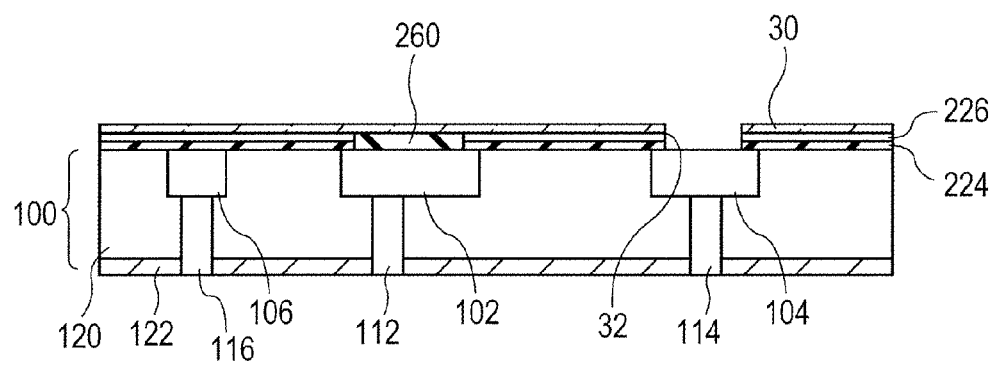
FIGS. 33A and 33B are each a cross-sectional view showing a manufacturing method of the semiconductor device shown in FIG. 26.

Then, as shown in FIG. 33A, by dry etching using the insulation film 30 as a mask, or the like, the insulation film 224 arranged under the opening 38 is selectively removed. This results in the formation of the opening 32 penetrating through the insulation film 224, the insulation film 226, and the insulation film 30. At this step, the wire 104 is exposed above the insulation film 30 via the opening 32.

Figure 33B:
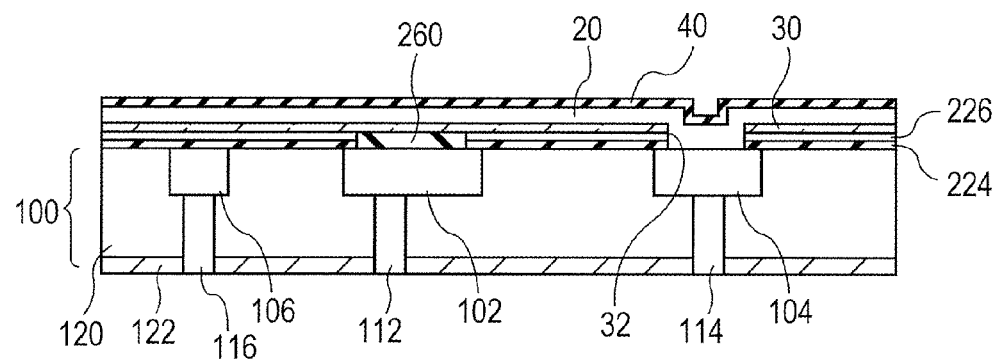
Figure 34A:
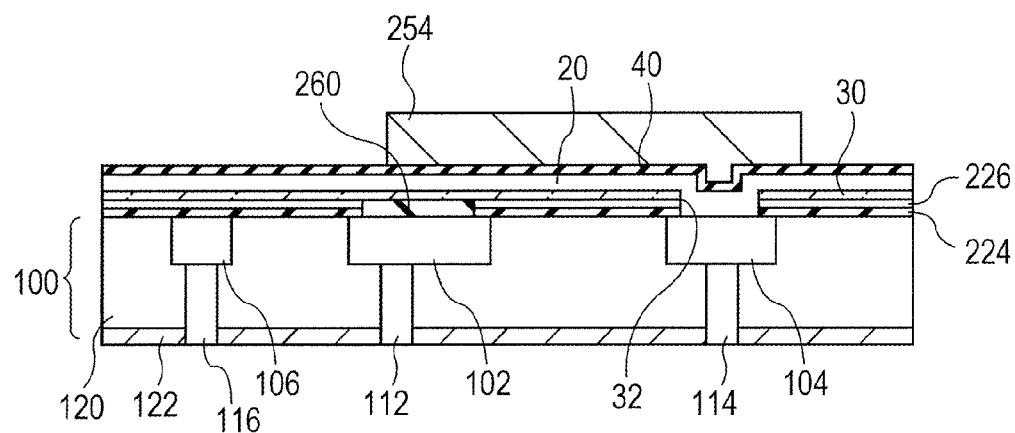
FIGS. 34A and 34B are each a cross-sectional view showing a manufacturing method of the semiconductor device shown in FIG. 26.
Figure 34B:
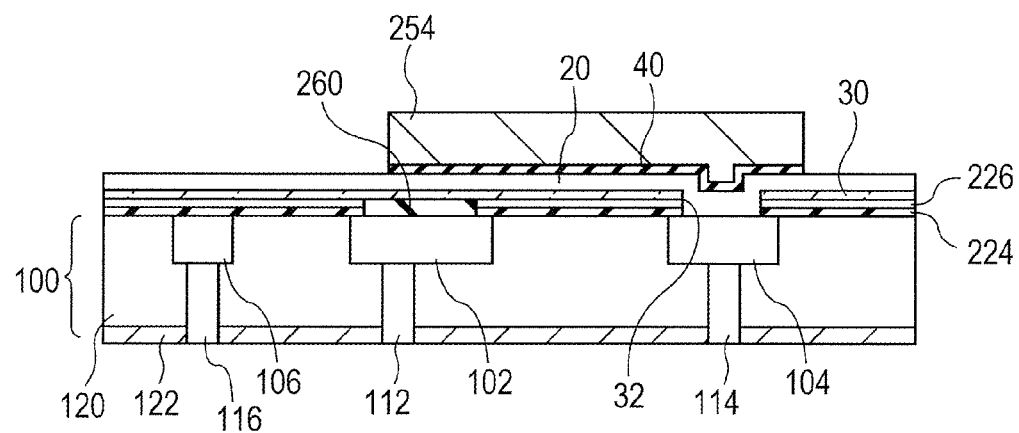
Figure 35A:
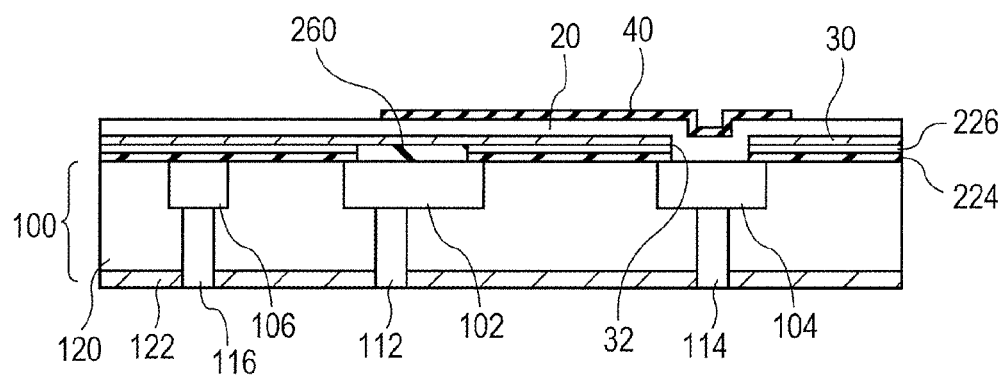
FIGS. 35A and 35B are each a cross-sectional view showing a manufacturing method of the semiconductor device shown in FIG. 26.
Figure 35B:
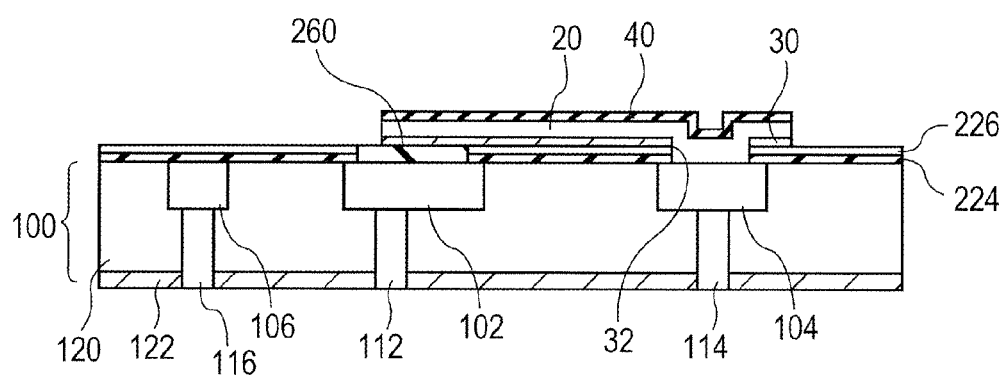

Then, as shown in FIG. 33B, the gate electrode 20 is formed over the insulation film 30 and in the opening 32. Then, the insulation film 40 is formed over the gate electrode 20. Then, as shown in FIG. 34A, the resist film 254 is formed. Then, as shown in FIG. 34B, by dry etching using the resist film 254 as a mask, or the like, the insulation film 40 is selectively removed. Then, as shown in FIG. 35A, the resist film 254 is removed by a method such as ashing. Then, as shown in FIG. 35A, by dry etching using the insulation film 40 as a mask, or the like, the gate electrode 20 is selectively removed. At this step, the gate electrode 20 is processed so that a part of the end of the gate electrode 20 overlaps the conductive film 260 in plan view. These steps can be performed in the same manner as with the manufacturing steps of the fourth embodiment shown in FIGS. 19A and 19B, 21A and 21B, and 22A.

Figure 36:
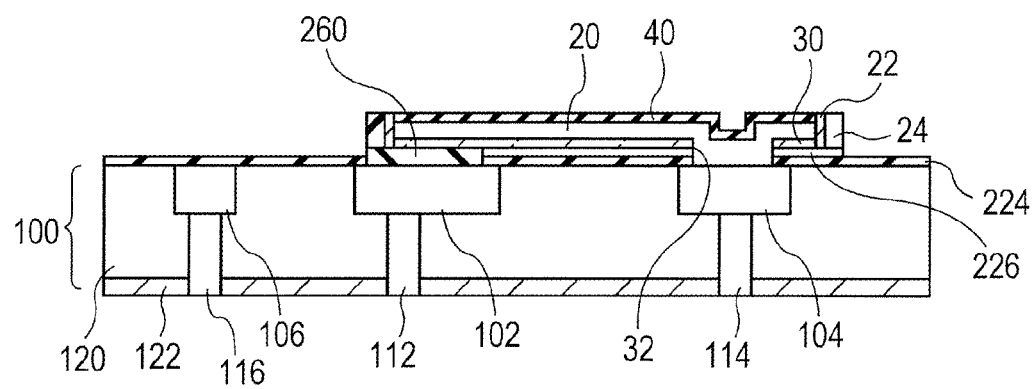
FIG. 36 is a cross-sectional view showing a manufacturing method of the semiconductor device shown in FIG. 26.

Then, as shown in FIG. 36, the gate insulation film 22 and the semiconductor layer 24 are successively formed over the side surfaces of the insulation film 30, the gate electrode 20, and the insulation film 40. The steps can be performed in the same manner as with the manufacturing steps of the first embodiment shown in FIGS. 9B, 10A and 10B, and 11A. In the present embodiment, in the step of entirely etching back the gate insulation film 22 and the semiconductor layer 24, the wire 102 is covered with the conductive film 260, and is not exposed. This can suppress the formation of the etching product resulting from exposure of the wire 102 to etching. Incidentally, in the step of entirely etching back the gate insulation film 22 and the semiconductor layer 24, the insulation film 226 arranged in the region not overlapping the gate electrode 20, the gate insulation film 22, and the semiconductor layer 24 in plan view is also removed similarly.

Then, the diffusion preventive film 222 and the interlayer insulation film 220 are formed. Then, respective wires and vias are formed in the diffusion preventive film 222 and the interlayer insulation film 220. This results in the wiring layer 200. These steps can be performed in the same manner as the manufacturing steps of the first embodiment shown in FIGS. 11B, and 12A and 12B. Thereafter, for example, over the wiring layer 200, other wiring layers are formed, resulting in the semiconductor device 310 in accordance with the present embodiment.

Then, the effects of the present embodiment will be described. The wire 102 is exposed to etching, resulting in the formation of etching products around the wire 102. This becomes particularly remarkable in the case of, for example, a copper wire. When the etching products resulting from the wire 102 are deposited around the gate electrode 20, a malfunction of the transistor 10, and the like are caused. In accordance with the present embodiment, in the step of entirely etching back the gate insulation film 22 and the semiconductor layer 24, the wire 102 is not exposed to etching. For this reason, it is possible to suppress the formation of etching products from the wire 102 in the etching back step. Therefore, it is possible to prevent the occurrence of a malfunction of the transistor, and the like for improving the reliability of the semiconductor device.

Further, in accordance with the present embodiment, the wire 102 is coupled with the semiconductor layer 24 via the conductive film 260 formed of a different material from that for the wire 102. For this reason, it is possible to suppress the diffusion of copper which is the material forming the wire 102 into the semiconductor layer 24.

Further, in accordance with the present embodiment, it is possible to obtain the same effects as those of the first embodiment.

Figure 37:
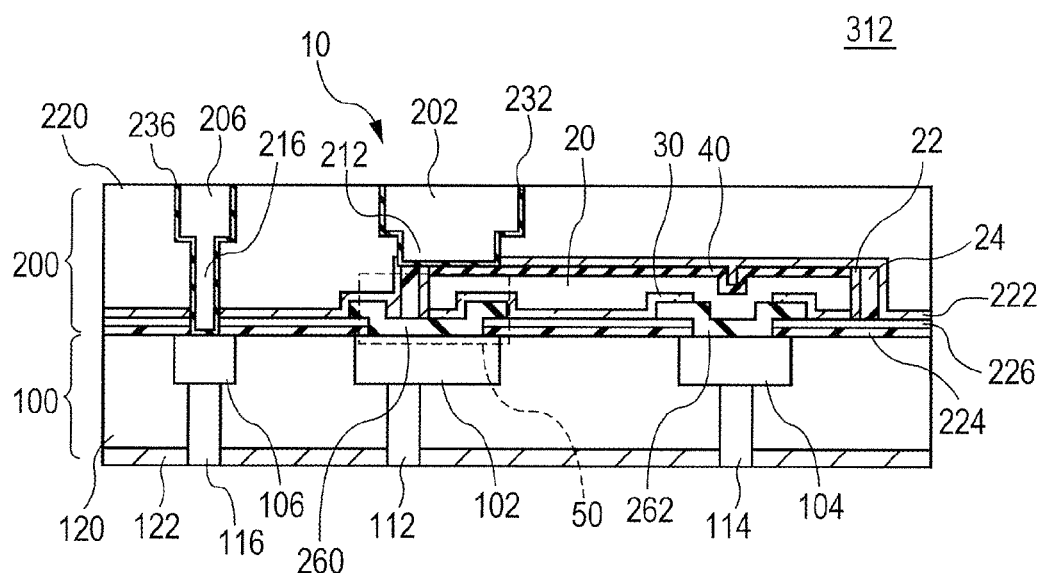
FIG. 37 is a cross-sectional view showing a semiconductor device in accordance with a seventh embodiment.

FIG. 37 is a cross-sectional view showing a semiconductor device 312 in accordance with a seventh embodiment, and corresponds to FIG. 26 in the sixth embodiment. The semiconductor device 312 in accordance with the present embodiment includes a conductive film 262. Except for this point, the semiconductor device 312 in accordance with the present embodiment has the same configuration as that of the semiconductor device 310 in accordance with the sixth embodiment.

As shown in FIG. 37, the semiconductor device 312 includes the conductive film 262. The conductive film 262 is disposed over the wire 104. Accordingly, the wire 104 is coupled with the gate electrode 20 via the conductive film 262. The conductive film 262 is formed of a different material from that for the wire 104. The conductive film 262 is formed in the same step as that for the conductive film 260. For this reason, the conductive film 262 is formed of the same material as that for the conductive film 260. The conductive film 260 and the conductive film 262 are each formed of, for example, Ti, Ta, W, Al, TiN, TaN, or WN, a compound including Co or W, or a material obtained by introducing at least one of C and O to any of them. The conductive film 260 and the conductive film 262 may be a single layer formed of any of the materials, or may be a lamination of two or more layers. Each film thickness of the conductive film 260 and the conductive film 262 is, for example, 10 to 50 nm. In the present embodiment, the conductive film 260 and the conductive film 262 are formed by patterning the conductive film 270 disposed over the insulation film 226 by dry etching or the like as described later.

Then, a description will be given to a method for manufacturing the semiconductor device 312 in accordance with the present embodiment. FIGS. 38A and 38B to 43A and 43B are each a cross-sectional view showing a method for manufacturing the semiconductor device 312 in accordance with the present embodiment. First, the wiring layer 100 is formed. Then, over the wiring layer 100, there are formed the insulation film 224 and the insulation film 226. These steps can be performed in the same manner as the manufacturing steps of the sixth embodiment shown in FIGS. 27A and 27B. Then, the openings 265 arranged over the wire 102 and over the wire 104 are formed in the insulation film 224 and the insulation film 226. The openings 265 can be formed in the same manner as with the manufacturing step of the sixth embodiment shown in FIGS. 28A and 28B and 29A and 29B. As a result, the structure shown in FIG. 38A can be obtained.

Figure 38A:
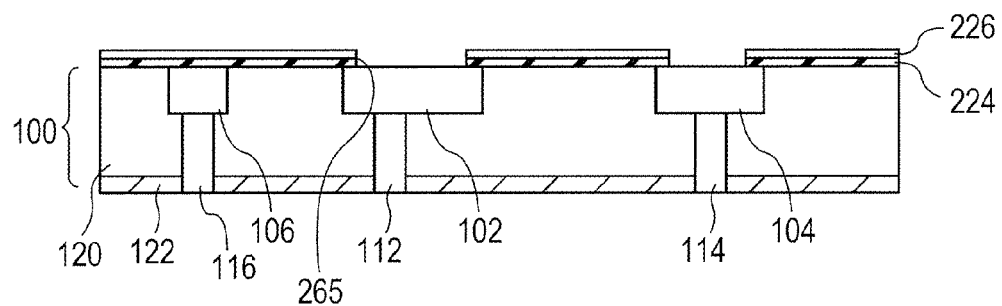
FIGS. 38A and 38B are each a cross-sectional view showing a manufacturing method of the semiconductor device shown in FIG. 37.
Figure 38B:
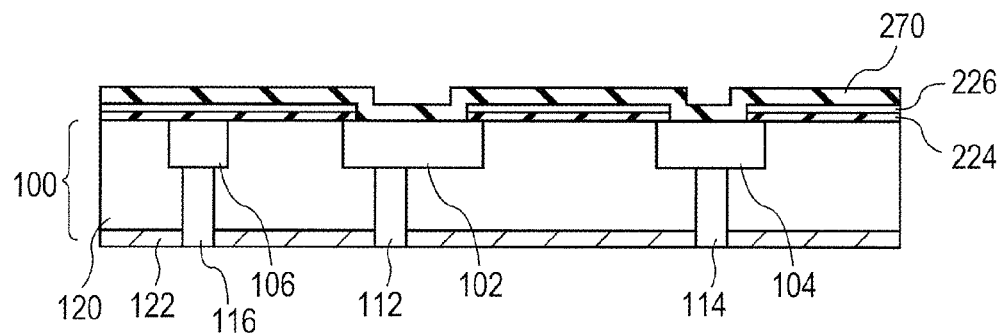
Figure 39A:
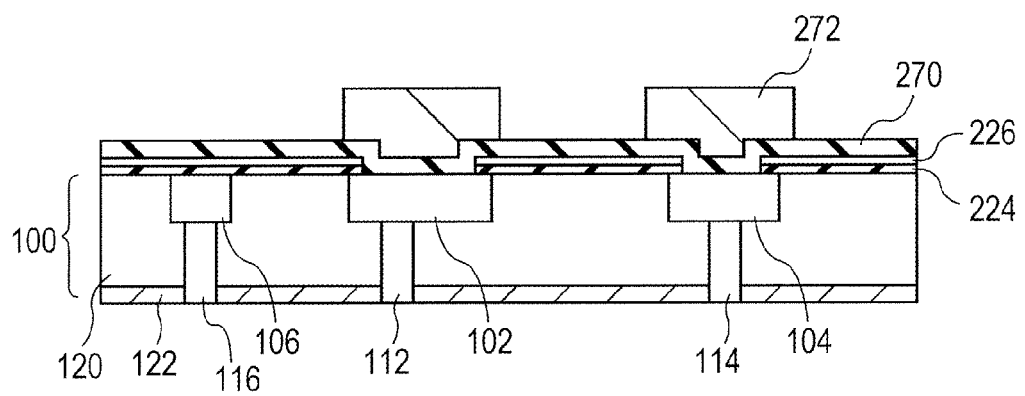
FIGS. 39A and 39B are each a cross-sectional view showing a manufacturing method of the semiconductor device shown in FIG. 37.
Figure 39B:
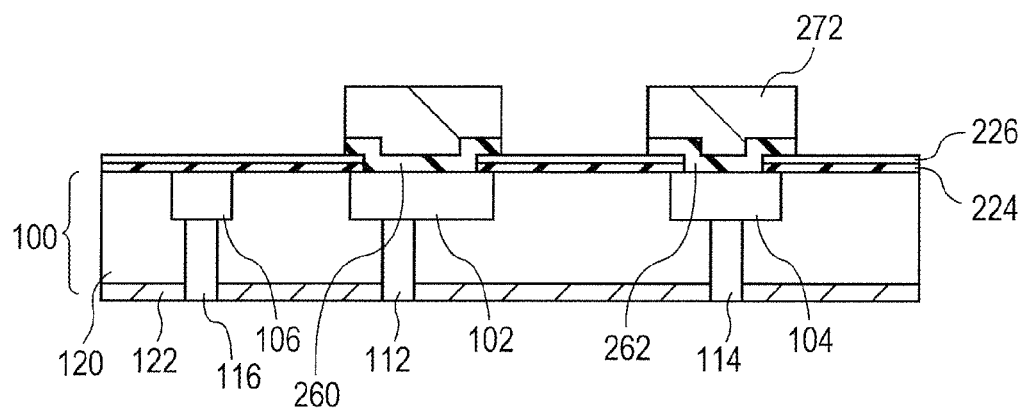

Then, as shown in FIG. 38B, a conductive film 270 is formed over the insulation film 226, and in the openings 265. The conductive film 270 is formed of the material forming the conductive film 260 and the conductive film 262. Then, as shown in FIG. 39A, a resist film 272 is formed. The resist film 272 is disposed so that the portions of the resist film 272 disposed over respective regions of a region overlapping the wire 102 in plan view and a region overlapping the wire 104 in plan view are separated from each other. The resist film 272 is formed by exposing to light and developing the resist film disposed over the conductive film 270. Then, as shown in FIG. 39B, by dry etching using the resist film 272 as a mask, or the like, the conductive film 270 is selectively removed. As a result, the conductive film 260 is formed over the wire 102, and the conductive film 262 is formed over the wire 104.

Figure 40A:
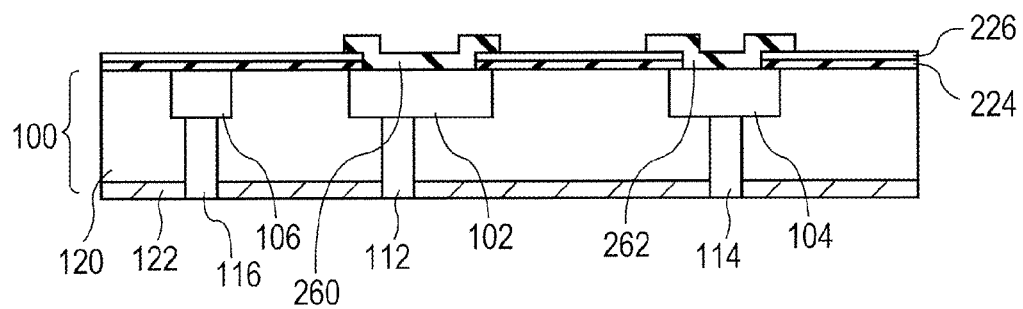
FIGS. 40A and 40B are each a cross-sectional view showing a manufacturing method of the semiconductor device shown in FIG. 37.
Figure 40B:
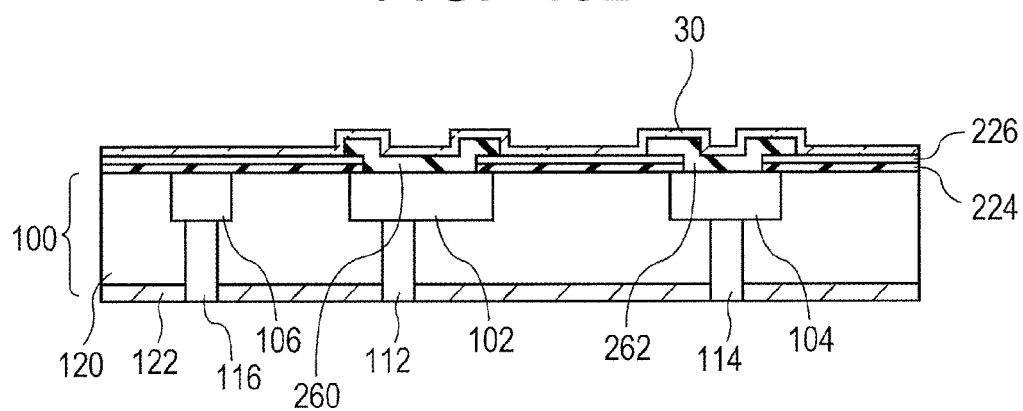

Then, as shown in FIG. 40A, the resist film 272 is removed by a method such as ashing. Then, as shown in FIG. 40B, the insulation film 30 is formed over the insulation film 226. The insulation film 30 is formed in such a manner as to cover the conductive film 260 and the conductive film 262.

Figure 41A:
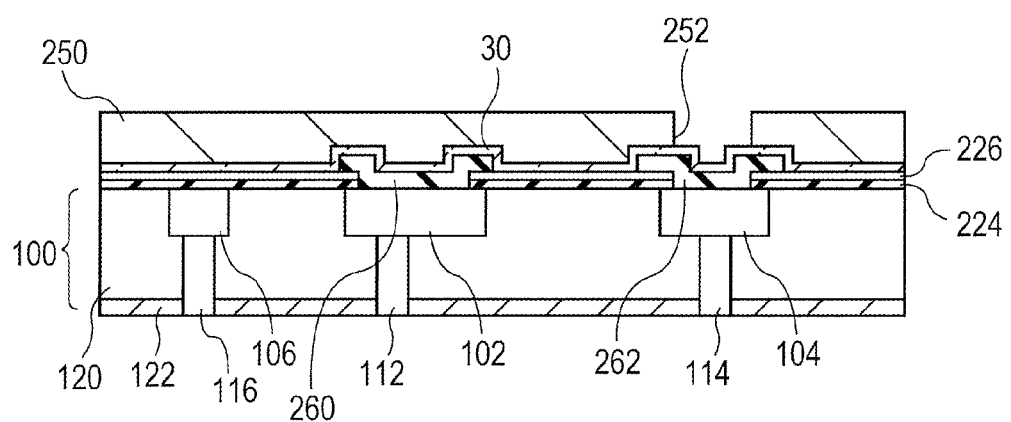
FIGS. 41A and 41B are each a cross-sectional view showing a manufacturing method of the semiconductor device shown in FIG. 37.
Figure 41B:
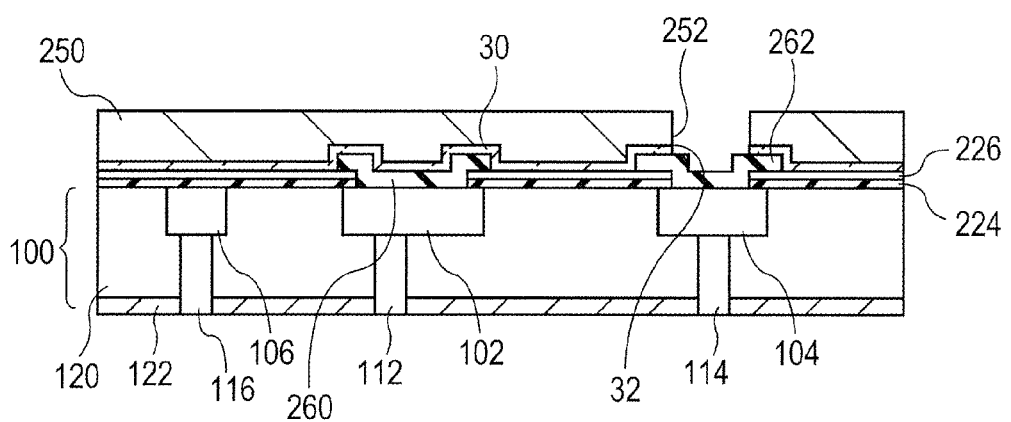

Then, as shown in FIG. 41A, the resist film 250 is formed over the insulation film 30. Then, the resist film 250 is exposed to light, and is developed, so that the opening 252 arranged over the conductive film 262 in plan view is, formed in the resist film 250. Incidentally, the opening 252 is disposed in such a manner as to be arranged inside the conductive film 262 in plan view. Then, as shown in FIG. 41B, by dry etching using the resist film 250 as a mask, or the like, the portion of the insulation film 30 arranged under the opening 252 is selectively removed. As a result, the opening 32 is formed in the insulation film 30. At this step, the conductive film 262 is exposed above the insulation film 30 via the opening 32.

Figure 42A:
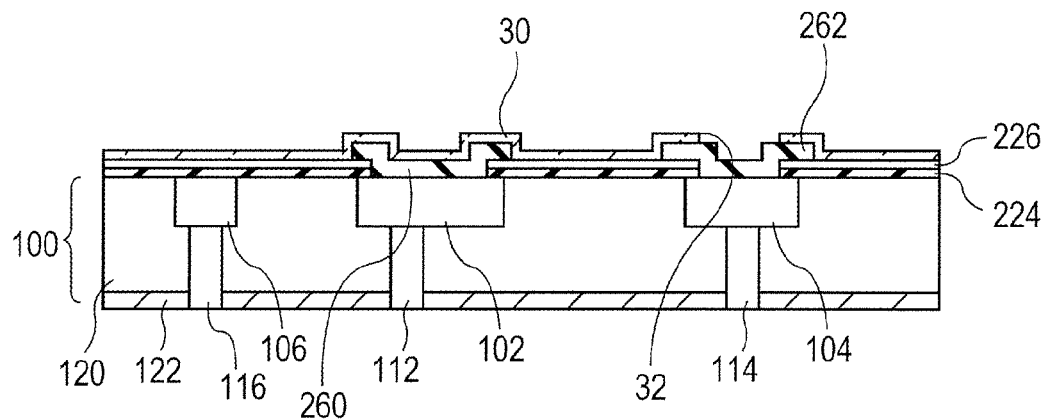
FIGS. 42A and 42B are each a cross-sectional view showing a manufacturing method of the semiconductor device shown in FIG. 37.
Figure 42B:
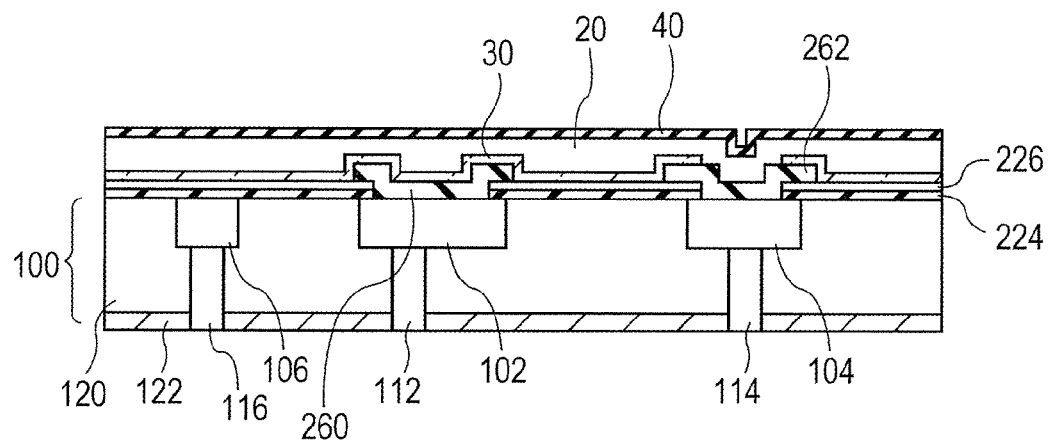

Then, as shown in FIG. 42A, the resist film 250 is removed by a method such as ashing. Then, as shown in FIG. 42B, the gate electrode 20 is formed over the insulation film 30 and in the opening 32. Then, the insulation film 40 is formed over the gate electrode 20.

Figure 43A:
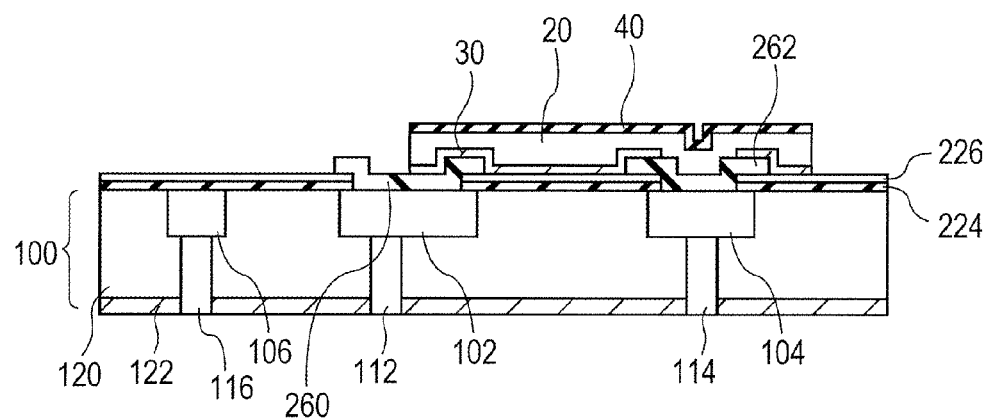
FIGS. 43A and 43B are each a cross-sectional view showing a manufacturing method of the semiconductor device shown in FIG. 37.
Figure 43B:
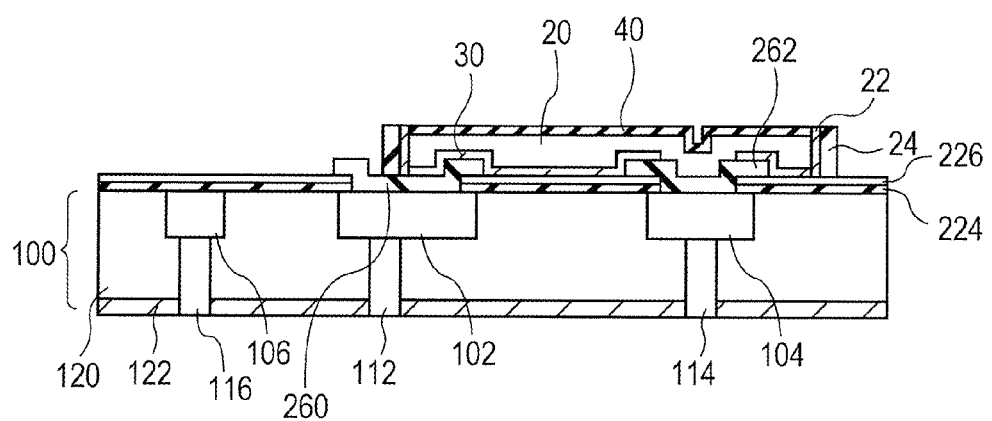

Then, as shown in FIG. 43A, the insulation film 30, the gate electrode 20, and the insulation film 40 are patterned into a prescribed shape. The patterning step can be performed in the same manner as with the manufacturing steps of the sixth embodiment shown in FIGS. 34A and 34B and 35A and 35B. Then, as shown in FIG. 43B, the gate insulation film 22 and the semiconductor layer 24 are formed over the side surfaces of the insulation film 30, the gate electrode 20, and the insulation film 40. The steps can be performed in the same manner as with the manufacturing steps of the first embodiment shown in FIGS. 9B, 10A and 10B, and 11A.

Then, there are formed the diffusion preventive film 222 and the interlayer insulation film 220. Then, respective wires and vias are formed in the diffusion preventive film 222 and the interlayer insulation film 220. This results in the wiring layer 200. The steps can be performed in the same manner as with the manufacturing steps of the first embodiment shown in FIGS. 11B and 12A and 12B. Thereafter, for example, other wiring layers are formed over the wiring layer 200, resulting in the semiconductor device 312 in accordance with the present embodiment.

Also in the present embodiment, it is possible to obtain the same effects as those of the sixth embodiment.

Figure 44:
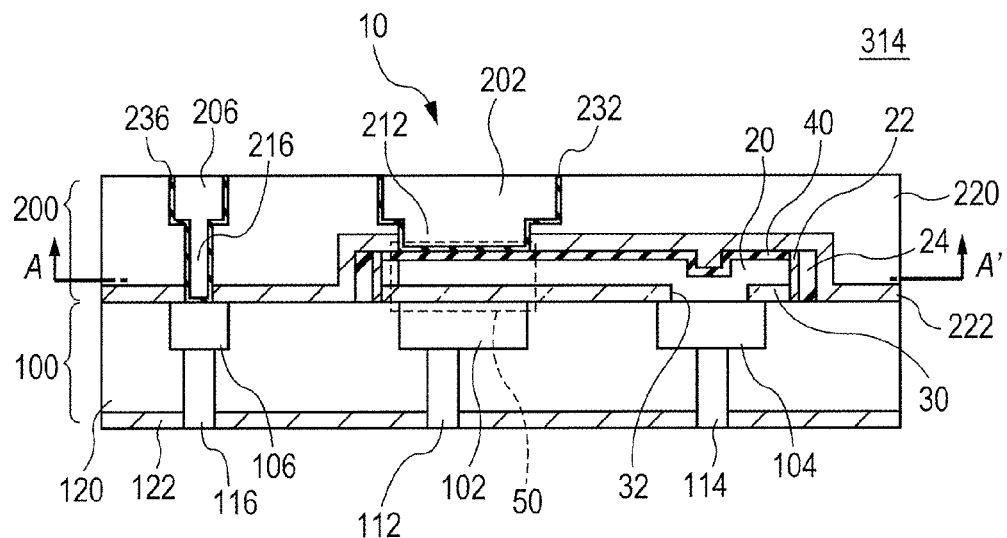
FIG. 44 is a cross-sectional view showing a semiconductor device in accordance with an eighth embodiment.
Figure 45:
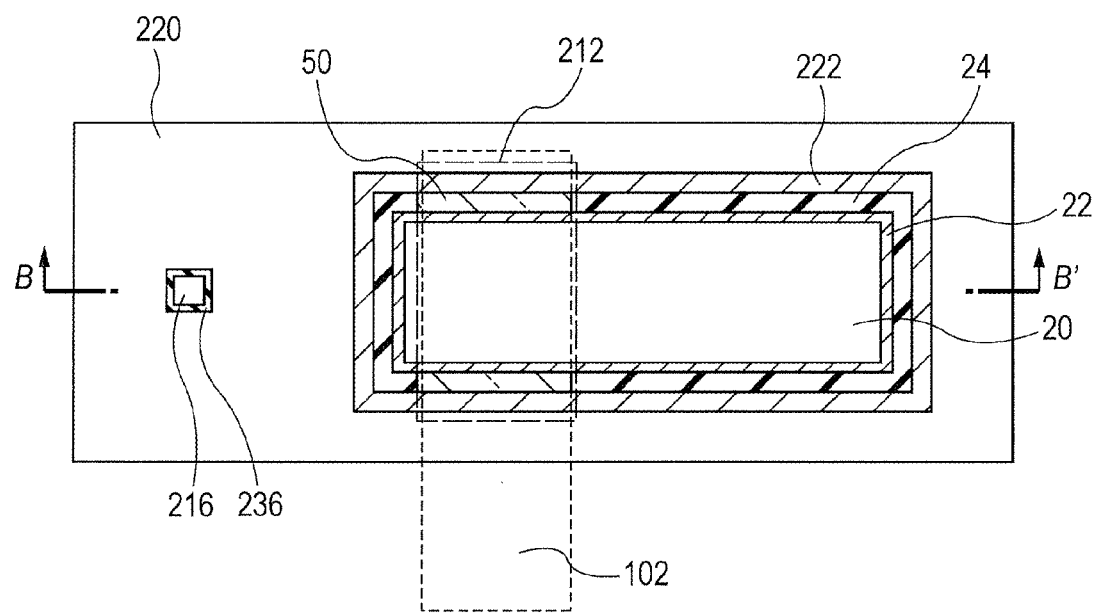
FIG. 45 is a plan view showing the semiconductor device shown in FIG. 44.

FIG. 44 is a cross-sectional view showing a semiconductor device 314 in accordance with an eighth embodiment, and corresponds to FIG. 1 in the first embodiment. FIG. 45 is a plan view showing the semiconductor device 314 shown in FIG. 44, and corresponds to FIG. 2 in the first embodiment. FIG. 44 shows a B-B' cross section in FIG. 45. FIG. 45 shows an A-A' plane in FIG. 44. The semiconductor device 314 in accordance with the present embodiment has the same configuration as that of the semiconductor device 300 in accordance with the first embodiment except for the configurations of the wire 102 and the via 212.

In the semiconductor device 314, the region of overlap between the top surface of the wire 102 and the bottom surface of the via 212 in plan view does not include one side of the gate electrode 20, and includes a part of each of two sides adjacent to the one side. In the present embodiment, the gate electrode 20 is a rectangle. As shown in FIGS. 44 and 45, the region of overlap between the top surface of the wire 102 and the bottom surface of the via 212 does not include the short side of the gate electrode 20, and includes a part of each of two long sides adjacent to the short side.

In the present embodiment, the portion of the semiconductor layer 24 disposed adjacent to the part of the gate electrode 20 included in the region of overlap between the top surface of the wire 102 and the bottom surface of the via 212 functions as the channel region 50. In the present embodiment, even when a displacement is caused in the positional relationship between the wire 102 and the via 212 and the gate electrode 20, each length of the sides of the gate electrode 20 included in the region of overlap between the top surface of the wire 102 and the bottom surface of the via 212 becomes constant. In this case, the channel width of the channel region 50 is also kept constant.

Also in the present embodiment, it is possible to obtain the same effects as those of the first embodiment. Further, in accordance with the present embodiment, the region of overlap between the top surface of the wire 102 and the bottom surface of the via 212 in plan view does not include one side of the gate electrode 20, and includes a part of each of two sides adjacent to the one side. In this case, even when a displacement is caused in the positional relationship between the wire 102 and the via 212 and the gate electrode 20 due to fluctuations in process and the like, the channel width is kept constant. For this reason, it is possible to suppress the occurrence of variations in characteristics among semiconductor elements.

Figure 46:
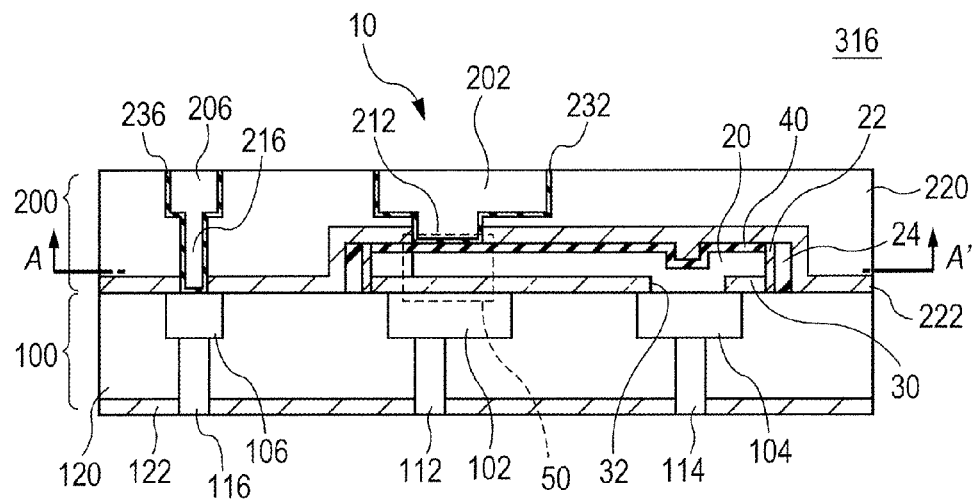
FIG. 46 is a cross-sectional view showing a semiconductor device in accordance with a ninth embodiment.
Figure 47:
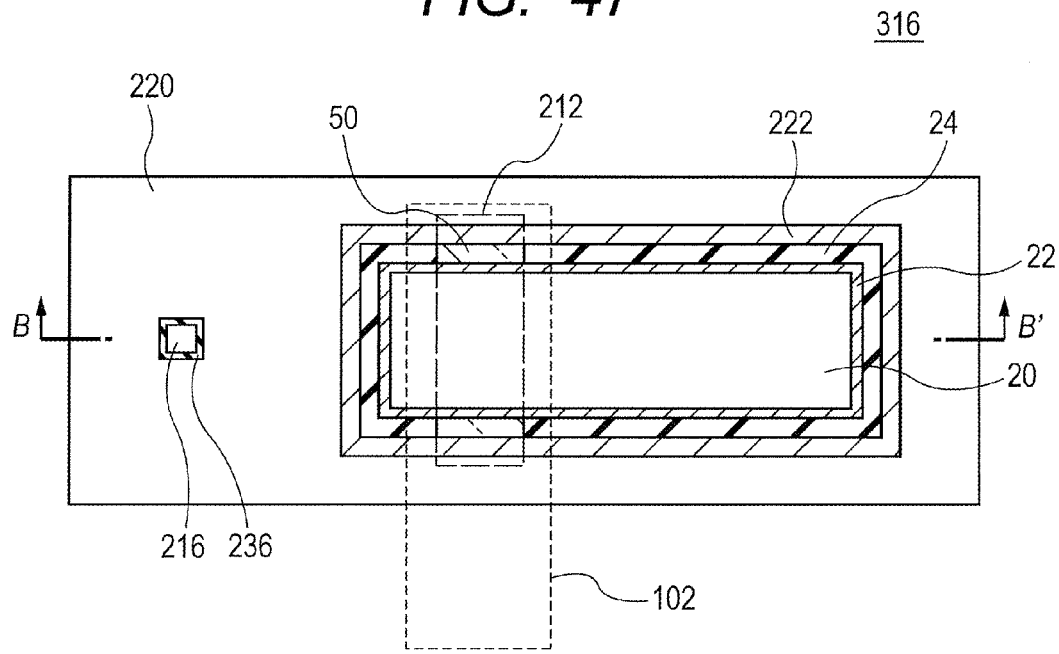
FIG. 47 is a plan view showing the semiconductor device shown in FIG. 46.

FIG. 46 is a cross-sectional view showing a semiconductor device 316 in accordance with a ninth embodiment, and corresponds to FIG. 44 in the eighth embodiment. Whereas, FIG. 47 is a plan view showing the semiconductor device 316 shown in FIG. 46, and corresponds to FIG. 45 in the eighth embodiment. FIG. 45 shows a B-B' cross section in FIG. 46. FIG. 46 shows an A-A' plane in FIG. 45. The semiconductor device 316 in accordance with the present embodiment has the same configuration as that of the semiconductor device 314 in accordance with the eight embodiment except for the configuration of the via 212.

In the semiconductor device 316, in the direction of extension of the two sides of the gate electrode 20 arranged in the region of overlap between the top surface of the wire 102 and the bottom surface of the via 212, one of the top surface of the wire 102 and the bottom surface of the via 212 is arranged inside the other in plan view. In the present embodiment, the gate electrode 20 is a rectangle. As shown in FIGS. 46 and 47, in the semiconductor device 316 in accordance with the present embodiment, the bottom surface of the via 212 is arranged inside the top surface of the wire 102 in plan view. Namely, in the direction of extension of the long sides of the gate electrode 20, the bottom surface of the via 212 is arranged inside the top surface of the wire 102. In this case, even when a displacement is caused in the positional relationship between the top surface of the wire 102 and the bottom surface of the via 212, the size of the region of overlap between the top surface of the wire 102 and the bottom surface of the via 212 is kept constant. In this case, the channel width of the channel region 50 is also kept constant. Incidentally, in the present embodiment, in the direction of extension of the long sides of the gate electrode 20, the top surface of the wire 102 may be arranged inside the bottom surface of the via 212 in plan view.

Also in the present embodiment, it is possible to obtain the same effects as those of the eighth embodiment. Further, in the direction of extension of the two sides of the gate electrode 20 arranged in the region of overlap between the top surface of the wire 102 and the bottom surface of the via 212, one of the top surface of the wire 102 and the bottom surface of the via 212 is arranged inside the other in plan view. In this case, even when a displacement is caused in the positional relationship between the top surface of the wire 102 and the bottom surface of the via 212 due to fluctuations in process and the like, the channel width is kept constant. For this reason, it is possible to suppress the occurrence of variations in characteristics among semiconductor elements.

Figure 48:
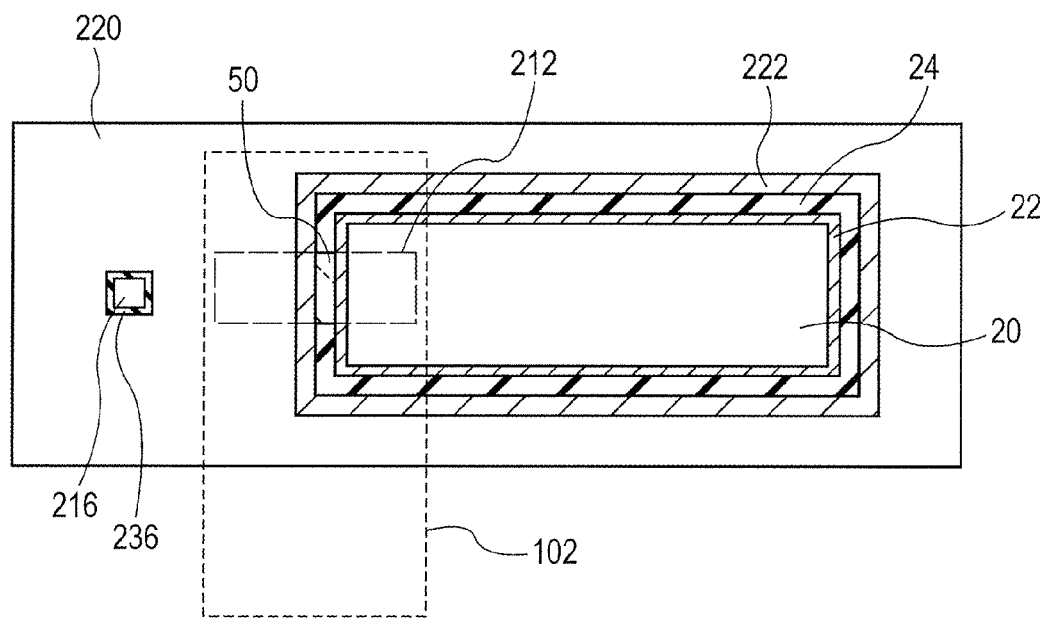
FIG. 48 is a plan view showing a semiconductor device in accordance with a tenth embodiment.

FIG. 48 is a plan view showing a semiconductor device 318 in accordance with a tenth embodiment, and corresponds to FIG. 2 in the first embodiment. The semiconductor device 318 in accordance with the present embodiment has the same configuration as that of the semiconductor device 300 in accordance with the first embodiment except for the configurations of the wire 102 and the via 212.

In the semiconductor device 318 in accordance with the present embodiment, the region of overlap between the top surface of the wire 102 and the bottom surface of the via 212 in plan view includes at least a part of one side of the gate electrode 20, and does not include two sides adjacent to the one side. In the present embodiment, the gate electrode 20 is a rectangle. As shown in FIG. 48, in the direction of extension of the short sides of the gate electrode 20, the bottom surface of the via 212 is shorter than the short side of the gate electrode 20. For this reason, the region of overlap between the top surface of the wire 102 and the bottom surface of the via 212 includes a part of the short side of the gate electrode 20, and does not include the two long sides thereof.

In the present embodiment, the portion of the semiconductor layer 24 adjacent to the part of the gate electrode 20 included in the region of overlap between the top surface of the wire 102 and the bottom surface of the via 212 functions as the channel region 50. For this reason, even when a displacement is caused in the positional relationship between the wire 102 and the via 212 and the gate electrode 20, the length of the side of the gate electrode 20 included in the region of overlap between the top surface of the wire 102 and the bottom surface of the via 212 becomes constant. In this case, the channel width of the channel region 50 is also kept constant.

Also in the present embodiment, it is possible to obtain the same effects as those of the first embodiment. Further, in accordance with the present embodiment, the region of overlap between the top surface of the wire 102 and the bottom surface of the via 212 in plan view includes at least a part of one side of the gate electrode 20, and does not include two sides adjacent to the one side. In this case, even when a displacement is caused in the positional relationship between the wire 102 and the via 212 and the gate electrode 20 due to fluctuations in process and the like, the channel width is kept constant. For this reason, it is possible to suppress the occurrence of variations in characteristics among semiconductor elements.

Figure 49:
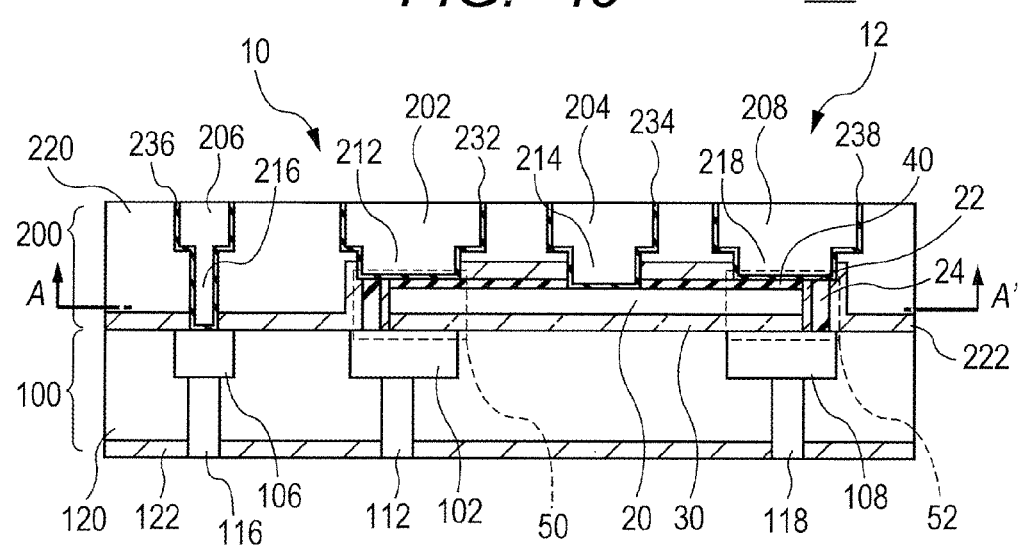
FIG. 49 is a cross-sectional view showing a semiconductor device in accordance with an eleventh embodiment.
Figure 50:
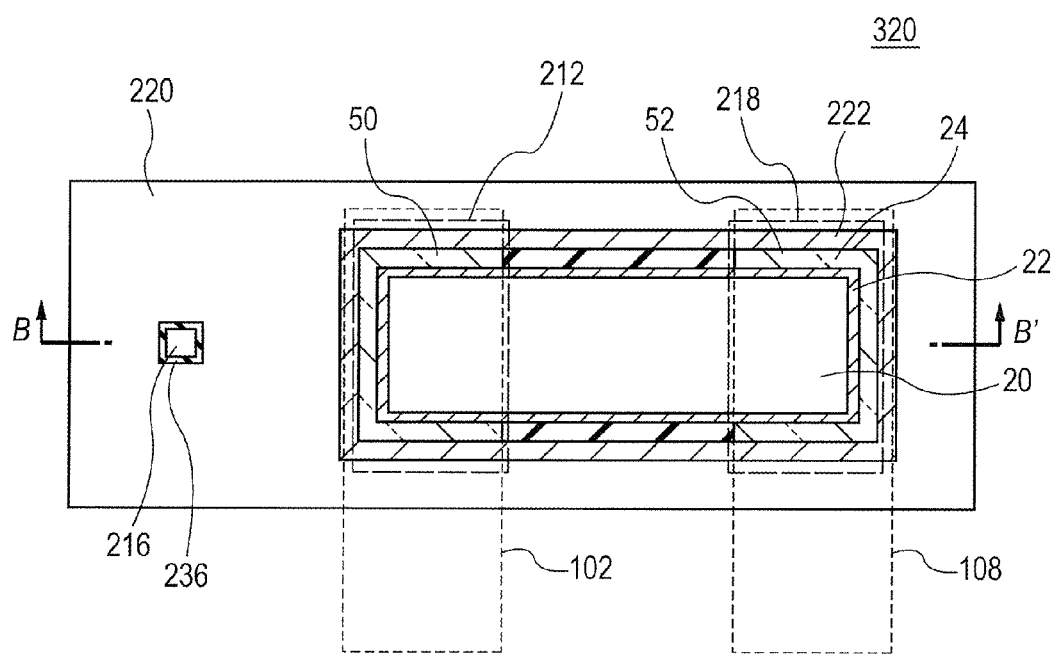
FIG. 50 is a plan view showing the semiconductor device shown in FIG. 49.

FIG. 49 is a cross-sectional view showing a semiconductor device 320 in accordance with an eleventh embodiment, and corresponds to FIG. 1 in the first embodiment. Whereas, FIG. 50 is a plan view showing the semiconductor device 320 shown in FIG. 49, and corresponds to FIG. 2 in the first embodiment. FIG. 49 shows a B-B' cross section in FIG. 50. FIG. 50 shows an A-A' plane in FIG. 49. The semiconductor device 320 in accordance with the present embodiment forms a CMOS using two transistors. Except for this point, the semiconductor device 320 in accordance with the present embodiment has the same configuration as that of the semiconductor device 300 in accordance with the first embodiment.

As shown in FIG. 49, a wire 108 and a via 118 are formed in the wiring layer 100. The via 118 is disposed under the wire 108, and is coupled with the wire 108. The wire 108 is embedded in the interlayer insulation film 120. Further, the wire 108 is formed by, for example, the same step as that for the wire 102. For this reason, the wire 108 has the same depth as that of the wire 102, and is formed of the same material.

As shown in FIG. 49, a wire 208 and a via 218 are disposed in the wiring layer 200. The via 218 is disposed under the wire 208, and is coupled with the wire 208. The wire 208 is embedded in the interlayer insulation film 220. Further, the wire 208 is formed by, for example, the same step as that for the wire 202. For this reason, the wire 208 has the same depth as that of the wire 202, and is formed of the same material. Whereas, as shown in FIG. 49, a barrier metal film 238 may be formed over the side surface of a trench or a hole for embedding the wire 208 and the via 218 therein. The barrier metal film 238 has, for example, the same material and configuration as those of the barrier metal film 232.

The part of the via 218 shown in FIG. 50 shows the bottom surface of the via 218. Whereas, the part of the wire 108 shown in FIG. 50 shows the top surface of the wire 108. As shown in FIG. 50, the top surface of the wire 108 and the bottom surface of the via 218 overlap each other in plan view. Whereas, a part of the semiconductor layer 24 is arranged in the region of overlap between the top surface of the wire 108 and the bottom surface of the via 218.

As shown in FIG. 49, the insulation film 30 is disposed between the gate electrode 20 and the wire 108. For this reason, the gate electrode 20 is not coupled with the wire 108. Whereas, the insulation film 40 is disposed between the gate electrode 20 and the via 218. For this reason, the gate electrode 20 is not coupled with the via 218. The semiconductor layer 24 is coupled with the wire 108 and the via 218. The portion of the semiconductor layer 24 coupled with the wire 102 and the via 212 has a first conductivity type. Whereas, the portion of the semiconductor layer 24 coupled with the wire 108 and the via 218 has a second conductivity type different from the first conductivity type. By selecting the material forming the semiconductor layer 24, it is possible to design the conductivity type of the semiconductor layer 24. Herein, the first conductivity type and the second conductivity type mean either of a P type and an N type. In the present embodiment, for example, the materials for the semiconductor layer 24 are individually made, thereby to control the conductivity type at each portion of the semiconductor layer 24. When one of the portion having the first conductivity type or the portion having the second conductivity type of the semiconductor layer 24 is formed, the region for forming the other therein is protected by a mask. As a result, it is possible to individually make the materials for the semiconductor layer 24.

In the present embodiment, the wire 108, the wire 208, the gate electrode 20, the gate insulation film 22, and the semiconductor layer 24 form a transistor 12. A channel region 52 is formed at a portion of the semiconductor layer 24 arranged in the region of overlap between the top surface of the wire 108 and the bottom surface of the via 218. Further, the wire 208 coupled with the semiconductor layer 24 through the via 218, and the wire 108 coupled with the semiconductor layer 24 function as source/drain electrodes. The insulation film 30 and the insulation film 40 have a function as a sidewall for defining the distance between the gate electrode 20 and the source/drain electrode.

In the present embodiment, the semiconductor layer 24 forming the transistor 12 has the second conductivity type as described above. For this reason, the transistor 12 is a transistor of the second conductivity type. On the other hand, the semiconductor layer 24 forming the transistor 10 has the first conductivity type. Namely, the transistor 10 is a transistor of the first conductivity type. Accordingly, the transistor 10 and the transistor 12 form a CMOS. In the present embodiment, coupling between the source/drain electrodes of the transistor 10 and the source/drain electrodes of the transistor 12 enables the operation as an inverter.

As shown in FIG. 49, in the present embodiment, as with the second embodiment, a gate voltage is applied to the gate electrode 20 via the wire 204 disposed in the wiring layer 200. Incidentally, in the present embodiment, as with the first embodiment, the semiconductor device may have a configuration in which a gate voltage is applied to the gate electrode 20 via the wire 104.

Also in the present embodiment, it is possible to obtain the same effects as those of the first embodiment. Further, in accordance with the present embodiment, it becomes possible to provide a semiconductor device including a CMOS in the multilayer wiring layer.

Figure 51:
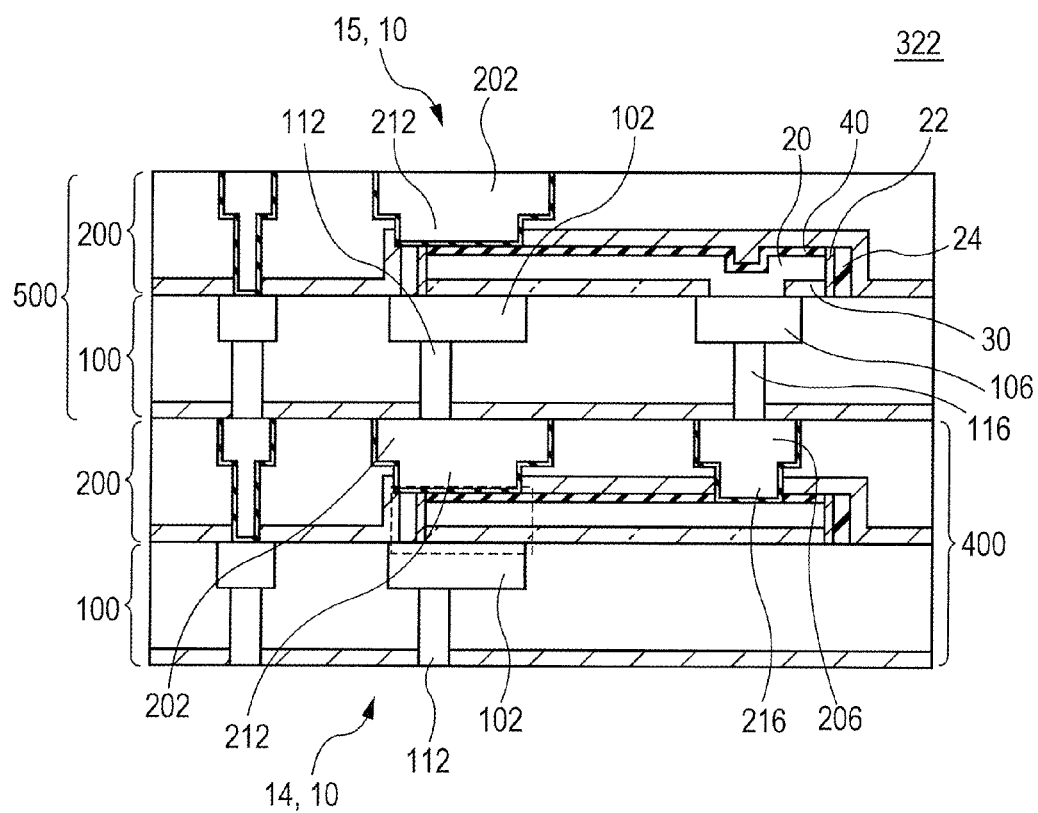
FIG. 51 is a cross-sectional view showing a semiconductor device in accordance with a twelfth embodiment.

FIG. 51 is a cross-sectional view showing a semiconductor device 322 in accordance with a twelfth embodiment. The semiconductor device 322 in accordance with the present embodiment includes a functional layer 400 and a functional layer 500 each formed of the wiring layer 100 and the wiring layer 200. In the wiring layer 100 and the wiring layer 200 forming the functional layer 400 of the multilayer wiring layer disposed over the substrate 60, there is disposed a transistor 14 (10). Whereas, in the wiring layer 100 and the wiring layer 200 forming the functional layer 500, there is disposed a transistor 15 (10). Further, the transistor 14 and the transistor 15 have mutually different characteristics. In the present specification, the functional layer denotes a specific region including elements having specific functions collected therein in the multilayer wiring layer. In this case, it is preferable that only circuits and elements each having a specific function are formed in the specific region. The specific region means a region defined by both of the plane direction horizontal to the substrate plane, and the direction of stacking of the wiring layers. Incidentally, the functional layer 400 and the functional layer 500 in the present embodiment are each formed of the wiring layer 100 and the wiring layer 200 disclosed in any of the first to tenth embodiments. In the present specification, the transistor 10 disposed in the functional layer 400 is referred to as the transistor 14, and the transistor 10 disposed in the functional layer 500 is referred to as the transistor 15.

As shown in FIG. 51, in the semiconductor device 322 in accordance with the present embodiment, the functional layer 500 is stacked over the functional layer 400. In this case, the wiring layer 100 included in the functional layer 500 is arranged over the wiring layer 200 included in the functional layer 400. Incidentally, the functional layer 400 and the functional layer 500 may form any portion in the multilayer wiring layer, and may be, for example, separated from each other.

As shown in FIG. 51, the wiring layer 100 and the wiring layer 200 forming the functional layer 400 in the present embodiment have the same configuration as, for example, that of the wiring layer 100 and the wiring layer 200 in accordance with the second embodiment. Namely, in the functional layer 400, the gate electrode 20 is applied with a gate voltage via the wire 206 disposed in the wiring layer 200. Whereas, the wiring layer 100 and the wiring layer 200 forming the functional layer 500 in the present embodiment have the same configuration as, for example, that of the wiring layer 100 and the wiring layer 200 in accordance with the first embodiment. Namely, in the functional layer 500, the gate electrode 20 is applied with a gate voltage via the wire 106 disposed in the wiring layer 100.

As shown in FIG. 51, the wire 106 of the functional layer 500 and the wire 206 of the functional layer 400 are coupled to each other through the via 116 in the functional layer 500. Accordingly, the gate electrode 20 of the transistor 14 and the gate electrode 20 of the transistor 15 are coupled to each other. Further, as shown in FIG. 51, the wire 202 of the functional layer 400 and the wire 102 of the functional layer 500 are coupled to each other through the via 112. This results in that one of the source/drain electrodes of the transistor 14 and one of the source/drain electrodes of the transistor 15 are coupled to each other.

The transistor 14 and the transistor 15 have mutually different characteristics. Herein, the different characteristics denote, for example, the conductivity types or the threshold voltages of the transistors. The conductivity type of the transistor can be designed by selecting the material forming the semiconductor layer 24. Whereas, the threshold voltage of the transistor can be designed by, for example, selecting the material for the gate electrode 20.

In the present embodiment, the transistor 14 has, for example, the first conductivity type. Whereas, the transistor 15 has, for example, the second conductivity type different from the first conductivity type. Incidentally, herein, the first conductivity type and the second conductivity type each mean either of a P type and an N type. Further, the transistor 14 and the transistor 15 are coupled to each other through the source/drain electrodes. Further, the gate electrodes 20 of the transistor 14 and the transistor 15 are coupled to each other. Accordingly, the semiconductor device 322 has an inverter formed of the transistor 14 and the transistor 15.

Figure 52:
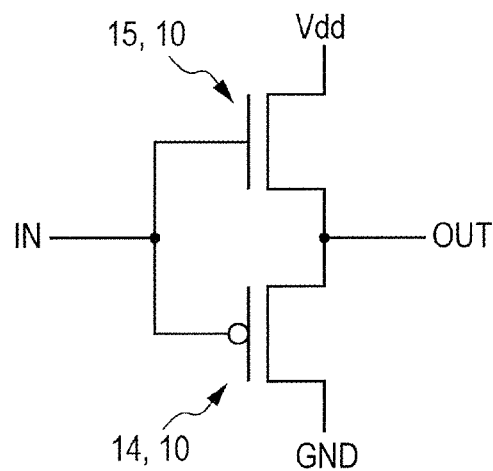
FIG. 52 is a circuit diagram showing a CMOS inverter circuit included in the semiconductor device shown in FIG. 51.

FIG. 52 is a circuit diagram showing the CMOS inverter circuit included in the semiconductor device 322 shown in FIG. 51. Herein, the transistor 14 is set as a P type transistor, and the transistor 15 is set as an N type transistor. As shown in FIG. 52, the gate electrodes 20 of the transistor 14 and the transistor 15 are coupled to an input terminal, and the drain electrodes are coupled to an output terminal. In this case, in the transistor 14, the wire 202 serves as the drain electrode, and in the transistor 15, the wire 102 serves as the drain electrode. Whereas, the source electrode of the transistor 14 is grounded, and the source electrode of the transistor 15 is coupled to a power source. In this state, the wire 102 of the transistor 14 serves as a source electrode, and the wire 202 of the transistor 15 serves as a source electrode. By thus designing the circuit, it becomes possible to allow the semiconductor device 322 in accordance with the present embodiment to operate as an inverter.

Figure 53:
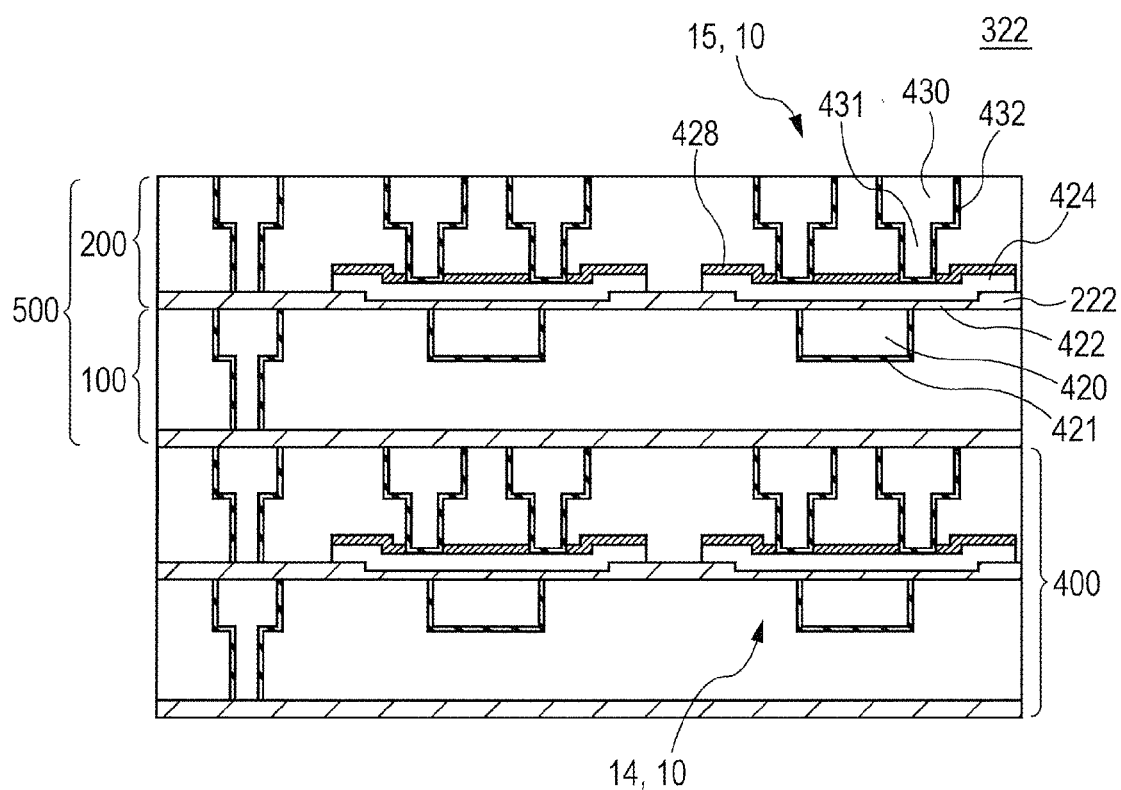
FIG. 53 is a cross-sectional view showing a first modified example of the semiconductor device shown in FIG. 51.

FIG. 53 is a cross-sectional view showing a first modified example of the semiconductor device 322 shown in FIG. 51. The semiconductor device 322 may have the structure of the wiring layer 100 and the wiring layer 200 in accordance with the present modified example. As described later, in the semiconductor device 322 in accordance with the present modified example, a wire 420, a wire 430, a semiconductor layer 424, and a gate insulation film 422 form the transistor 10.

As shown in FIG. 53, in the semiconductor device 322 in accordance with the present modified example, the wire 420 embedded in the wiring layer 100 forms a gate electrode. The wire 420 is formed of, for example, the same material as that for the wire 102. Over the sidewall of a trench for embedding the wire 420 therein, there is formed a barrier metal film 421. The barrier metal film 421 is formed of, for example, the same material as that for the barrier metal film 232. Further, over the wire 420, there is formed the gate insulation film 422 disposed at the same layer as that of the diffusion preventive film 222. The gate insulation film 422 is, for example, thinner than the diffusion preventive film 222. The gate insulation film 422 is formed by, for example, forming a recessed part in the top surfaces of the region of the diffusion preventive film 222 overlapping the wire 420, and its surroundings.

Further, over the gate insulation film 422 and the diffusion preventive film 222 arranged therearound, there is formed the semiconductor layer 424. The semiconductor layer 424 is formed of, for example, the same material as that for the semiconductor layer 24. Further, the semiconductor layer 424 may be, for example, a polysilicon layer or an amorphous silicon layer. In the semiconductor layer 424, there are disposed a source and a drain. When the semiconductor film 424 is an oxide semiconductor layer, the source and the drain are formed by introducing, for example, an oxygen defect, but may be formed by introducing impurities. When the semiconductor film 424 is a polysilicon layer or an amorphous silicon layer, the source and the drain are formed by introducing impurities. The region of the semiconductor layer 424 interposed between the source and the drain serves as a channel region.

Whereas, in the wiring layer 200, there are formed two wires 430. The two wires 430 are respectively coupled to the source/drain of the semiconductor layer 424 through the vias 431. Namely, the two wires 430 form source/drain electrodes. The wire 430 is formed of, for example, the same material as that for the wire 202. Over the sidewall of a trench or a hole for embedding the wire 430 and the via 431 therein, there is formed a barrier metal film 432. The barrier metal film 432 is formed of, for example, the same material as that for the barrier metal film 232. Over the semiconductor layer 424, there is formed a hard mask film 428. The hard mask film 428 is used for selectively leaving the semiconductor film 424 by etching. The hard mask film 428 may be desirably a material providing an etching selectivity with respect to the semiconductor film 424. The wire 430 penetrates through the hard mask film 428, and is coupled with the semiconductor layer 424.

As shown in FIG. 53, each functional layer may have, for example, a plurality of transistors. The gate electrodes respectively included in the plurality of transistors disposed in the same functional layer are formed by the mutually same step. For this reason, respective gate electrodes are formed of the same material. Further, the semiconductor layers 424 respectively included in the plurality of transistors disposed in the same functional layer are formed by the mutually same step. For this reason, respective semiconductor layers 424 are formed of the same material. Accordingly, the transistors disposed in the same functional layer have the same characteristics.

Also in the present modified example, the transistor 14 has, for example, the first conductivity type. Whereas, the transistor 15 has, for example, the second conductivity type different from the first conductivity type. Incidentally, herein, the first conductivity type and the second conductivity type mean either of a P type and an N type. For this reason, with the transistor 14 and the transistor 15, respective ones of the source/drain electrodes are coupled to each other, and the gate electrodes are coupled to each other. This enables the operation as an inverter.

Figure 54:
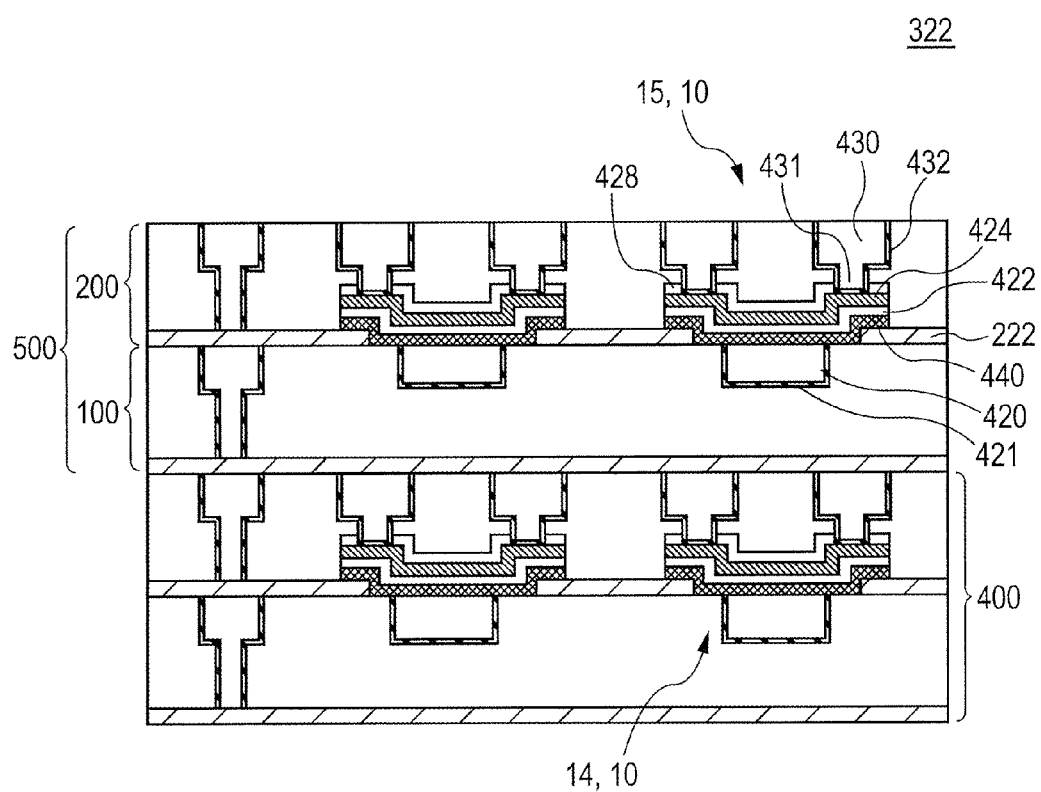
FIG. 54 is a cross-sectional view showing a second modified example of the semiconductor device shown in FIG. 51.

FIG. 54 is a cross-sectional view showing a second modified example of the semiconductor device 322 shown in FIG. 51. The semiconductor device 322 may have the structure of the wiring layer 100 and the wiring layer 200 in accordance with the present modified example. The semiconductor device 322 in accordance with the present modified example has the same configuration as that of the semiconductor device 322 in accordance with the first modified example except for the configuration of the gate electrode and the gate insulation film.

As shown in FIG. 54, in the semiconductor device 322 in accordance with the present modified example, a gate electrode 440 is formed over the wire 420, and is coupled to the wire 420. The gate electrode 440 is formed by a different step from that for the wire 420. The gate electrode 440 can be formed of, for example, the same material as that for the gate electrode 20. Over the gate electrode 440, there is disposed a gate insulation film 422. The gate insulation film 422 is formed by a different step from that for the diffusion preventive film 222. The gate insulation film 422 is formed of, for example, the same material as that for the gate insulation film 22.

Then, the effects of the present embodiment will be described. When two transistors having mutually different characteristics are formed, respective transistors are required to be formed by different steps, respectively. For this reason, when two transistors having mutually different characteristics are disposed in the same wiring layer, for forming one transistor, for example, a hard mask is required to be formed to protect the other transistor. Namely, it is necessary to add steps for individually forming two transistors. In this case, manufacturing of the semiconductor device becomes complicated. Further, in this case, it is necessary to design transistors in consideration of misalignment and the like caused in the steps for individually forming two transistors. This restricts the in-plane density of the transistors in the same wiring layer.

In accordance with the present embodiment, the semiconductor device 322 includes the transistor 14 and the transistor 15 having mutually different characteristics. Further, the transistor 15 is formed in the functional layer 500 different from the functional layer 400 in which the transistor 14 is disposed. Namely, the transistor 14 and the transistor 15 are disposed in mutually different wiring layers. In this case, the steps for individually forming the transistor 14 and the transistor 15 become unnecessary. Accordingly, it becomes possible to readily manufacture a semiconductor device including two transistors having mutually different characteristics. Further, it becomes possible to improve the in-plane density of transistors in the semiconductor device including two transistors having mutually different characteristics.

When two transistors having mutually different characteristics are disposed in the same wiring layer, for forming one transistor, for example, a hard mask is formed, thereby to protect the other transistor. In this case, the hard mask is required to be removed by dry etching or the like. This damages the wiring layer. In accordance with the present embodiment, as described above, the steps for individually forming the transistor 14 and the transistor 15 become unnecessary. Accordingly, it is possible to suppress the wiring layer from being damaged.

Figure 55:
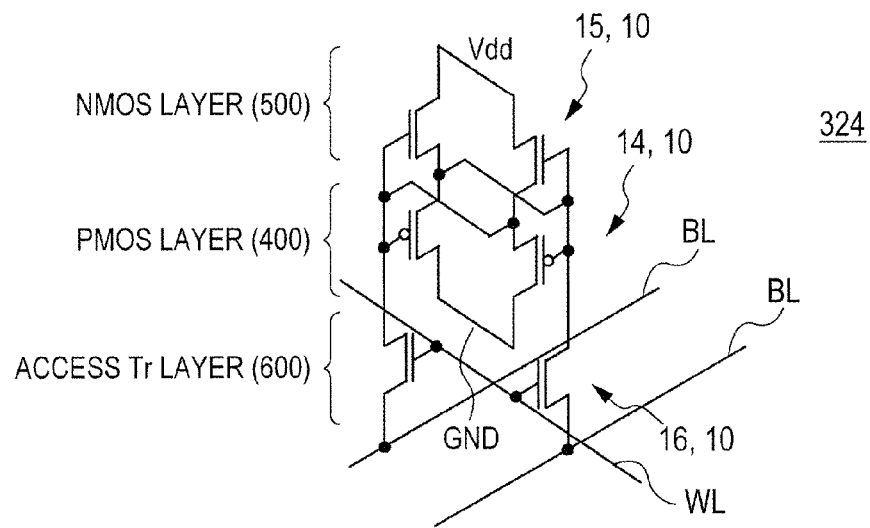
FIG. 55 is a circuit diagram showing a semiconductor device in accordance with a thirteenth embodiment.

FIG. 55 is a circuit diagram showing a semiconductor device 324 in accordance with a thirteenth embodiment. The semiconductor device 324 in accordance with the present embodiment includes a functional layer 600 formed of the wiring layer 100 and the wiring layer 200. In the wiring layer 200 forming the functional layer 600 of the multilayer wiring layer disposed over the substrate 60, there is disposed a transistor 16 (10) functioning as an access transistor. Except for this point, the semiconductor device 324 in accordance with the present embodiment has the same configuration as that of the semiconductor device 322 in accordance with the twelfth embodiment. Incidentally, the functional layer 600 in the present embodiment is formed of the wiring layer 100 and the wiring layer 200 disclosed in any of the first to tenth embodiments. In the present specification, the transistor 10 disposed in functional layer 600 is referred to as the transistor 16.

As shown in FIG. 55, the semiconductor device 324 in accordance with the present embodiment includes a 6-transistor type SRAM cell formed of two inverters and two access transistors. The inverter is a CMOS inverter formed of the transistor 14 and the transistor 15 included in the semiconductor device 322 in accordance with the twelfth embodiment. The inverter has, for example, the structure shown in FIG. 51. Whereas, the access transistor is formed of the transistor 16.

As shown in FIG. 55, the semiconductor device 324 in accordance with the present embodiment is formed of the functional layer 600, the functional layer 400, and the functional layer 500 stacked in this order. The functional layer 400 forms a PMOS layer. In this case, the transistor 14 disposed in the functional layer 400 is a P type transistor. The functional layer 400 has two transistors 14 for every one SRAM cell. The functional layer 500 forms an NMOS layer. In this case, the transistor 15 disposed in the functional layer 500 is an N type transistor. The functional layer 500 has two transistors 15 for every one SRAM cell.

As shown in FIG. 55, the functional layer 600 forms an access transistor layer. Further, the functional layer 600 has two transistors 16 functioning as access transistors for every one SRAM cell. The gate electrodes of the two access transistors 16 are coupled to a common word line (WL). Whereas, in the two access transistors 16, ones of the source/drain electrodes are respectively coupled to different bit lines (BL), and the others are coupled to the inverter circuit.

Also in the present embodiment, it is possible to obtain the same effects as those of the twelfth embodiment.

The transistor 16 forming the access transistor and the transistor 14 forming the inverter are different in function from each other. For this reason, the transistor 16, and the transistor 14 and the transistor 15 are required to be formed by different steps. Accordingly, when the transistors 16 and the transistors 14 or the transistors 15 are formed in the same wiring layer, it is necessary to add steps for individually forming them. In contrast, in accordance with the present embodiment, the transistor 16 forming the access transistor is formed in a different wiring layer from the wiring layer in which the transistor 14 and the transistor 15 forming the inverter are disposed. This eliminates the necessity of the steps for individually forming the transistor 16, the transistor 14 and the transistor 15 different in function from each other. Therefore, manufacturing of the semiconductor device becomes easy.

Figure 56:
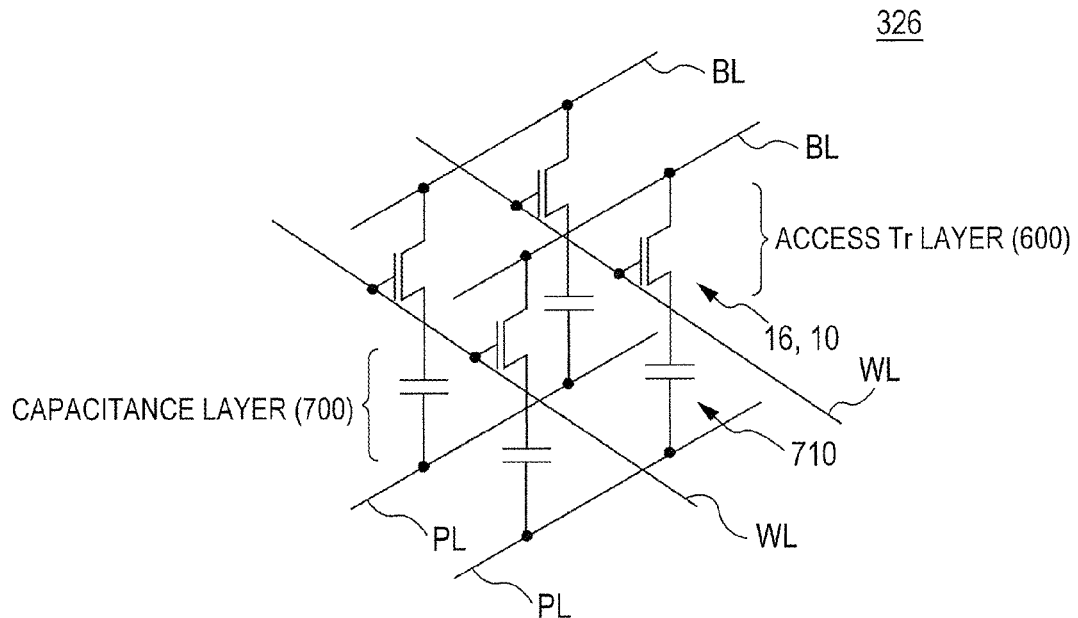
FIG. 56 is a circuit diagram showing a semiconductor device in accordance with a fourteenth embodiment.

FIG. 56 is a circuit diagram showing a semiconductor device 326 in accordance with a fourteenth embodiment. The semiconductor device 326 in accordance with the present embodiment includes a functional layer 700. The functional layer 700 forms a capacitance layer, and has a capacitance element 710. The capacitance element 710 is coupled to one of the source/drain electrodes of the transistor 16 disposed in the functional layer 600, and forms a DRAM cell. Incidentally, the functional layer 600 can have the same configuration as that of the thirteenth embodiment.

The functional layer 600 includes a plurality of transistors 16 arranged in an array. Whereas, the functional layer 700 has a plurality of capacitance elements 710. The plurality of capacitance elements 710 are respectively coupled to different transistors 16, and form a DRAM cell array. In the present embodiment, for example, some of the plurality of transistors 16 disposed in the functional layer 600 form a DRAM cell, and others form the SRAM cell in accordance with the thirteenth embodiment.

As shown in FIG. 56, the capacitance element 710 is coupled to a plate line (PL). Whereas, the gate electrode of the transistor 16 functioning as an access transistor is coupled to a word line. Further, one of the source/drain electrodes of the transistor 16 is coupled to a bit line (BL), and the other is coupled to the capacitance element 710.

In accordance with the present embodiment, the DRAM cell and the SRAM cell both use the transistors 16 disposed in the same wiring layer as the access transistors. In this case, it becomes possible to form the access transistor of the DRAM cell and the access transistor of the SRAM cell by the same step. This can facilitate manufacturing of the semiconductor device.

Figure 57:
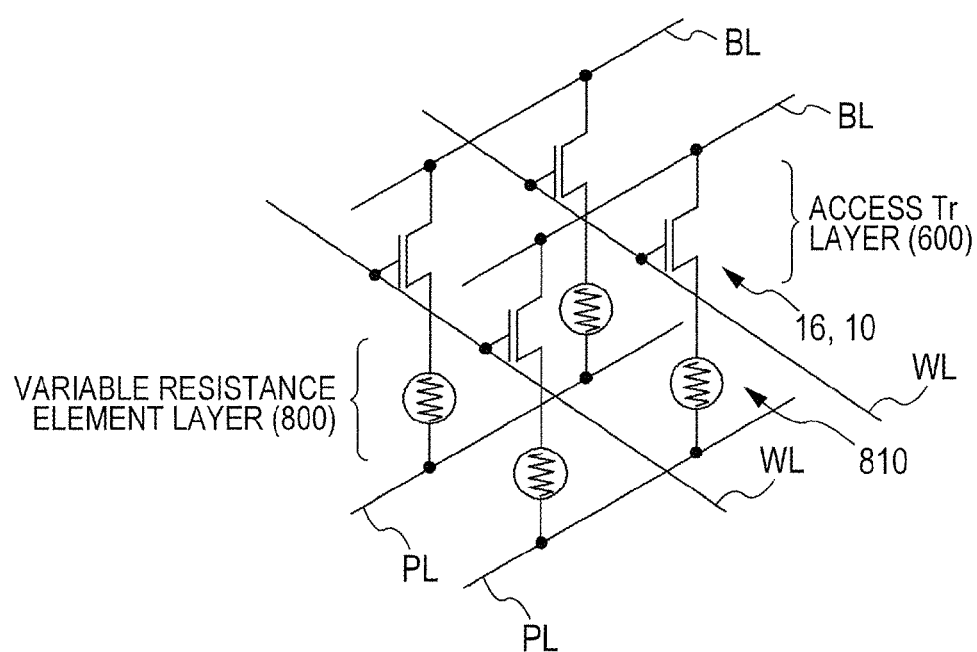
FIG. 57 is a circuit diagram showing a semiconductor device in accordance with a fifteenth embodiment.

FIG. 57 is a circuit diagram showing a semiconductor device 328 in accordance with a fifteenth embodiment. The semiconductor device 328 in accordance with the present embodiment includes a functional layer 800. The functional layer 800 forms a variable resistance element layer, and has a variable resistance element 810. The variable resistance element 810 is coupled to one of the source/drain electrodes of the transistor 16 disposed in the functional layer 600, and forms a variable resistance element cell. Incidentally, the functional layer 600 can have the same configuration as that of the thirteenth embodiment.

The functional layer 600 includes a plurality of transistors 16 arranged in an array. Whereas, the functional layer 800 has a plurality of variable resistance elements 810. The plurality of variable resistance elements 810 are respectively coupled to different transistors 16, and form a variable resistance element cell array. In the present embodiment, for example, some of the plurality of transistors 16 disposed in the functional layer 600 form the variable resistance element cell, and others form the SRAM cell in accordance with the thirteenth embodiment. Further, for example, still others not forming the variable resistance element cell and the SRAM cell form the DRAM cell in accordance with the fourteenth embodiment. In this case, the functional layer 700 having the capacitance elements 710 and the functional layer 800 having the variable resistance elements 810 are formed of, for example, the same wiring layer.

As shown in FIG. 57, the variable resistance element 810 is coupled to the plate line (PL). Whereas, the gate electrode of the transistor 16 functioning as the access transistor is coupled to the word line. Further, one of the source/drain electrodes of the transistor 16 is coupled to the bit line (BL), and the other is coupled to the variable resistance element 810.

In accordance with the present embodiment, the variable resistance element cell, the SRAM cell, and the DRAM cell all use the transistors 16 disposed in the same wiring layer as access transistors. In this case, the access transistor of the variable resistance element cell, the access transistor of the SRAM cell, and the access transistor of the DRAM cell can be formed by the same step. This can facilitate manufacturing of the semiconductor device.

Figure 58:
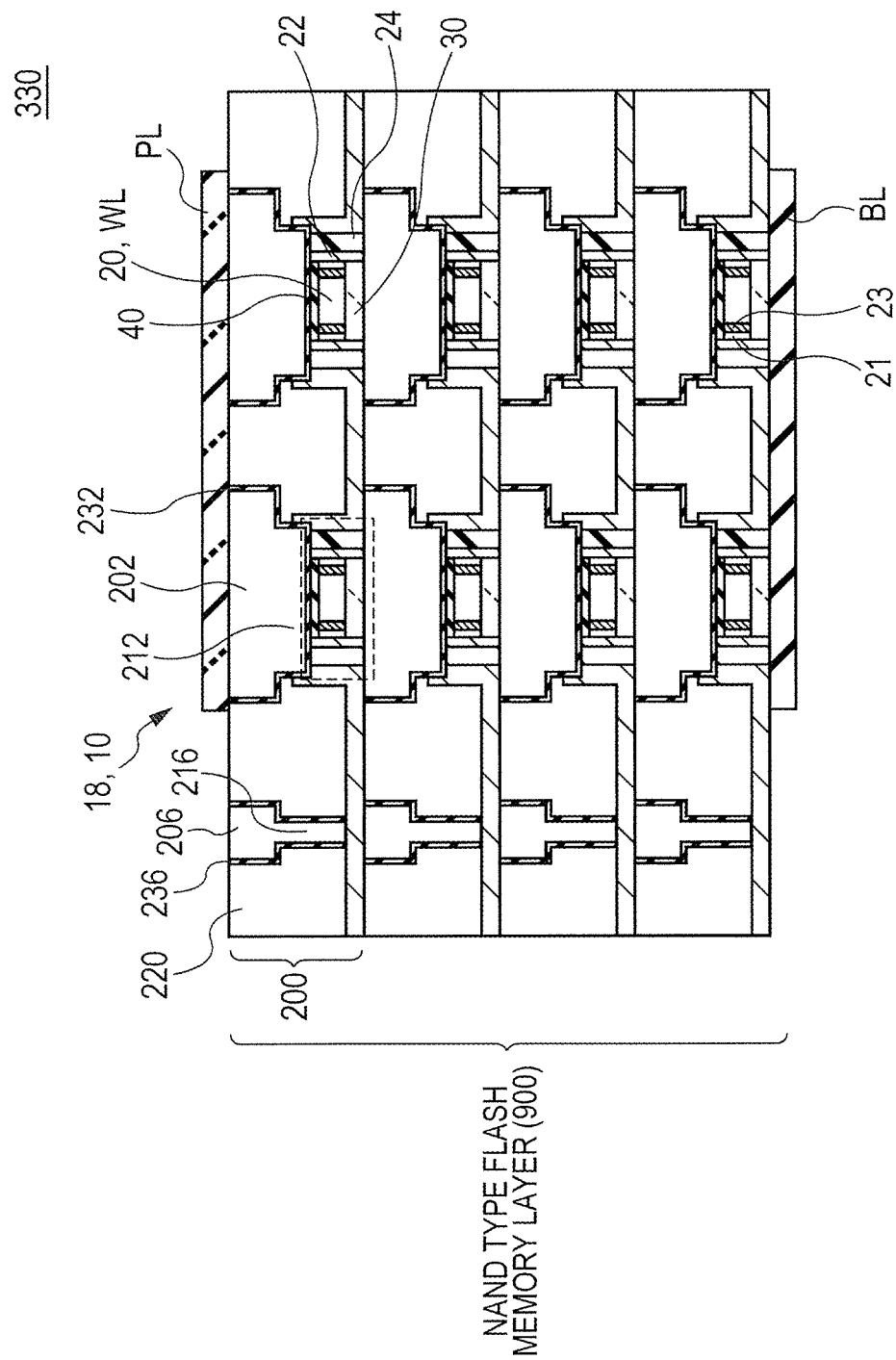
FIG. 58 is a cross-sectional view showing a semiconductor device in accordance with a sixteenth embodiment.
Figure 59:
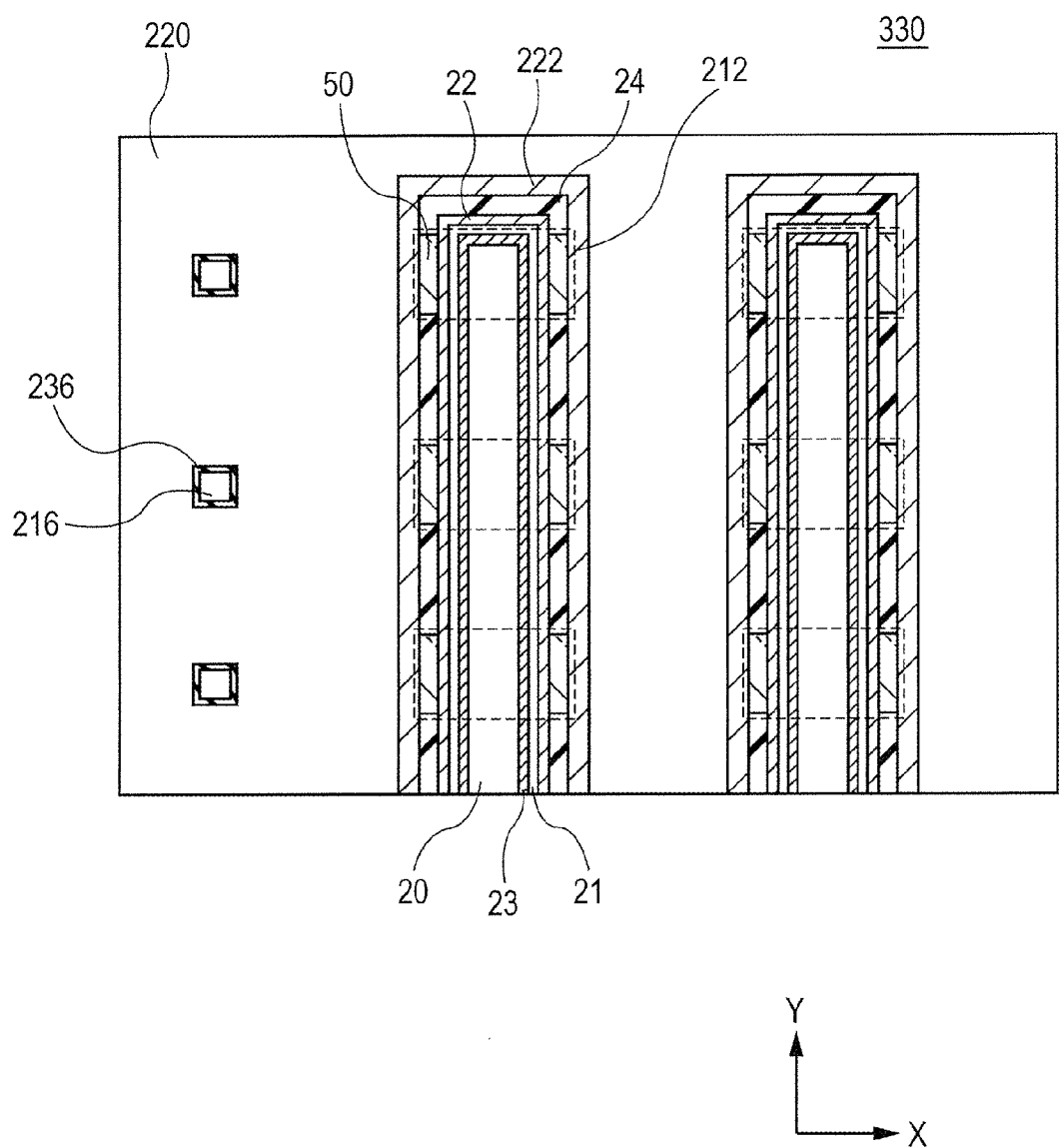
FIG. 59 is a plan view showing the semiconductor device shown in FIG. 58.

FIG. 58 is a cross-sectional view showing a semiconductor device 330 in accordance with a sixteenth embodiment. FIG. 59 is a plan view showing the semiconductor device 330 shown in FIG. 58. The semiconductor device 330 in accordance with the present embodiment includes a functional layer 900. The functional layer 900 forms an NAND type Flash memory layer. The functional layer 900 has a structure in which a large number of the wiring layers 200 in any of the first to eleventh embodiments are stacked. In the present embodiment, the wiring layer 200 forming the functional layer 900 includes a memory element 18 having a floating gate film 21 as described later.

As shown in FIG. 58, the functional layer 900 has a structure in which a large number of the wiring layers 200 are stacked. In the present embodiment, the functional layer 900 is formed of, for example, a lamination of four wiring layers 200. The semiconductor layer 24 disposed in each wiring layer 200 except for the wiring layer 200 arranged at the lowermost layer of the functional layer 900 is coupled to the wire 202 arranged at the underlying layer. Further, the semiconductor layer 24 disposed at the wiring layer 20 arranged at the lowermost layer of the functional layer 900 is coupled to the bit line (BL). The wire 202 disposed in the wiring layer 200 arranged at the uppermost layer of the functional layer 900 is coupled to the plate line (PL). Whereas, the gate electrode 20 disposed in each wiring layer 200 forms a word line (WL).

In the present embodiment, the wiring layer 200 forming the functional layer 900 has a memory element 18. The memory element 18 has an insulation film 23 and a floating gate film 21. The insulation film 23 is disposed over the side surface of the gate electrode 20. The floating gate film 21 is disposed over the side surface of the gate electrode 20 via the insulation film 23. The gate insulation film 22 is disposed over the side surface of the gate electrode 20 via the insulation film 23 and the floating gate film 21. The floating gate film 21 is electrically separated from the wire 202 arranged at the underlying layer by the insulation film 30. Whereas, the floating gate film 21 is electrically separated from the via 212 by the insulation film 40. Incidentally, the gate electrode 20 functions as a control gate film of a Flash memory. Further, in the present embodiment, the wires respectively disposed in two adjacent wiring layers 200 form the source/drain electrodes. The source/drain electrodes, and the gate electrode 20, the insulation film 23, the floating gate film 21, the gate insulation film 22, and the semiconductor layer 24 arranged between two wires 202 forming the source/drain electrodes in the direction of stacking of the wiring layers 200, form a memory element 18. Except for these points, the memory element 18 has the same configuration as that of the transistor 10 in the first embodiment.

As shown in FIG. 58, the two memory elements 18 adjacent in the direction of stacking of the wiring layers 200 are coupled to each other via the source/drain electrodes. This results in that the plurality of memory elements 18 arranged in the direction of stacking of the wiring layers 200, and coupled in series to each other via the source/drain electrodes form a Flash memory NAND chain.

As shown in FIG. 59, in each wiring layer 200, the gate electrode 20 extends in the Y direction in the drawing (the vertical direction in FIG. 59). Whereas, over the gate electrode 20, a plurality of wires 202 (not shown) and a plurality of vias 212 separated from one another are disposed via the insulation film 40. At this step, in the semiconductor layer 24 disposed over the side surface of the gate electrode 20 via the gate insulation film 22, there are formed a plurality of channel regions 50 separated from one another corresponding to the plurality of vias 212 separated from one another. This results in the formation of the plurality of memory elements 18 arranged in the Y direction of the drawing in the same wiring layer 200. Further, the gate electrode 20, the insulation film 23, the floating gate 21, the gate insulation film 22, the semiconductor layer 24, and the plurality of wires 202 disposed over the gate electrode 20 are arranged in a plural number in such a manner as to be separated from one another in the X direction of the drawing (the lateral direction in FIG. 59). Accordingly, each wiring layer 200 has a plurality of memory elements 18 arranged in an array in the same wiring layer. The plurality of memory elements 18 arranged in an array in the same wiring layer form respectively different NAND type Flash memories. Accordingly, the plurality of memory elements 18 disposed in the functional layer 900 form a Flash memory array.

Incidentally, in the present embodiment, a trap film formed of SiN or the like, a charge holding film formed of microcrystals such as nanocrystals, or another film having a charge holding function may be disposed in place of the floating gate 21.

In accordance with the present embodiment, an NAND type Flash memory can be formed in the multilayer wiring layer. Further, in accordance with the present embodiment, a NAND type Flash memory is formed of a plurality of memory elements 18 stacked in the direction of stacking of the multilayer wiring layer. This enables shrinkage of the Flash memory mounting area. Therefore, it is possible to increase the density of semiconductor elements disposed in the semiconductor device.

Figure 60:
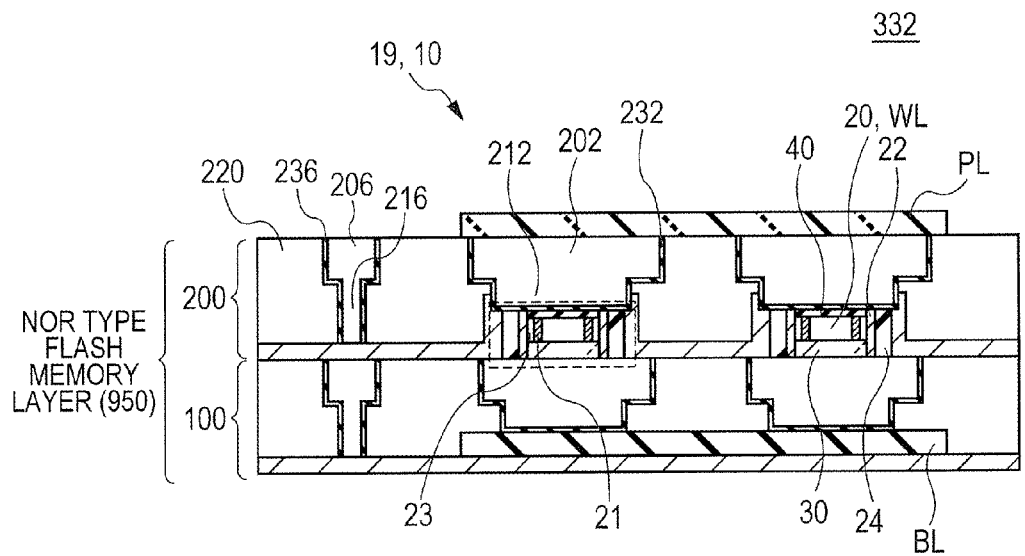
FIG. 60 is a cross-sectional view showing a semiconductor device in accordance with a seventeenth embodiment.
Figure 61:
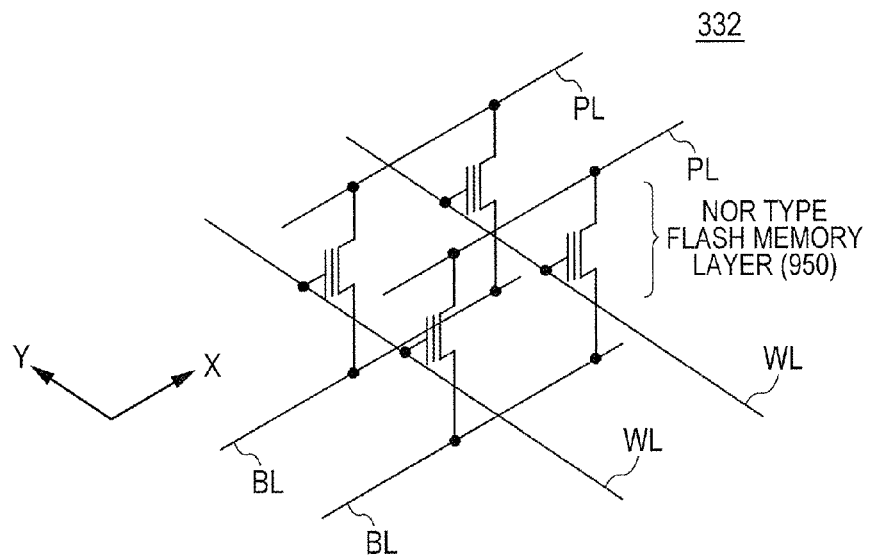
FIG. 61 is a circuit diagram showing the semiconductor device shown in FIG. 60.

FIG. 60 is a cross-sectional view showing a semiconductor device 332 in accordance with a seventeenth embodiment. FIG. 61 is a circuit diagram showing the semiconductor device 332 shown in FIG. 60. The semiconductor device 332 in accordance with the present embodiment includes a functional layer 950. The functional layer 950 forms a NOR type Flash memory. The functional layer 950 has the wiring layer 100 and the wiring layer 200 in any of the first to eleventh embodiments. In the present embodiment, the wiring layer 200 forming the functional layer 950 includes a memory element 19 having a floating gate film 21 as described later.

As shown in FIG. 60, the functional layer 950 is formed of the wiring layer 100, and the wiring layer 200 disposed over the wiring layer 100. In the present embodiment, the wiring layer 200 forming the functional layer 950 has a memory element 19. The memory element 19 has an insulation film 23 and a floating gate film 21. The insulation film 23 is disposed over the side surface of the gate electrode 20. The floating gate film 21 is disposed over the side surface of the gate electrode 20 via the insulation film 23. The gate insulation film 22 is formed over the side surface of the gate electrode 20 via the insulation film 23 and the floating gate film 21. The floating gate film 21 is electrically separated from the wire 102 by the insulation film 30. Further, the floating gate film 21 is electrically separated from the via 212 by the insulation film 40. Incidentally, the gate electrode 20 functions as a control gate film of the Flash memory. Except for these points, the memory element 19 has the same configuration as that of the transistor 10 in the first embodiment.

In the present embodiment, the wiring layer 100 forming the functional layer 950 has a bit line (BL) disposed over the diffusion preventive film 122. The wire 102 forming the memory element 19 is disposed over the bit line (BL), and is coupled to the bit line (BL). Over the wiring layer 200, there is formed a plate line (PL). The wire 202 forming the memory element 19 is coupled to the plate line (PL). Each gate electrode 20 forming the memory element 19 forms a word line (WL).

As shown in FIG. 61, the functional layer 950 includes a plurality of memory elements 19 arranged in an array in the X direction and the Y direction in FIG. 61. The plurality of memory elements 19 arranged in the X direction in FIG. 61 are coupled to a common bit line (BL) so as to be in parallel with one another. The plurality of memory elements 19 thus coupled to the common bit line (BL) form a NOR type Flash memory.

In accordance with the present embodiment, it is possible to form a NOR type Flash memory in the multilayer wiring layer.

Figure 62:
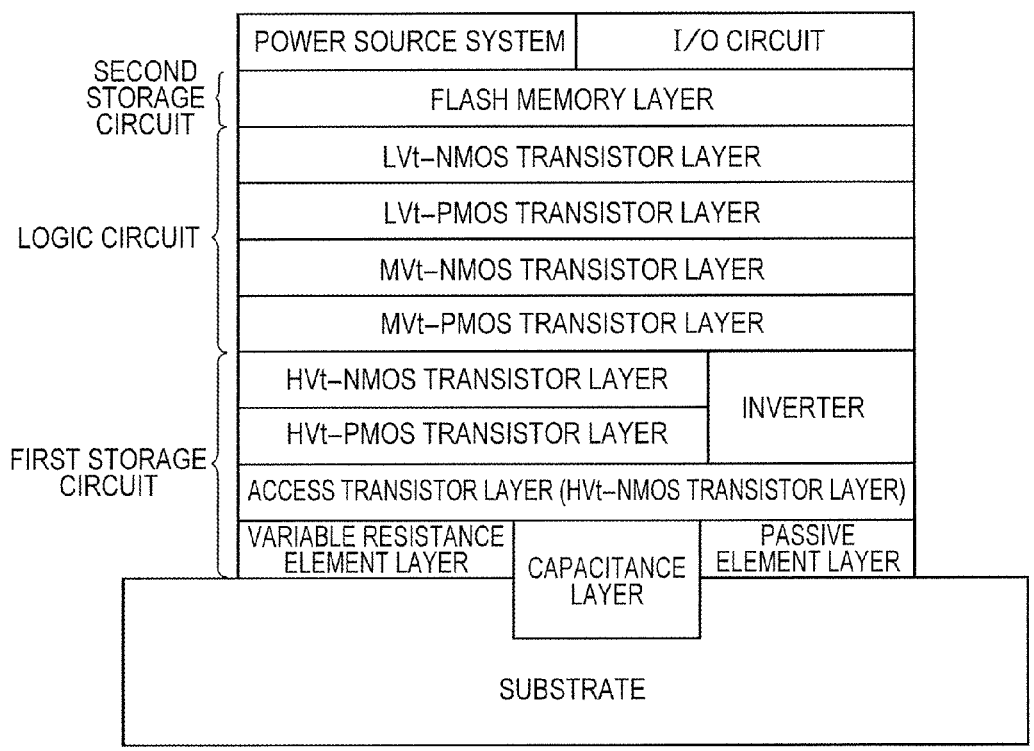
FIG. 62 is a cross-sectional schematic view showing a semiconductor device in accordance with an eighteenth embodiment.

FIG. 62 is a cross-sectional schematic view showing a semiconductor device 334 in accordance with an eighteenth embodiment. The semiconductor device 334 in accordance with the present embodiment includes a multilayer wiring layer formed over a substrate. Further, the multilayer wiring layer includes devices having mutually different functions disposed in mutually different wiring layers. As a result, a three-dimensional LSI structure is implemented. Below, the three-dimensional LSI structure will be described in details.

As shown in FIG. 62, the multilayer wiring layer includes transistors respectively disposed in a plurality of mutually different wiring layers. The transistors disposed in respective wiring layers have characteristics determined based on the functions implemented by respective wiring layers, respectively. The characteristics of transistors are, for example, the conductivity type and the threshold voltage. In the present embodiment, in one layer of the multilayer wiring layer, there are disposed a plurality of transistors having the mutually same characteristic. Whereas, in another layer of the multilayer wiring layer different from the one layer, there are disposed a plurality of transistors having a different characteristic from that of the transistors disposed in the one layer, and having the mutually same characteristic. Thus, the transistors are not individually formed in one layer, and the transistors are individually formed between different layers. As a result, it is possible to inhibit the layout in the wiring layer from becoming complicated due to individual formation. Further, it is also possible to inhibit the occurrence of deterioration of the characteristics of the transistor elements with individual formation. Some of the plurality of wiring layers forming the multilayer wiring layer have, for example, a function as a logic circuit. Whereas, others of the plurality of wiring layers forming the multilayer wiring layer have, for example, a function as a storage circuit. The semiconductor device 334 in accordance with the present embodiment has, for example, a multilayer wiring structure including a first storage circuit, a logic circuit, a second storage circuit, and a power source system and an I/O circuit sequentially stacked over a substrate.

In the present embodiment, the substrate can be formed of, for example, an insulating substrate or a semiconductor substrate. The insulating substrate is, for example, a glass substrate or a resin substrate.

As shown in FIG. 62, the logic circuit and the storage circuit are each formed of a plurality of transistor layers stacked one on another. The plurality of transistor layers forming the logic circuit and the storage circuit respectively include transistors different in threshold voltage or conductivity type from one another. Each transistor layer forming the semiconductor device 334 in the present embodiment is formed of the wiring layer 100 and the wiring layer 200 in accordance with any of the first to tenth embodiment.

In the semiconductor device 334 in accordance with the present embodiment, the logic circuit is formed of, for example, a MVt-PMOS transistor layer, a MVt-NMOS transistor layer, a LVt-PMOS transistor layer, and a LVt-NMOS transistor layer sequentially stacked. The threshold voltages of the transistor layers in the present embodiment increase in the order of LVt, MVt, and HVt. The values of respective threshold voltages are, for example: about 0.3 V for LVt; about 0.4 V for MVt; and about 0.5 V for HVt.

In the semiconductor device 334 in accordance with the present embodiment, the first storage circuit includes, for example, a lamination structure in which an access transistor layer, a HVt-PMOS transistor layer, and a HVt-NMOS transistor layer are sequentially stacked. The access transistor layer is formed of, for example, a HVt-NMOS transistor layer. The first storage circuit includes a SRAM cell. The SRAM cell is formed, as with the thirteenth embodiment, using access transistors disposed in the access transistor layer, and an inverter disposed over the access transistor layer. Whereas, the first storage circuit includes a capacitance layer disposed under the access transistor layer. Using the access transistors disposed in the access transistor layer, and the capacitance layer, a DRAM cell is formed as with the fourteenth embodiment. Further, the first storage circuit includes a variable resistance element layer disposed under the access transistor layer. Using the access transistors disposed in the access transistor layer, and the variable resistance element layer, a variable resistance element cell is formed as with the fifteenth embodiment. As shown in FIG. 62, the first storage circuit includes a passive element. The passive element is, for example, a resistance element. Further, the passive element is arranged in, for example, the underlying layer of the access transistor layer.

The second storage circuit is formed of a Flash memory layer. The Flash memory layer has the Flash memory in the sixteenth embodiment or the seventeenth embodiment.

Over the second storage circuit, there are formed a power source system wire and an I/O circuit. The power source system wire supplies an externally supplied power source potential and a GND potential to each circuit.

Incidentally, respective wiring layers forming the semiconductor device 334 in accordance with the present embodiment may be stacked in the order shown in FIG. 62, or may be stacked in a different order from that of FIG. 62.

Then, the effects of the present embodiment will be described. When a plurality of transistors having mutually different characteristics are formed, respective transistors are required to be formed by different steps, respectively. For this reason, when a plurality of transistors having mutually different characteristics are disposed in the same wiring layer, for forming some transistors, for example, a hard mask is required to be formed to protect the other transistors. Namely, it is necessary to add steps for individually forming a plurality of transistors. In this case, manufacturing of the semiconductor device becomes complicated.

In accordance with the present embodiment, a plurality of transistors having different characteristics are disposed in different wiring layers, respectively. This implements a three-dimensional LSI structure including a plurality of devices disposed in mutually different wiring layers, and having mutually different functions. In this case, it is not necessary to add individual formation steps for forming a plurality of transistors having different characteristics. This can facilitate manufacturing of a semiconductor device including a plurality of devices having mutually different functions.

Further, in accordance with the present embodiment, transistors are formed in respective wiring layers with each semiconductor layer as a channel. For this reason, it becomes possible to arbitrarily select the kind of the substrate such as an insulating substrate or a semiconductor substrate. This enables the reduction of the cost of the semiconductor device.

Up to this point, the embodiments of the present invention were described by reference to the accompanying drawings. However, these are examples of the present invention. Various configurations other than those described above can also be adopted.

What is claimed is:

1. A semiconductor device, comprising:
 a first wire disposed in a first wiring layer,
 a second wire disposed in a second wiring layer stacked over the first wiring layer,
 a gate electrode arranged between the first wire and the second wire in a direction of stacking of the first wiring layer and the second wiring layer, and not coupled with the first wire and the second wire,
 a gate insulation film disposed over a side surface of the gate electrode,
 a semiconductor layer disposed over the side surface of the gate electrode via the gate insulation film, and coupled with the first wire and the second wire,
 a via disposed under the second wire, and coupled with the second wire,
 a second insulation film disposed between the gate electrode and the first wire, and
 a third insulation film disposed between the gate electrode and the via,
 wherein a film thickness of the second insulation film is larger than a film thickness of the third insulation film.

2. The semiconductor device according to claim 1,
 wherein the gate electrode is disposed over the first wiring layer via a first insulation film, and
 wherein the first insulation film is formed of a lower layer insulation film, and an upper layer insulation film disposed over the lower layer insulation film, and formed of a different material from that for the lower layer insulation film.

3. The semiconductor device according to claim 2,
 wherein the lower layer insulation film is formed of a silicon nitride film, and
 wherein the upper layer insulation film is formed of a silicon oxide film.

4. The semiconductor device according to claim 1,
 wherein the first wire is coupled with the semiconductor layer via a first conductive film disposed over the first wire, and formed of a different material from that for the first wire.

5. The semiconductor device according to claim 4,
 wherein the first conductive film comprises Ti, Ta, W, Al, TiN, TaN, or WN; a compound containing Co or W; or a material obtained by introducing at least one of C and O to any of these elements and compounds.

6. The semiconductor device according to claim 4, comprising:
 a third wire disposed over the first wiring layer,
 wherein the gate electrode is coupled with the third wire via a second conductive film comprised of a different material from that for the third wire.

7. The semiconductor device according to claim 1,
 wherein a top surface of the first wire and a bottom surface of the via overlap each other in plan view, and
 wherein a part of the semiconductor layer is arranged in a region of overlap between the top surface of the first wire and the bottom surface of the via.

8. The semiconductor device according to claim 7,
 wherein a planar shape of the gate electrode is a polygon, and
 wherein the region of overlap between the top surface of the first wire and the bottom surface of the via includes one side of the gate electrode.

9. The semiconductor device according to claim 8,
 wherein the region of overlap between the top surface of the first wire and the bottom surface of the via includes at least a part of one side of the gate electrode, and does not include two sides adjacent to the one side of the gate electrode.

10. The semiconductor device according to claim 7,
 wherein the planar shape of the gate electrode is a polygon, and
 wherein the region of overlap between the top surface of the first wire and the bottom surface of the via does not include one side of the gate electrode, and includes a part of each of two sides adjacent to the one side of the gate electrode.

11. The semiconductor device according to claim 7,
wherein one of the top surface of the first wire and the bottom surface of the via is arranged inside the other of the top surface of the first wire and the bottom surface of the via in plan view, in a direction of extension of the two sides.

12. The semiconductor device according to claim 1,
wherein the semiconductor layer is formed of an oxide semiconductor.

13. The semiconductor device according to claim 12,
wherein the oxide semiconductor is comprised of InGaZnO, InZnO, ZnO, ZnAlO, ZnCuO, NiO, SnO, $SnO_2$, CuO, $Cu_2O$, $Ta_2O_5$, or $TiO_2$.

14. The semiconductor device according to claim 1,
wherein the gate electrode is comprised of Ti, Ta, W, Al, TiN, TaN, or WN, a compound containing Co or W, or a material obtained by introducing at least one of C and O to any of these.

15. The semiconductor device according to claim 1,
wherein the gate insulation film is comprised of a silicon oxide film or a silicon nitride film, an oxide film of at least one of Hf, Zr, Al, Ti, and Ta, a metal silicate product of any of these, or a film obtained by adding at least one of nitrogen and carbon to any of these.

16. The semiconductor device according to claim 1,
wherein a thickness of the semiconductor layer in the direction of stacking of the first wiring layer and the second wiring layer is 30 to 300 nm.

17. The semiconductor device according to claim 1, comprising:
a fourth wire disposed in the first wiring layer, and not coupled with the gate electrode,
a fifth wire disposed in the second wiring layer, and not coupled with the gate electrode, and
a second semiconductor layer disposed over the side surface of the gate electrode via the gate insulation film, and coupled with the fourth wire and the fifth wire.

18. The semiconductor device according to claim 17,
wherein the semiconductor layer has a first conductivity type, and
wherein the second semiconductor layer has a second conductivity type different from the first conductivity type.

* * * * *